(12) United States Patent
Noguchi et al.

(10) Patent No.: US 7,453,728 B2
(45) Date of Patent: Nov. 18, 2008

(54) DATA STORAGE SYSTEM WITH ENHANCED RELIABILITY WITH RESPECT TO DATA DESTRUCTION CAUSED BY READING-OUT OF THE DATA

(75) Inventors: Mitsuhiro Noguchi, Yokohama (JP); Akira Goda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/497,325

(22) Filed: Aug. 2, 2006

(65) Prior Publication Data

US 2006/0268608 A1 Nov. 30, 2006

Related U.S. Application Data

(63) Continuation of application No. 10/822,177, filed on Apr. 12, 2004, now Pat. No. 7,099,190.

(30) Foreign Application Priority Data

Apr. 22, 2003 (JP) ............................. 2003-117453

(51) Int. Cl.
*G11C 11/34* (2006.01)
*G11C 16/06* (2006.01)
(52) U.S. Cl. ...................... 365/185.09; 365/189.05; 365/222; 365/226
(58) Field of Classification Search .......... 365/185.09, 365/189.01, 189.05, 222, 226; 714/704
See application file for complete search history.

(56) References Cited

U.S. PATENT DOCUMENTS 5,933,436 A    8/1999  Tanzawa et al. ............. 714/762
6,049,899 A    4/2000  Auclair et al.
6,201,282 B1   3/2001  Eitan
6,215,148 B1   4/2001  Eitan
6,411,548 B1   6/2002  Sakui et al.
6,584,015 B2   6/2003  Katayama et al. ........ 365/185.11
6,646,915 B2 * 11/2003 Kawase ................... 365/185.08
6,845,042 B2   1/2005  Ichige et al. ............. 365/185.17
6,877,116 B1 * 4/2005  Kost et al. ..................... 714/704
6,882,570 B2 * 4/2005  Byeon et al. ............ 365/185.18
2002/0141242 A1  10/2002  Noguchi et al.
2002/0159315 A1  10/2002  Noguchi et al.
2003/0042558 A1   3/2003  Noguchi et al.
2004/0094793 A1   5/2004  Noguchi et al.

FOREIGN PATENT DOCUMENTS

JP    63-308800   12/1988
JP     3-49099    3/1991

(Continued)

*Primary Examiner*—VanThu Nguyen
(74) *Attorney, Agent, or Firm*—Oblon, Spivak, McClelland, Maier & Neustadt, P.C.

(57) ABSTRACT

A data storage system, which includes a plurality of pages, each of which includes a plurality of first memory cells, from which at least binary data can be read-out a plurality of times without destruction; a circuit which receives data-output of at least one first page, detects an error in at least one bit of data, and outputs information of the error position; another circuit which determines whether data of an error bit is "1" or "0". When the determination is "1" or "0", the first memory cell of the first page is erased, and error-corrected data is written.

5 Claims, 41 Drawing Sheets

FOREIGN PATENT DOCUMENTS

| | | |
|---|---|---|
| JP | 3-283093 | 12/1991 |
| JP | 6-162786 | 6/1994 |
| JP | 8-124394 | 5/1996 |
| JP | 8-279295 | 10/1996 |
| JP | 9-305497 | 11/1997 |
| JP | 11/066887 | 3/1999 |
| JP | 11-330277 | 11/1999 |
| JP | 2002-150783 | 5/2002 |
| JP | 2004-55098 | 2/2004 |
| JP | 2004-272476 | 9/2004 |
| WO | WO 01/22232 A1 | 3/2001 |

* cited by examiner

ROW DIRECTION

DATA STORAGE SYSTEM WITH ENHANCED RELIABILITY WITH RESPECT TO DATA DESTRUCTION CAUSED BY READING-OUT OF THE DATA

CROSS REFERENCE TO RELATED APPLICATIONS

This application is a continuation application and claims the benefit of priority from U.S. application Ser. No. 10/822,177, filed Apr. 12, 2004 and is based upon and claims the benefit of priority from prior Japanese Patent Application P2003-117453 filed on Apr. 22, 2003; the entire contents of which are incorporated by reference herein.

BACKGROUND OF THE INVENTION

1. Field of the Invention

The present invention relates to a highly reliable data storage system, which can rescue data from a defective bit even when the defective bit is generated, and more particularly, to a data storage system which has enhanced reliability with respect to data destruction caused by reading-out of the data.

2. Description of the Related Art

A nonvolatile semiconductor memory (EEPROM) has been developed which uses electrical charges, for information storage of digital bits, injected from a channel through an insulating film to a charge storage layer by means of a tunnel current. A conductance change of a field effect transistor (MOSFET) is determined in accordance with the amount of the charges to read out information. In particular, a NAND or virtual ground type EEPROM, in which a plurality of memory cells are connected serially or in parallel to form a memory cell block, can greatly reduce the number of selection transistor gates compared to the number of memory cells, and achieve a higher density. Here, different from a DRAM, in the EEPROM, data can be read out a plurality of times without involving data destruction. However, a reading operation applies a voltage to a selected gate of an unselected EEPROM cell, and repeated reading operations cause a read disturb once which destroys data. Consequently, a problem arises that a large current cannot be conducted during the reading.

SUMMARY OF THE INVENTION

An aspect of the present invention inheres in a data storage system that includes a plurality of pages, each of which includes a plurality of first memory cells, from which at least binary digital data of "1" and "0" can be read out a plurality of times without destruction of the data. A circuit receives a digital data output of at least one first page including the first memory cells, which detects an error in at least one bit of data and which outputs information on the error position. A circuit determines whether data of an error bit is "1" or "0". Further, when a result of the determination is "1" or "0", the first memory cell of the first page is selectively erased and error-corrected data is written in the memory cell.

Another aspect of the present invention inheres in a data storage system that includes a plurality of pages, each of which includes a plurality of first memory cells, from which at least binary digital data of "1" and "0" can be read out a plurality of times without destruction of the data. A circuit receives a digital data output of at least one first page including the first memory cells, which detects an error in at least one bit of data and which outputs information on a position of the error. A circuit determines whether data of the error bit is "1" or "0". Further, when a result of the determination is "1" or "0", error-corrected data is written in the first memory cells of a page that is different from the first page.

Another aspect of the present invention inheres in a data storage system that includes a plurality of pages, each of which includes a plurality of first memory cells, from which at least binary digital data of "1" and "0" can be read out a plurality of times without destruction of the data. A plurality of pages including at least one page, each of which includes a plurality of second memory cells. A circuit receives a digital data output of at least one first page including the first memory cells and detects an error in at least one bit of data. Further, a plurality of bits of position information on the error page is recorded in the second memory cells.

Another aspect of the present invention inheres in a data storage system that includes a plurality of pages, each of which includes a plurality of first memory cells, from which at least binary digital data of "1" and "0" can be read out a plurality of times without destruction of the data. A circuit receives a digital data output of the first memory cells and detects an error in at least one bit of data. Further, a bit change is generated if at least one of the first memory cells is in a held state of "1" or "0" and a reading operation is carried out a plurality of times. The circuit is configured to have an external data output terminal and to be capable of reading out all information bits for a first page of the first memory cells from an external input/output section when power is supplied and reading out the first page when the power is supplied. Furthermore the first data control circuit, when the power is cut off, or supplied, in a case where a series of operations for reading out data of at least one page from the external data output terminal are repeated a plurality of times, the number of times of reading out information data identical to the information data written in the page is larger than the number of times of reading information data identical to the information data written in the page where the operation for continuously reading out the data of at least one page is carried out.

Another aspect of the present invention inheres in a data storage system that includes a memory macro including a memory cell array, an error correction code circuit section connected to the memory macro, and a temporary memory used for error correction of the memory cell array. The temporary memory is formed as a part of the memory cell array in the memory macro.

DETAILED DESCRIPTION OF THE INVENTION

Figure 1:
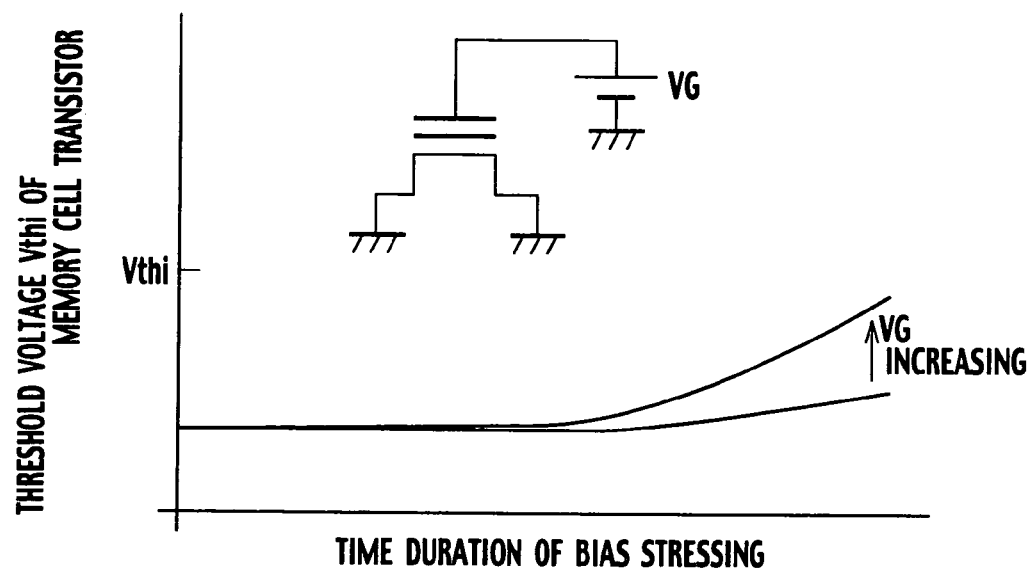
FIG. 1 is a view explaining a relation between a memory cell threshold voltage value Vthi and time duration of bias stress in a conventional nonvolatile semiconductor memory device.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail

COMPARATIVE EXAMPLE

A threshold voltage Vthi of an EEPROM memory cell transistor increases during the course of bias stressing time, as shown in FIG. 1. Vthi is a threshold voltage when there are no charges stored in a charge storage layer of the EEPROM memory cell transistor. In FIG. 1, before applying the bias stressing, the memory cell is, for example, in a state where positive charges are stored in the charge storage layer, a so-called erasure state. Here, as shown in the insertion diagram of FIG. 1, by applying a positive voltage to a control gate electrode with respective to source and drain electrodes, electrons are injected into the charge storage layer from a channel region electrically connected to the source and drain regions to increase the threshold voltage Vthi. As the gate voltage increases, an electric field between the charge storage layer and the channel region increases in strength to increase an injected current. Thus, even during the same time duration of bias stressing, the amount of increase in the threshold voltage Vthi is increased. As an insulating film (tunnel insulating film) between the charge storage layer and the channel region becomes thinner, an electric field therebetween is increased even at a same voltage, and thus this current injection becomes significant. For example, in an EEPROM memory cell element which uses a silicon nitride film (SiN) as a charge storage layer, as described in Japanese Patent Laid-Open Hei 11 (1999)-330277, it is known that a threshold voltage Vthi is increased even by a low control voltage of 2.5 V or less.

In a floating gate type memory cell, a problem of an increase in the threshold voltage Vthi similarly occurs since current injection to the charge storage layer similarly occurs. Especially, in the floating gate type memory cell, a distribution where the increased amount of the threshold voltage is considerably shifted from a main distribution is exhibited, creating a so-called problem of "tail bits". The "tail bit" means a memory cell from among memory cells constituting a memory cell array, which is detected outside a normal distribution, has a threshold voltage equal to/less than a level to be rescued by an error correction code circuit (ECC) when a frequency distribution of a threshold voltage is measured. Specifically, for example, about 10 "tail bits" occurs with respect to a memory cell array of 1 G bits, and it is said that a cause of the "tail bits" is a leakage current of a tunnel oxide film between a floating gate and a semiconductor substrate.

Especially, such a change of the threshold voltage Vthi becomes a problem in a memory cell block where memory cells or information storage regions of the memory cells are serially connected, and data is individually read out from each. It is because in an unselected memory cell serially connected to a memory cell for be read out, a voltage higher than a writing threshold voltage must be applied to the control electrode of the unselected memory cell. As countermeasures, for example, in Japanese Patent Laid-Open 2000-150783 by the inventors, a technical example is disclosed, in which data destruction is detected before it happens, by forming a memory cell for data destruction detection to share a data selection line in parallel with a memory cell for data storage and applying stronger electric field stress to the memory cell for data destruction detection simultaneously with data reading-out to cause a change of a threshold voltage before that of the memory cell for data storage. However, in Japanese Patent Laid-Open 2002-150783, since the memory cell for data storage and the memory cell for data destruction detection are separately constituted, variance in characteristics of the two kinds of memory cells causes a problem that data destruction does not always occur earlier in the memory cell for the data destruction detection than in the memory cell for data storage. This becomes a problem particularly, for example, in the case where the cell for data destruction detection has resistance to reading-out stress. Whereas, the memory cell for data storage is abnormally sensitive to the reading-out stress, the so-called "tail bit". To avoid this problem, an electric field of the memory cell for data destruction detection must be set larger. However, a data-refreshing interval consequently becomes short, creating a problem of greater time expended for data refreshing. Furthermore, the memory cell for data destruction detection is particularly necessary, and this memory cell is exclusively used for read-disturb data destruction detection. Thus, for example, a defective bit caused by charge leakage latched by a writing charge cannot be corrected, creating a problem of an increase in a chip size.

Preferably, for data destruction caused by reading-out, a data storage system is provided, which directly detects a data destruction cell, enables complete recovery of the data to lengthen a data refreshing interval, and renders unnecessary formation of a memory cell for data destruction detection separately from a memory cell for data storage.

EMBODIMENTS

Next, the embodiments of the present invention will be described with reference to the accompanying drawings. In the drawings, identical or similar portions are denoted by identical or similar reference numerals. The embodiments are illustrative of a device and a method for embodying the technical sprit of the present invention, and not limitative of the technical sprit of the invention. Various changes can be made to the technical sprit of the present invention within the scope of appended claims.

The present invention is generally directed to a data storage system, which detects a read-disturb occurrence before occurrence of data destruction by use of a data error code correction circuit (ECC). By analyzing the data error code correction circuit (ECC), it is possible to prevent occurrence of read-disturb failures. For example, if a NAND type memory cell is used in a high-speed operating environment represented by an application field such as a portable telephone or the like, read-disturb refresh is essential. In refresh detection, a NAND type flash memory can be used, and a refreshing period can be correctly detected even if there is a "tail bit". It is possible to deal with a problem that a reading-out output of the data error code correction circuit (ECC) is delayed.

Therefore, a first embodiment will be described by way of a configuration in which a temporary memory is arranged outside a memory macro. A second embodiment will be described by way of a configuration in which a temporary memory is arranged in a memory macro. A third embodiment will be described by way of a different mode of an operation sequence. An operation method will be described, which is characterized by correcting a content error of a first memory cell block to write the content in a second memory cell block, and writing a content of the second memory cell block in the first memory cell block to refresh the content of the first memory cell. A fourth embodiment will be described by way of an example where a NAND cell array block is constituted by a MONOS type gate. A fifth embodiment will be described by way of an example where a memory cell array block is constituted by a virtual ground structure formed in a MONOS structure. A sixth embodiment will be described by way of an example where a multi-valued logic is applied in the data storage system disclosed in the first to fifth embodiments. Furthermore, a seventh embodiment will be described by way of an example where the data storage system disclosed in the first to sixth embodiments is applied to a system LSI to be applied to a system of a memory card, an IC card or the like.

First Embodiment

Figure 2:
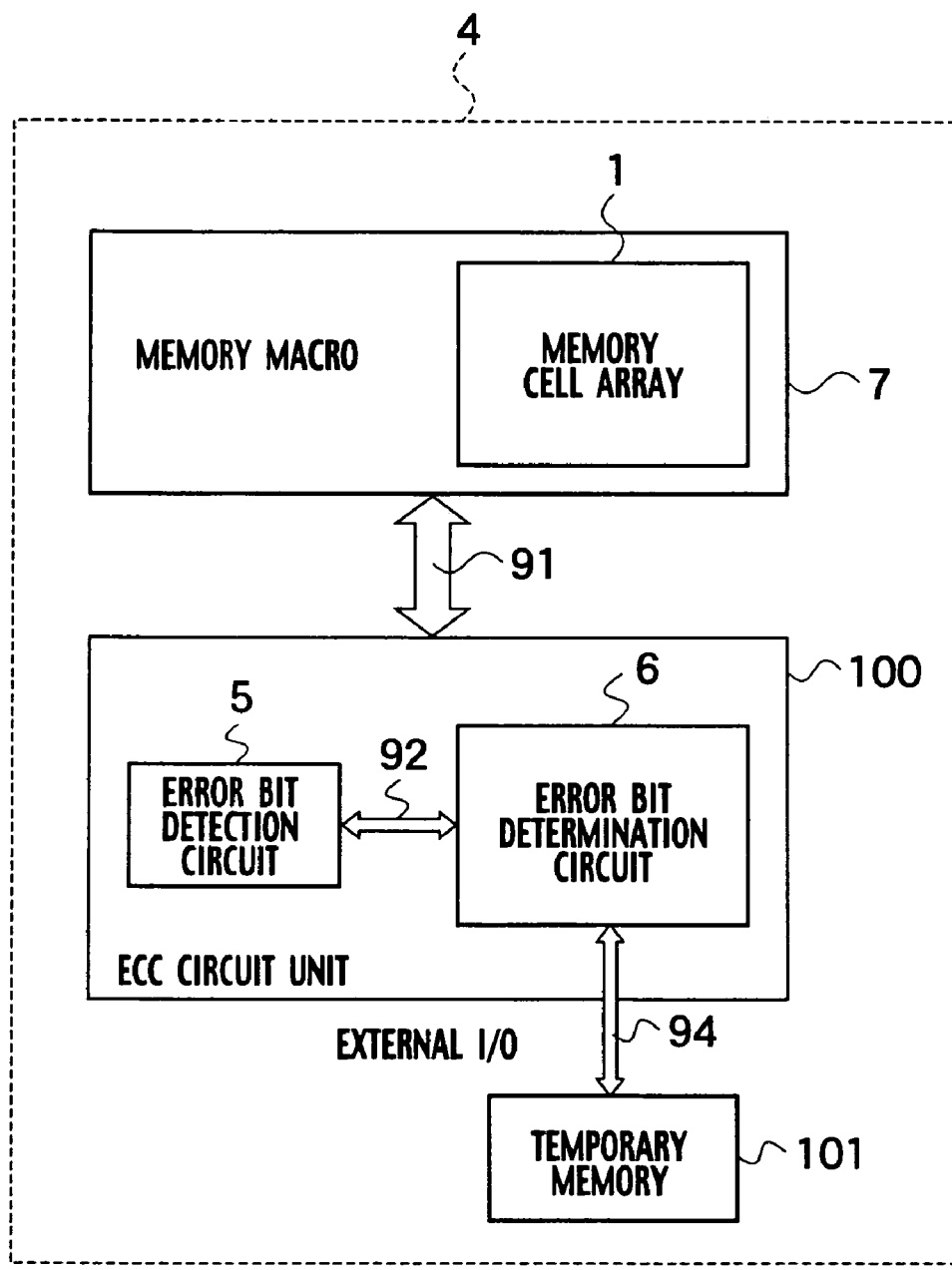
FIG. 2 is a schematic block configuration view of a data storage system according to a first embodiment of the present invention.

As shown in FIG. 2, the data storage system 4 of the first embodiment of the present invention includes a memory macro 7 including a memory cell array 1, an ECC circuit unit 100 including an error bit detection circuit 5 and an error bit determination circuit 6, and a temporary memory 101 connected to the ECC circuit unit 100. A first internal I/O line 92 is wired between the error bit detection circuit 5 and the error bit determination circuit 6. A second internal I/O line 91 is wired between the memory macro 7 and the ECC circuit unit 100. An external I/O line 94 is wired between the error bit determination circuit 6 and the temporary memory 101. The memory macro 7 is shown in detail in FIG. 3, and the ECC circuit unit 100 is shown in detail in FIG. 4.

[Data Storage System]

Figure 3:
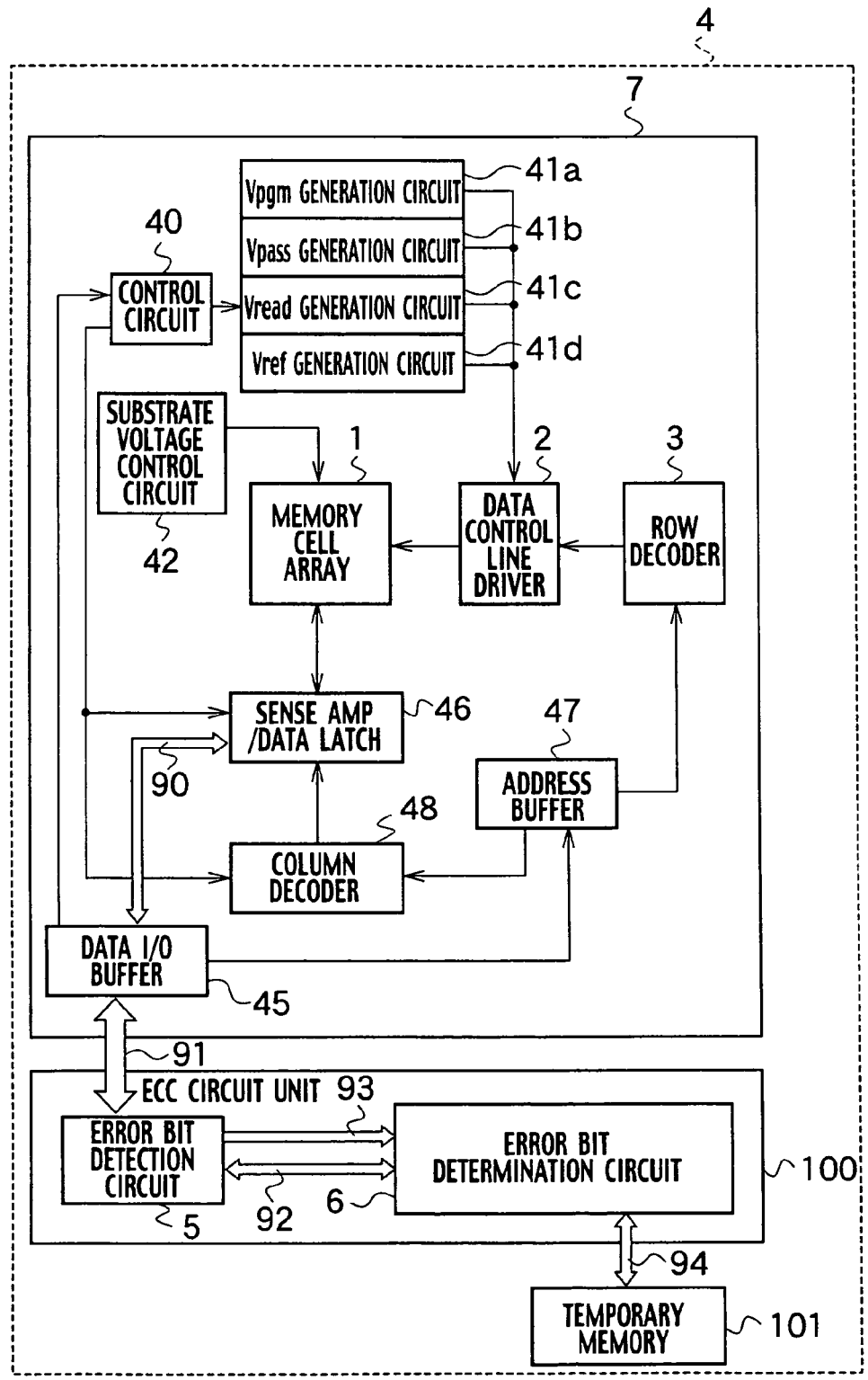
FIG. 3 is a detailed block configuration view of the data storage system of the first embodiment of the present invention.

The data storage system 4 of the first embodiment of the present invention will be described in detail. As shown in FIG. 3, the memory macro 7 includes a memory cell array 1 of a NAND, AND or virtual ground type, a data control line driver 2, a row decoder 3, an address buffer 47, a column decoder 48, a sense amplifier/data latch 46, a data I/O buffer 45, a substrate voltage control circuit 42, a control circuit 40, a Vpgm generation circuit 41a, a Vpass generation circuit 41b, a Vread generation circuit 41c, and a Vref generation circuit 41d. A third internal I/O line 90 is wired between the data I/O buffer 45 and the sense amplifier/data latch 46. A second internal I/O line 91 is wired between the data I/O buffer 45 and the error bit detection circuit 5. In the ECC circuit unit 100, a first internal I/O line 92 and an error detection signal line 93 are wired between the error bit detection circuit 5 and the error bit determination circuit 6.

The memory cell array 1 is constituted, as described later, by arraying memory cell blocks in a matrix form, in each of which a nonvolatile memory cell and a selection transistor are connected in series or parallel. The sense amplifier/data latch 46 is provided to sense data on a data transfer line of the memory cell array 1, or latch written data. The sense amplifier/data latch 46 also serves as a data latch, and is constituted mainly of, for example, a flip-flop circuit. The sense amplifier/data latch 46 is connected to the data I/O buffer 45. The connection between the sense amplifier/data latch 46 and the data I/O buffer 45 is controlled based on an output of the column decoder 48, which receives an address signal from the address buffer 47. By this connection, data transferred through the second internal I/O line 91 to the data I/O buffer 45 can be written through the first internal I/O line 90 in the memory cell array 1. Data stored in the memory cell array 1 can be read out through the first internal I/O line 90 to the data I/O buffer 45. In the memory cell array 1, the row decoder 3 is constituted by an address selection circuit, which selects a memory cell element, specifically, and controls a data selection line and a block selection line.

As shown in later-described FIG. 9 or FIG. 10, the substrate voltage control circuit 42 controls a voltage of a p type semiconductor substrate 21 (or p type well region 23) where the memory cell array 1 is formed, and preferably can be boosted to an erasure voltage of 10 V or higher during erasure. Additionally, the Vpgm generation circuit 41a is formed to generate a write voltage Vpgm that is boosted to a level higher than a power supply voltage when data is written in a memory cell element selected in the memory cell array 1. Separately from the Vpgm generation circuit 41a, the Vpass generation circuit 41b and the Vread generation circuit 41c are disposed respectively to generate an intermediate voltage for writing Vpass supplied to the unselected memory cell during data writing and an intermediate voltage Vread for reading-out data supplied to the unselected memory cell during data read-out. The Vpgm generation circuit 41a, Vpass generation circuit 41b and Vread generation circuit 41c are controlled by the control circuit 40 so that a necessary voltage output can be applied to the data control line driver 2 in each of the write-in, erasure and read-out states.

The write voltage Vpgm ranges from 6 V to 30 V inclusive, and the write intermediate voltage Vpass ranges from 3 V to 15 V inclusive. The read-out intermediate voltage Vread ranges from 1 V to 9 V inclusive. In the case of a NAND type array, preferably, the voltage applied to the data control line driver 2 is higher by about 1 V than an upper limit of a write threshold value in order to provide sufficient read-out current and to reduce the occurrence of read-disturb. The data control line driver 2 is a switch circuit for applying, in accordance with an output of the row decoder 3, the voltage output to the control gate electrode of the memory cell element or the gate electrode of the selection transistor which requires writing or reading-out.

[ECC Control Unit]

[Error Bit Detection Circuit]

Figure 4:
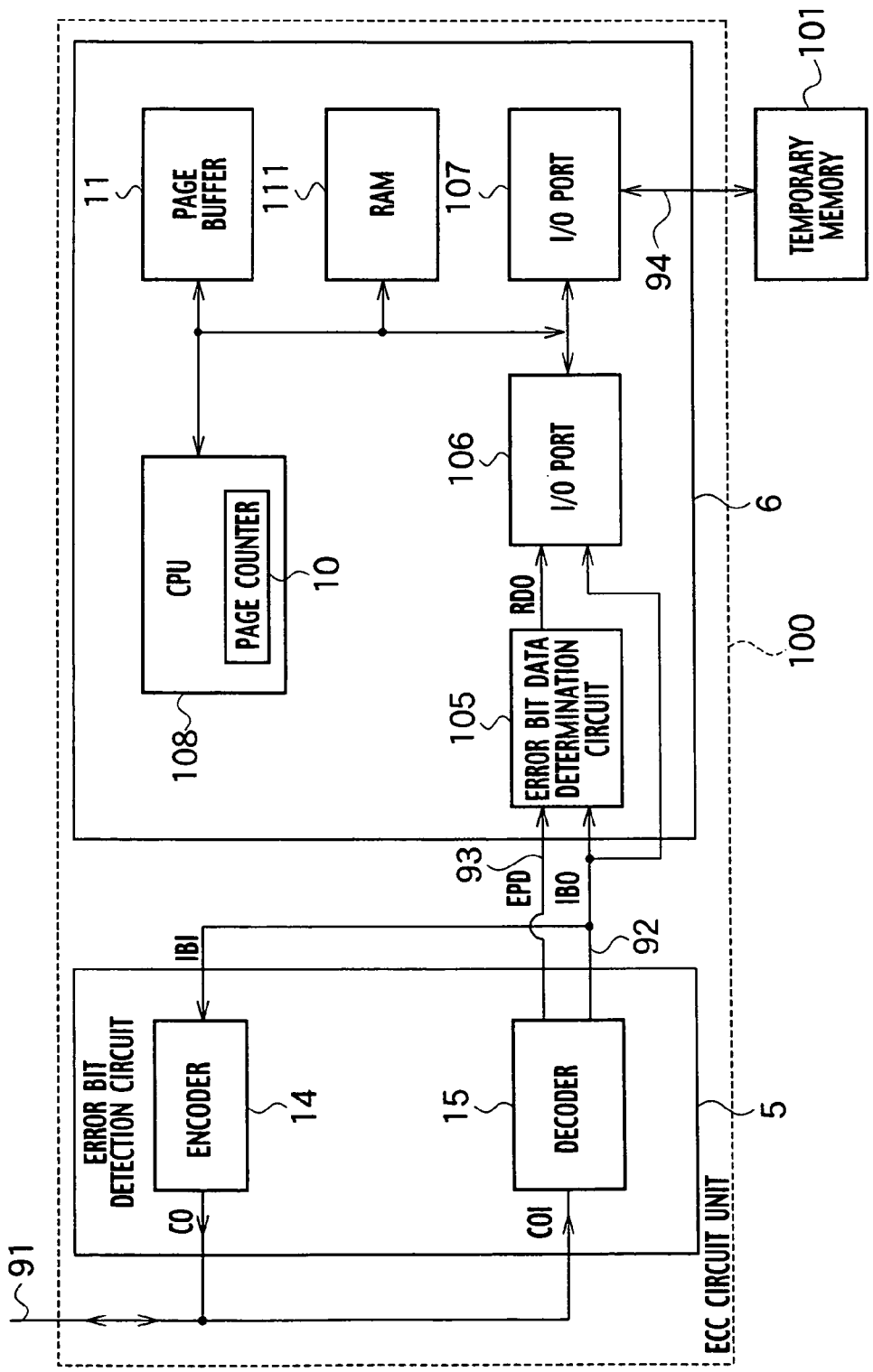
FIG. 4 is a block constitutional view of an error bit determination circuit in the data storage system of the first embodiment of the present invention.

As shown in FIG. 4, the error bit detection circuit 5 in the ECC circuit unit 100 includes an encoder 14 and a decoder 15. In encoding, an information bit input IBI is entered from the first internal I/O line 92, and a code output CO is transferred to the second internal I/O line 91. In the error bit determination circuit 6 including the error bit data determination circuit 105, the external I/O line 94 is electrically connected to the first internal I/O line 92 to enable writing of a code to be corrected for, at least, 1 bit in the memory cell. In decoding, a code input COI is entered from the second internal I/O line 91, and an error-corrected information bit output IBO is transferred to the first internal I/O line 92. An error position detection output EPD is transferred as an error detection signal to the error detection output line 93. Thus, the circuit is specifically constituted to detect, at least, a 1-bit error in the memory cell and output, at least, the 1-bit error position information.

[Error Bit Determination Circuit]

As shown in FIG. 4, the error bit determination circuit 6 in the ECC circuit unit 100 includes a CPU 108 including a page counter 10, a page buffer 11, a RAM 111, I/O ports 106 and 107, and an error bit data determination circuit 105. The CPU 108, the page buffer 11, the RAM 111, and the I/O ports 106 and 107 are connected to one another through a common bus wiring. Further, the I/O port 107 is connected through the external I/O line 94 to the temporary memory 101. The error detection signal from the error bit detection circuit 5 is entered through the error signal line 93 to the error bit data determination circuit 105. The first internal I/O line 92 is connected to the error bit data determination circuit 105 and the I/O port 106.

Figure 5:
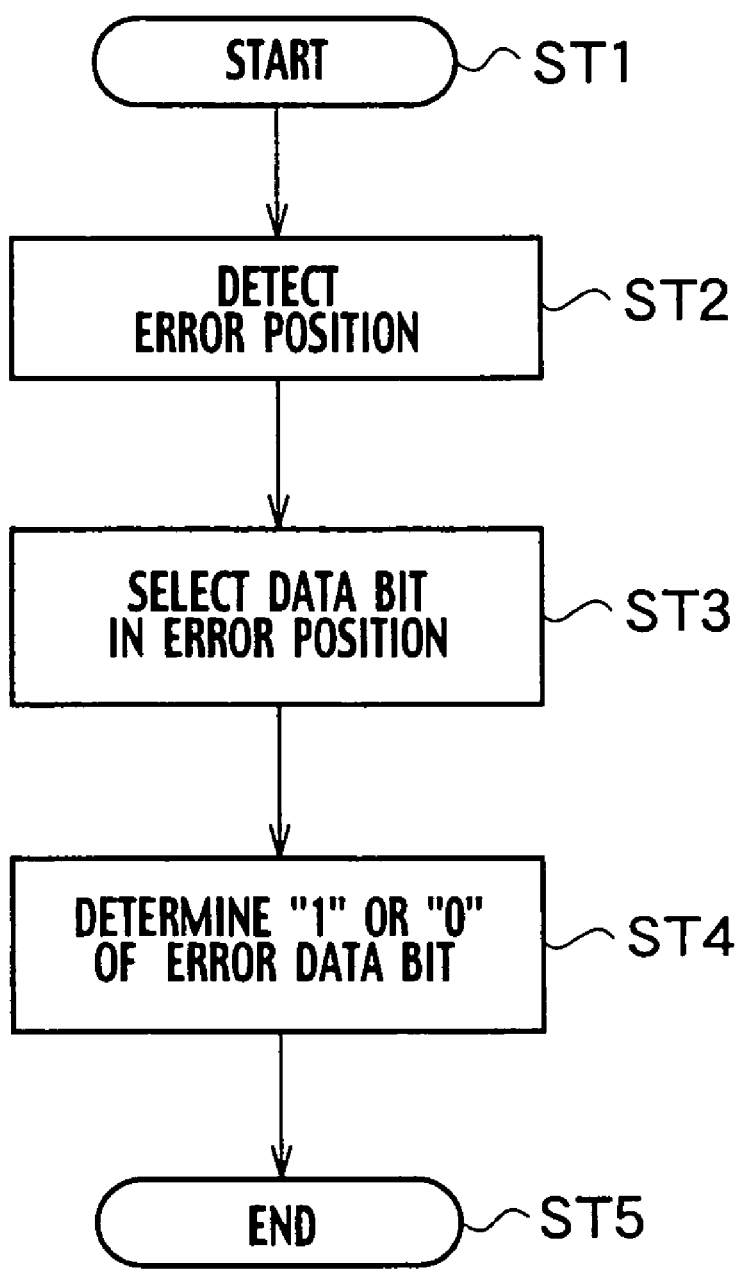
FIG. 5 is a flowchart of an error bit determination algorithm in the data storage system of the first embodiment of the present invention.

To explain most simply, an operation of the data storage system of the first embodiment of the present invention follows a flowchart of FIG. 5.

(a) Start in step ST1.
(b) Detect an error position in step ST2.
(c) Select data bit in the error position in step ST3.
(d) Determine whether the data bit is "1" or "0" in step ST4.
(e) End in step ST5.

[Layout of Memory Cell Array and Sense Amplifier/Data Latch]

Figure 6:
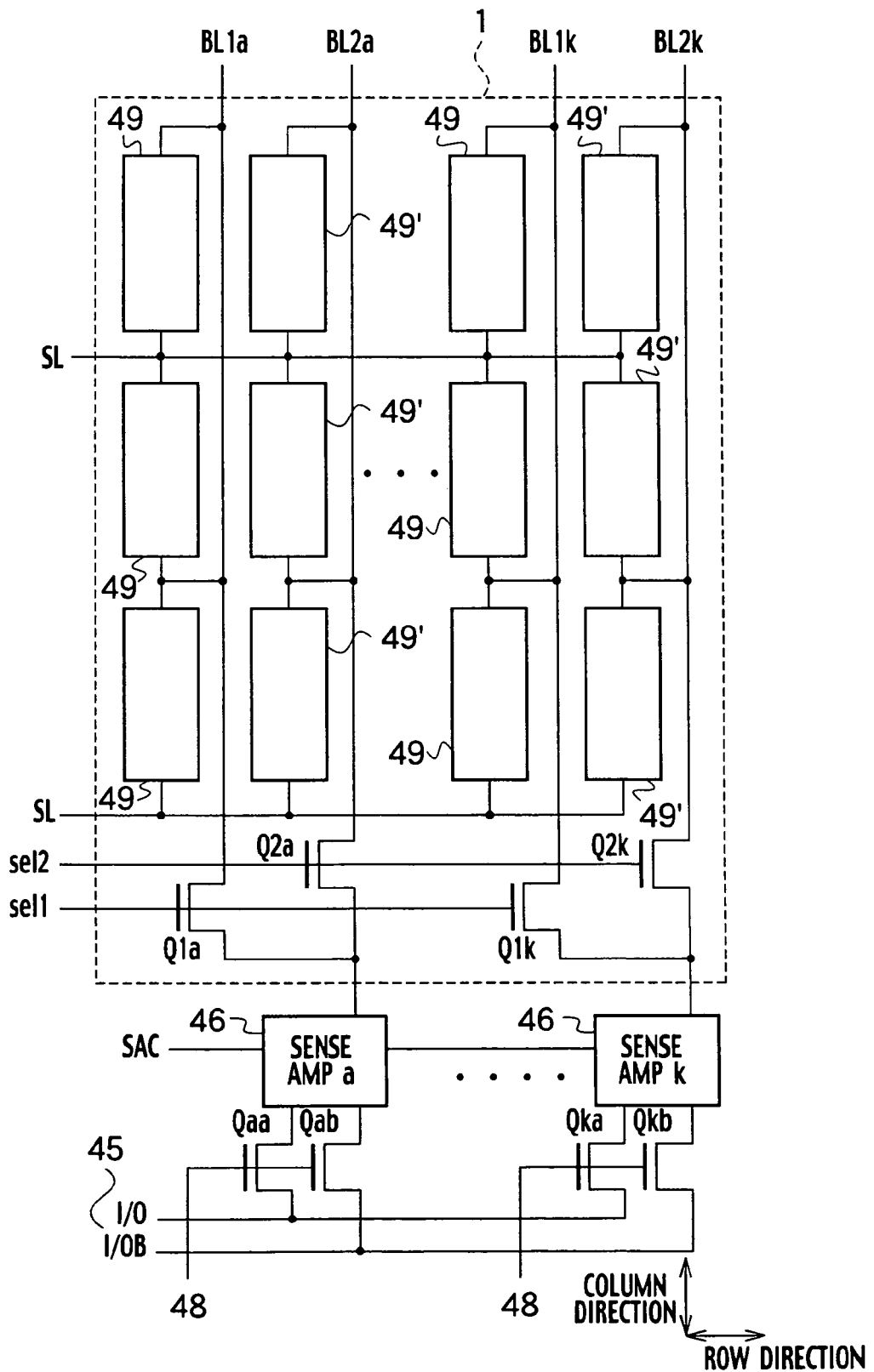
FIG. 6 is a circuit constitutional view showing a layout of a cell array and a sense amplifier circuit in the data storage system of the first embodiment of the present invention.

In the data storage system of the first embodiment of the present invention, as partially shown schematically in FIG. 6, the layout of the memory cell array 1 and the sense amplifier/data latch 46 includes the memory cell array 1, the sense amplifier/data latch 46 including sense amplifiers a, . . . , k, and MOS transistors Qaa, Qab, . . . , Qka, Qkb connected between the sense amplifiers a, . . . , k and the data I/O buffer 45 and selected by the column decoder 48. The memory cell array 1 includes memory cell blocks 49, 49' arranged in a matrix between a row-direction source line SL and column-direction bit lines BL1a, BL2a, . . . , BL1k, BL2k, data transfer line selection transistors Q1a, Q2a, . . . , Q1k, Q2k, and data transfer line selection gate lines sel1, sel2. Hereinafter, similar portions are denoted by similar reference numerals, and description thereof will be omitted. In FIG. 6, to facilitate understanding, data selection lines WL0 to WL15, and block selection lines SSL, GSL of the memory cells shared by the memory cell blocks 49 and 49' in the memory cell array 1, one each in left and right direction on the paper surface are omitted.

The term "memory cell block" means a memory cell unit, which includes one or a plurality of pages and in which an erasure operation is simultaneously carried out. Here, for example, as in the case of a flash memory cell having a charge storage layer, if memory cell erasure time of one page is longer than memory cell write time of one page, the memory blocks 49, and 49' can be configured to include a plurality of pages and to carry out an erasure operation on the plurality of pages all at once. Such a configuration is preferable because write time of one block and erasure time of one block can be set equal to each other, and performance of a write data transfer speed and an erasure speed in the system can be enhanced.

In the data storage system of the first embodiment of the present invention, the memory cell enables reading-out operations to be conducted a plurality of times without any data destruction. This point is similar to the later-descried second to seventh embodiments. Different from the memory cell where each reading-out operation is always accompanied by data destruction to necessitate a rewriting operation, as described below, the memory cell is preferable for reducing the frequency of a write/erasure sequence of correcting a bit error caused by the occurrence of read-disturb to decrease the time the memory cell access is occupied by the sequence and to reduce power consumption.

[NAND Type Memory Cell Block]

(Equivalent Circuit and Pattern Plan View)

Figure 7:
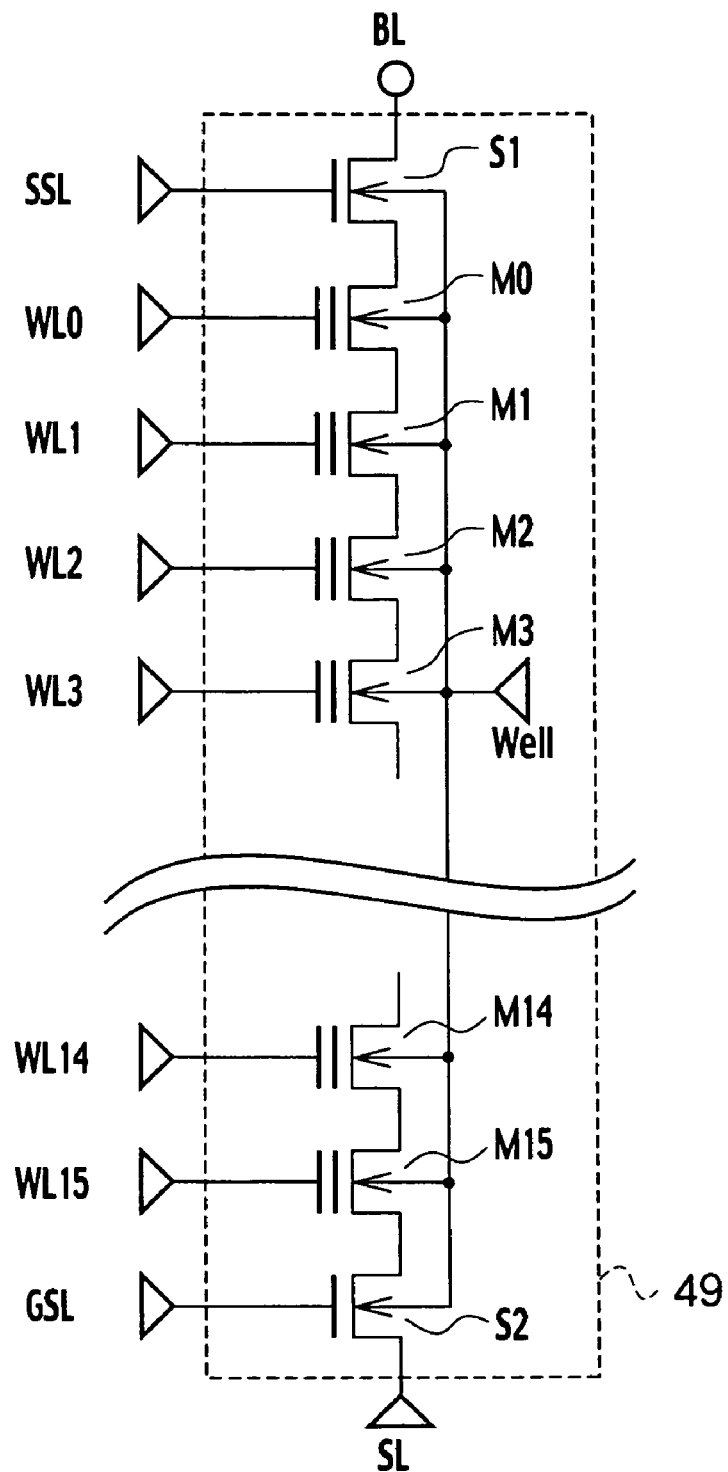
FIG. 7 is a NAND circuit constitutional view of a memory-cell block constituting the memory cell array in the data storage system of the first embodiment of the present invention.
Figure 8:
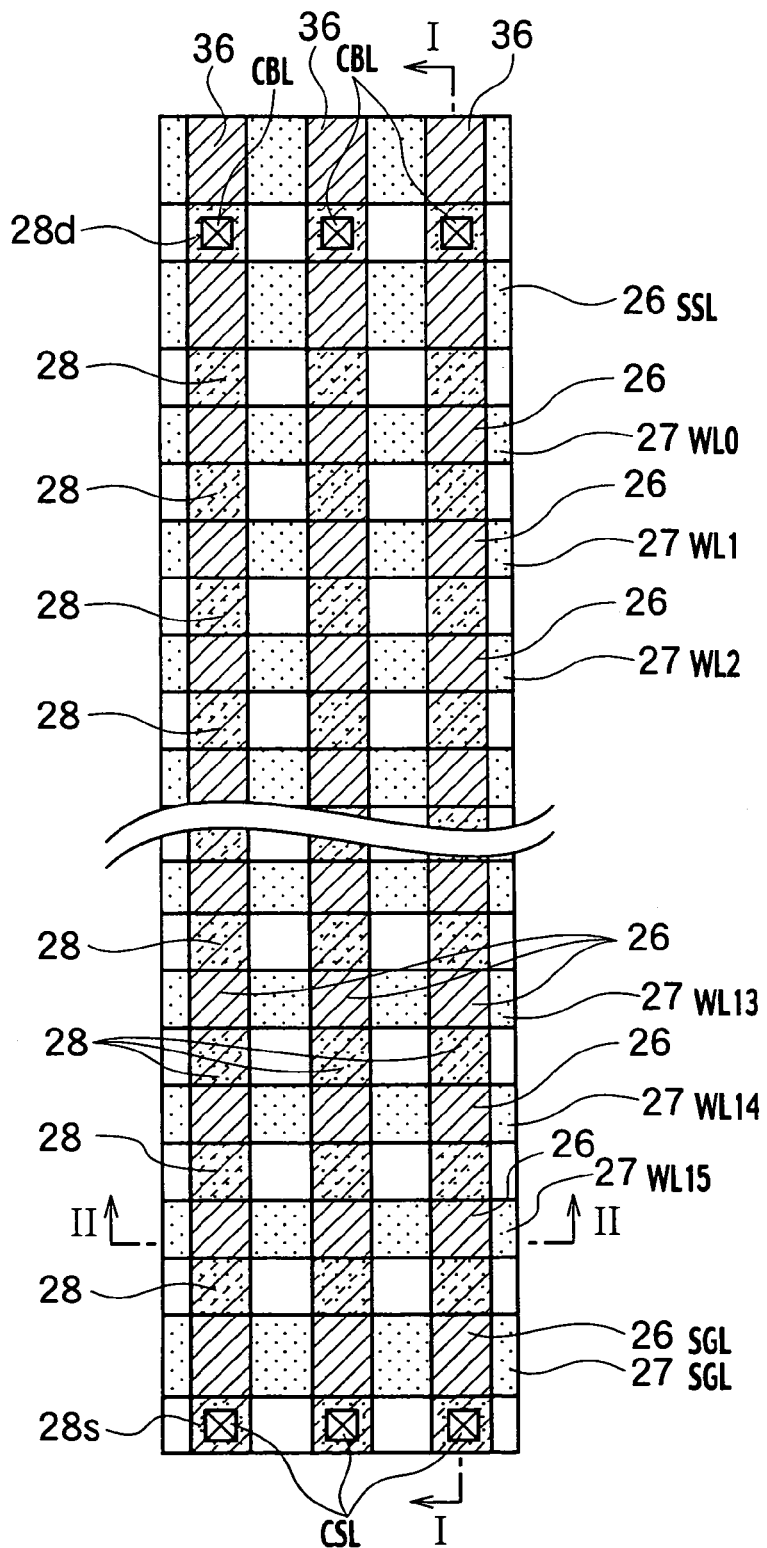
FIG. 8 is a planar layout pattern constitutional view corresponding to FIG. 7.

In the data storage system of the first embodiment of the present invention, an equivalent circuit arranged in the memory cell block constituting the memory cell array 1, and a pattern plan view are as shown in FIGS. 7 and 8, respectively. FIG. 8 shows a pattern structure where the three memory cell blocks shown in FIG. 6 are arranged in parallel. To facilitate understating of the cell structure, only a structure below a control gate electrode 27 is shown.

As shown in FIGS. 7 and 8, memory cell transistors M0 to M15 are constituted by MOS transistors having a charge storage layer 26 are serially connected, and one end thereof is connected through a selection transistor S1 to a data transfer line denoted by BL. The other end is connected through a selection transistor S2 to a common source line denoted by SL. These transistors are formed on the same p type well region 23. Control electrodes of the memory cell transistors M0 to M15 are connected to data selection lines WL0 to WL15. To select one of a plurality of memory cell blocks along the data transfer line BL and connect the selected memory cell block to the data transfer line BL, a control electrode of the selection transistor S1 is connected to a block selection line SSL. Further, a control electrode of the selection transistor S2 is connected to a block selection line GSL to form a so-called NAND type memory cell block 49 (area of broken line).

According to the embodiment, the block selection lines SSL, and GSL which are control wirings of the selection transistors S1 and S2 are connected in common to the memory cell blocks 49 and 49' adjacent to each other in left and right directions, as shown in the drawing, by a conductor of the same layer as the charge storage layer 26 of the data selection lines WL0 to WL15 which are control wirings of the memory cell transistors. Here, the memory cell block 49 needs only at least one of each of the block selection lines SSL and GSL. The lines SSL and GSL are preferably formed in the same direction as that of the data selections lines WL0 to WL15 in order to achieve a high density. The example shows that $16=2^4$ memory cell elements are connected to the memory cell block 49. However, the number of memory cell elements connected to the data transfer line and the data selection line only needs to be a plurality of memory cell elements, and $2^n$ elements (n is a positive integer) is preferable for address decoding.

[Element Structure]

Figure 9:
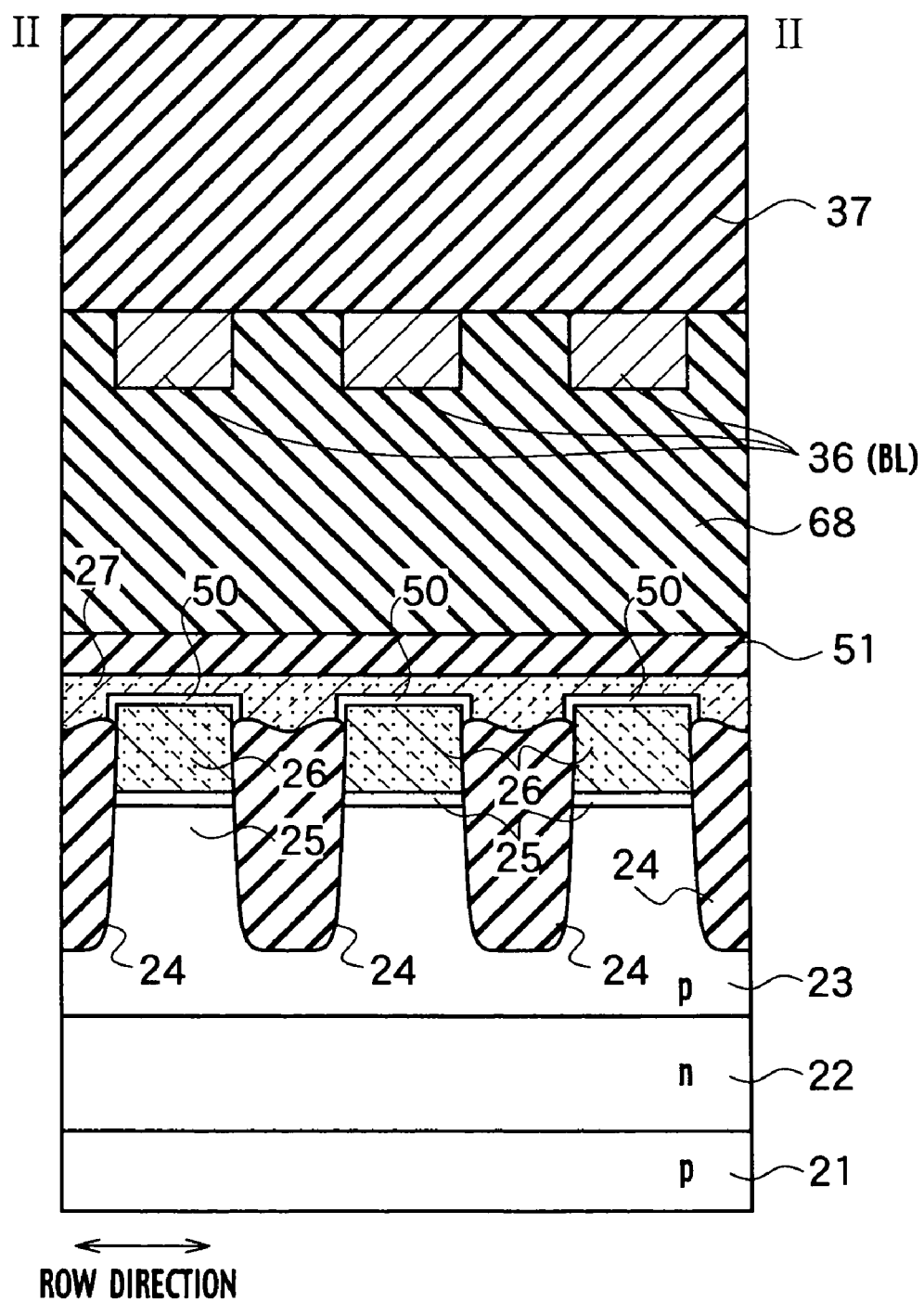
FIG. 9 is a schematic sectional constitutional view cut along the line II-II of FIG. 8 of a memory cell structure in the memory cell array of the data storage system of the first embodiment of the present invention.
Figure 10:
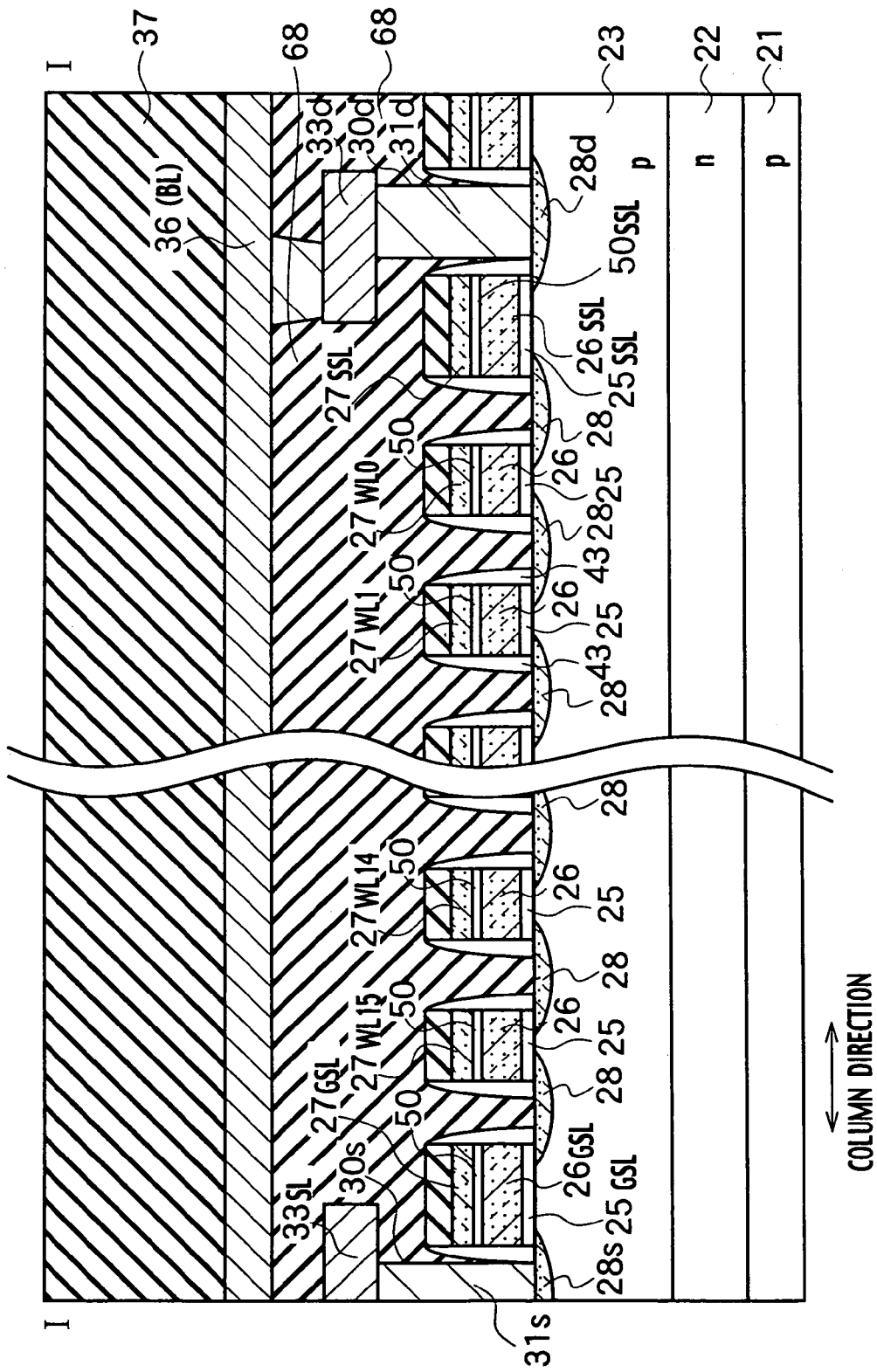
FIG. 10 is a schematic sectional constitutional view cut along the line I-I of FIG. 8 of the memory cell structure in the memory cell array of the data storage system of the first embodiment of the present invention.

In the data storage system of the first embodiment of the present invention, an element sectional structure of a NAND type memory cell block is as shown in FIGS. 9 and 10, which are equivalent to the II-II direction and I-I direction sectional views in the pattern plan view of FIG. 8, respectively. The II-II direction sectional view is equivalent to a memory cell sectional view. In FIGS. 9 and 10, in the p type well region 23 boron impurity concentration ranges from $10^{14}$ $cm^{-3}$ to $10^{19}$ $cm^{-3}$. Tunnel gate insulating films 25, $25_{SSL}$, $25_{GSL}$ made of silicon oxide films or oxy-nitride films have a range of thickness from 3 nm to 15 nm and charge storage layers 26, $26_{SSL}$, $26_{GSL}$ made of poly-silicon, to which phosphorus or arsenic is doped in a range of $10^{18}$ $cm^{-3}$ to $10^{21}$ $cm^{-3}$, are formed to be 10 nm to 500 nm in thickness. These charge storage layers are formed in self-alignment with the p type well region 23 in, for example, a region where an element isolation insulating layer 24 made of a silicon oxide film is not formed. For example, after the tunnel gate insulating film 25 made of the silicon oxide film or the oxy-nitride film and the charge storage layer 26 made of a poly-silicon are deposited on the entire surface of the p type well region 23, patterning of the film 25 and layer 26 is carried out to etch the p type well region 23 to a depth of 0.05 μm to 0.5 μm until the film 25 and layer 26 reach the p type well region 23, and the element isolation insulating film 24 is buried to form the charge storage layers. Thus, since the tunnel gate insulating gate film 25, and the charge storage layer 26 can be formed on the entire planar surface without any irregularities, it is possible to form films where uniformity is improved and characteristics are matched.

Moreover, through block insulating films 50, $50_{SSL}$, $50_{GSL}$ are formed to be 10 to 500 nm thick. The block insulating films are made of a silicon oxide film or an oxy-nitride film of 5 nm to 30 nm thick or a silicon oxide film/silicon nitride film/silicon oxide film. A control gate electrode 27, is made of a poly-silicon doped with impurities of phosphorus, arsenic or boron at a level of $10^{17}$ $cm^{-3}$ to $10^{21}$ $cm^{-3}$, is constituted by a stacked structure of tungsten silicide (WSi) and a poly-silicon, or by a stacked structure of NiSi, MoSi, TiSi, CoSi and a poly-silicon. The control gate electrode 27 is formed up to a block boundary in left and right directions as viewed in FIG. 8 to be connected to the adjacent memory blocks, thus forming data selection lines WL0 to WL15. Preferably, a voltage can be applied to the p type well region 23 by the n type silicon region 22 independently of the p type semiconductor substrate 21 in order to reduce a booster circuit load during erasure. This arrangement will suppress power consumption. In the memory cell gate structure of the first embodiment, since side walls of the p type well region 23 are covered with the element isolation insulating film 24, the p type well region 23 is not exposed during etching process before the formation of the charge storage layer 26 as a floating gate electrode, and placement of the charge storage layer 26 below the p type well region 23 can be avoided. Thus, it is difficult for a gate electric field concentration or a parasitic transistor having a decreased threshold voltage to occur on a boundary between the p type well region 23 and the element isolation insulating film 24. Further, since the phenomenon of a decreased write threshold voltage caused by the electric field concentration, the so-called a sidewalk phenomenon, will be less likely to occur, it is possible to form a more reliable transistor.

As shown in FIG. 10, in both sides of the charge storage layer 26 and the control gate electrode 27, for example, n type diffusion layers 28 which become source or drain regions are formed to sandwich a side wall insulating film 43 made of a silicon nitride film or a silicon oxide film of 5 nm to 200 nm in thickness The n type diffusion layer 28, the charge storage layer 26 and the control gate electrode 27 constitute a floating gate type EEPROM cell which uses the charges stored in the charge storage layer 26 as information, and a gate length thereof is set from 0.01 μm to 0.5 μm inclusive. The n type diffusion layer 28 which serves as a source/drain regions is formed at a depth of 10 nm to 500 nm so as to set surface concentration of, for example, phosphorus, arsenic or stibium to $10^{17}$ $cm^{-3}$ to $10^{21}$ $cm^{-3}$. Additionally, the n type diffusion layer 28 is shared by the adjacent memory cells to provide a NAND circuit representation.

In FIG. 10, $26_{SSL}$, $26_{SGL}$ denote gate electrodes connected to the block selection lines SSL and GSL, respectively, and are formed on the same layer as the floating gate electrode of the floating gate type EEPROM. Gate lengths of the gate electrodes $26_{SSL}$ and $26_{GSL}$ are longer than that of the control gate electrode 27 in the memory cell transistor. For example, the gate lengths are formed to have a length of from 0.2 μm to 1 μm inclusive. Thus, a large ON/OFF ratio during block selection/non-selection can be achieved to prevent erroneous writing or reading.

An n type diffusion layer $28_d$ formed on one side of the control gate electrode $27_{SSL}$ and serving as a source or drain region is connected through a contact $31_d$ to a data transfer line 36(BL) made of, for example, tungsten, tungsten silicide, titanium, titanium nitride, or aluminum. The data transfer line 36 (BL) is formed up to the block boundary vertically as shown in FIG. 8 so as to be connected by the adjacent memory cell blocks. On the other hand, an n type diffusion layer $28_s$ formed on one side of the control gate electrode $27_{GSL}$ and serving as a source or drain region is connected through a contact $31_s$ to a common source line $33_{SL}$. The common source line $33_{SL}$ is formed up to the block boundary to the left and right as shown in FIG. 8 so as to be connected by the adjacent memory cell blocks. Needless to say, the n type diffusion layer $28_s$ is formed up to the block boundary to the left and right as shown in FIG. 8 as a source line. The BL contact and the SL contact are filled with a poly-silicon, tungsten, tungsten silicide, Al, TiN, Ti or the like doped with, for example, n or p type impurities to be conductor regions. Further, the common source line $33_{SL}$ or the data transfer line 36 (BL), and the transistor are filled with the element isolation insulating film 68 made of, for example, $SiO_2$ or SiN therebetween. Formed on the data transfer line 36 (BL) is an insulating film protection layer 37 made of, for example, $SiO_2$, SiN, or polyimide, and an upper wiring, not shown, made of, for example, W, Al or Cu.

[Relation Between Number n of Data Bits and Number of Memory Blocks]

Figure 27:
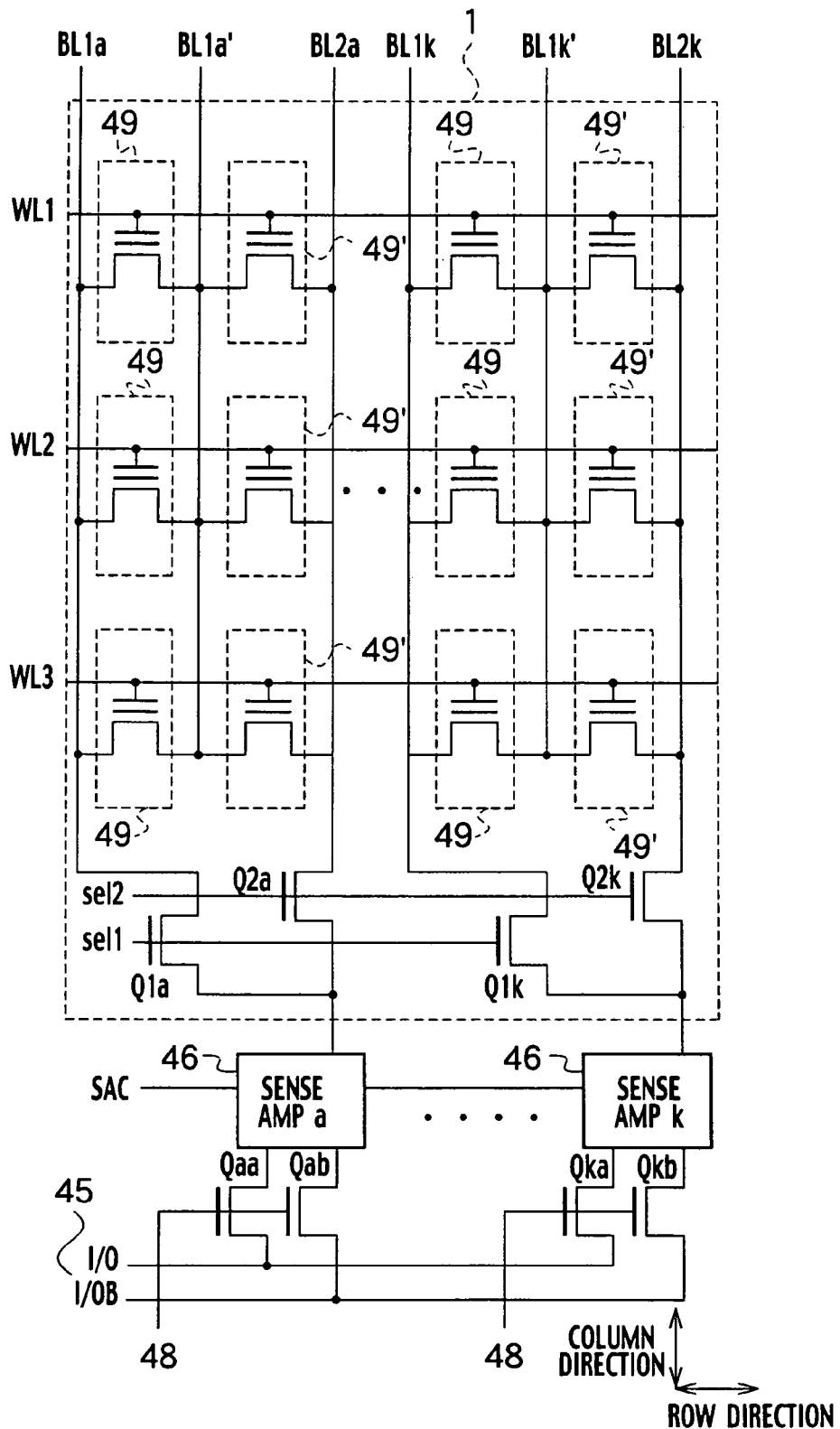
FIG. 27 is a circuit constitutional view showing a layout of a cell array and a sense amplifier circuit in the data storage system of the fourth embodiment of the present invention.

In the data storage system of the first embodiment of the present invention, if the number n of data bits read in a sequence is $>(2^{m-1}-m)$ and $\leq(2^m-m-1)$ where m is a natural number, at least (n+m) or more memory cell blocks 49 are provided in parallel in left and right directions of FIG. 6 or FIG. 27, that is, in the extended direction of the data selection line so as to make one page. In FIG. 3, preferably, at least (n+m) or more sense amplifiers/data latches 46 are provided. This provision of memory cells enables detection of a, at least, 1-bit error of one page read out in the sequence of the memory cell array 1 by use of, for example, a hamming code to obtain the 1-bit error position. Generally, if the number of data bits read out in a sequence is >[$2^{m-1}$-t×(m-1)-1] and ≦($2^m$-t×m-1) where t is a natural number, at least (n+t× m) or more memory cells 49 are provided in parallel in the left and right directions of FIG. 6 or FIG. 27, that is, in the extended direction of the data selection line so as to make one page. Preferably, the memory cells belonging to one page are a plurality of memory cells connected in common to one data selection line WL, because a plurality of memory cells can be selected by one data selection. Such a provision of memory cells enables detection of a t-bit error read out in a sequence of the memory cell array 1 by use of, for example, Bose-Chaudhuri-Hocquenghem (BCH) code to obtain the t-bit error position. Needless to say, the foregoing arrangement can also be applied to the data storage system of the second to seventh embodiments, discussed below.

An input/output of the sense amplifier/data latch 46 is connected to a control circuit 40 for controlling reading, writing and erasure of the memory cell. The control circuit 40 uses data supplied to, for example, the data I/O butter 45 as a command input to control reading, writing and erasure of the memory cell. Though not shown in FIG. 3, the control circuit 40 supplies a control signal for controlling an operation of the sense amplifier, and signals for controlling the data transfer line selection gate lines sel1, and sel2. A portion surrounded with a solid line in the memory macro 7 represents a memory device formed on one conventional semiconductor substrate as, for example, a NAND type flash memory. In FIG. 3, the constitution of each portion, except for the memory cell array 1 in the memory macro 7, a known circuit block disclosed in Japanese Patent Laid-Open 2000-150783 may be used.

Hereinafter, for easier understanding, a data row prior to encoding is referred to as "information bit", a bit added after the encoding is referred to as "check bit", and a bit indicating an error bit continuous from an information bit of the data row after decoding is referred to as a "syndrome". The data I/O buffer 45 is connected through the second internal I/O line 91 to the error bit detection circuit 5. The error bit detection circuit 5 is connected through the first internal I/O line 92 to the error bit determination circuit 6, which includes an error bit data determination circuit 105. The error bit detection circuit 5 outputs an error detection signal to the error bit determination circuit 6, which includes error bit data determination means. The error detection signal may be substituted for a syndrome outputted from the error bit detection circuit 5 through the first internal I/O line 92. The error bit determination circuit 6, which includes the error bit data determination circuit 105 transfers data between the ECC circuit unit 100 and an external temporary memory 101 through the external I/O line 94.

As shown in FIG. 4, the error bit determination circuit 6, which includes the error bit data determination circuit 105 includes a page counter 10 which may be, for example, a flip-flop or a volatile memory. The page counter 10 stores indexes of the number of pages in one erasure block, and counters of the number of stages of $\log_2(i)$ bits where only the number of pages "i" need to be prepared. The page counter 10 has at least a reset function of setting all bits of the counters to a constant initial value, and a function of incrementing the number of pages so as to access every the page in one block once. Hereinafter, a description will be made by way of the most simple-functional example where there is a reset function of setting a first page index to an initial value, and a function of incrementing the page counter 10 by 1. Preferably, in order to achieve high speed, the error bit determination circuit 6 which includes the error bit data determination circuit 105 includes a page buffer 11 has a volatile memory such as an SRAM or a DRAM. Thus in the data storage system 4 of FIG. 3, data correction and refreshing can be carried out. The page buffer is preferable for achieving a high speed because there is no time and process requirements to transfer data to the temporary memory 101 and receive data from the temporary memory 101 through the external I/O line 94. Needless to say, the page buffer 11 may be arranged external to the data storage system 4 shown in FIG. 3. As long as storing/reading is enabled through the external I/O line 94, the refreshing operation of the embodiment of the present invention can be achieved. The number of bits necessary for the page buffer 11 may be equal to or more than the number of information bits.

[Error Bit Detection Circuit]

Figure 11:
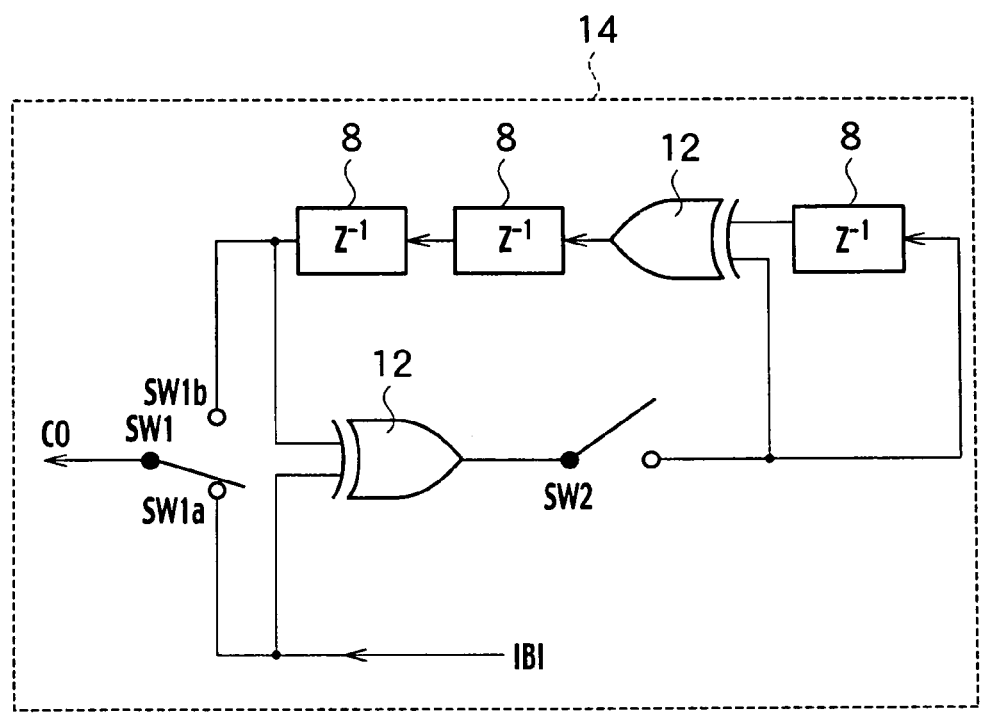
FIG. 11 is a logic circuit constitutional view of a cyclic encoder applied to the data storage system of the first embodiment of the present invention.
Figure 12:
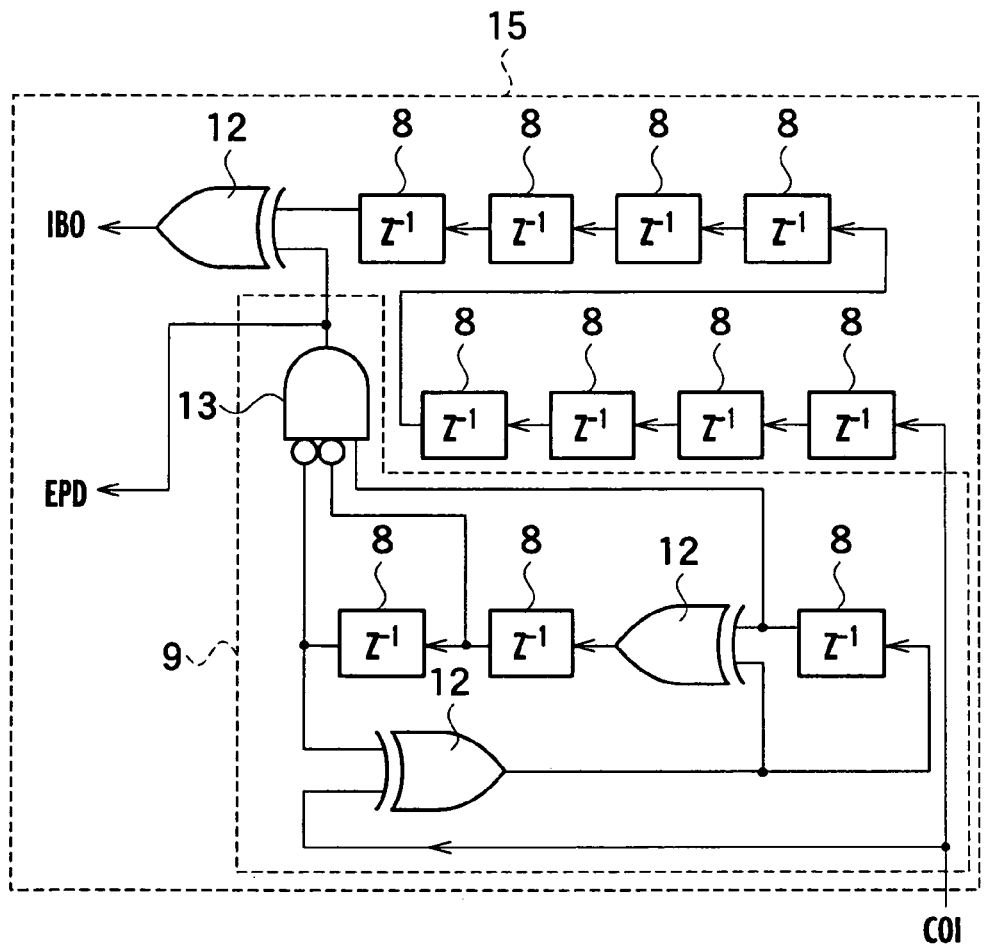
FIG. 12 is a logic circuit constitutional view of an example of a cyclic decoder applied to the data storage system of the first embodiment of the present invention.

The error bit detection circuit 5 detects a series of data bit errors output from the data I/O buffer 45, determines positions thereof, and outputs position information thereof to the error detection signal line 93 or the first internal I/O line 92. For this error bit detection circuit 5, for example, if 1-bit error correction is necessary, a well-known cyclic Hamming code encoder/decoder may be used. FIGS. 11 and 12 show specific examples of a data cyclic Hamming code encoder and a cyclic Hamming code decoder for forming 7-bit codes where, for example, a 1-bit error can be corrected by a 4-bit data bit. Customarily, a logical value of an erasure state is "1", and a logic value of a write state is "0". However, in the data storage system of the first embodiment of the present invention, conversely, a logic value of an erasure state is defined to be "0", and a logic value of a write state is defined to be "1". Since the circuit for executing linear error correction is used in the first embodiment of the present invention, a logic value "0" of all the syndromes corresponds to a state of no errors, and the above definition is employed so that an initial value of no errors can be formed only by erasing one block including the syndromes as a whole. Needless to say, write-in and erasure logic values of the memory cell are set as in the conventional case and, by disposing a logic inversion circuit in the second internal I/O line 91, logic values of the error bit detection circuit 5 may be set in reverse to the logic values of the memory cell

[Hamming Code Encoder]

As shown in FIG. 11, the data cyclic Hamming code encoder for forming a 7-bit code where a 1-bit error can be corrected by a 4-bit data bit includes three unit time delay circuits 8, two exclusive OR circuits 12, and two switches SW1 and SW2. In FIG. 11, it is assumed that 4 bits are provided in an information bit input IBI time-sequentially per unit time. The unit time delay circuit 8 has a function of delaying time by only one unit, and may be constituted by a flip-flop such as a well-known D type flip-flop or a latch circuit. It is assumed that a logic value of the D type flip-flop is set to "0" before a clock is supplied to the D type flip-flop. The switch SW1 is a switch circuit connected to a SW1a side during information bit inputting of 1 to 4 bits, and connected to a SW1b side during check bit outputting after the end of the information bit inputting of 5 to 7 bits. The switch SW2 is a switch circuit set in a connected state during the information bit inputting of 1 to 4 bits, and is adapted to output a logic value "0" in a ○ (white circle) direction during the check bit outputting after the end of the information bit inputting. By supplying clocks to such an arrangement by seven occurrences until the end of outputting of 7 bits, it is possible to form a cyclic code where 1-bit can be corrected. Thus, in encoding, the information bit input IBI is electrically connected to the first internal I/O line 92, the code output CO is electrically connected to the second internal I/O line 91 and, in the error bit determination circuit 6 including the error bit data determination circuit 105, the external I/O line 94 is electrically connected to the first internal I/O line 92. Therefore, the code, in which 1-bit can be corrected, can be written in the memory cell. The external I/O line 94 specifically represents an I/O portion connected to the I/O terminal of the memory card or external to the system package through a connection device or radio communication means.

[Hamming Code Decoder]

Further, as shown in FIG. 12, the cyclic Hamming code decoder as an example applied to the first embodiment of the present invention includes eleven unit time delay circuits 8, three exclusive OR circuits 12, and one AND gate 13. An error-corrected information bit output IBO is output after the information bit output IBO is delayed by 8 unit time delays. Simultaneously with the information bit output IBO, an error position detection output EPD can be obtained. This error position detection output EPD outputs a logic value "1" at a clock of a bit portion of an error position, and a logic value "0" when there are no error positions. Thus, in decoding, the code input COI is electrically connected to the second internal I/O line 91, the error-corrected information bit output IBO is electrically connected to the first internal I/O line 92, and the error position detection output EPD is electrically connected as an error detection signal to the error bit determination circuit 6 including the error bit data determination circuit 105 to provide the configuration of FIG. 3. To simply obtain the error position detection output EPD, only an error position detection output circuit 9 indicated by a dotted line of FIG. 12 is necessary. Thus, a circuit can be specifically constituted to detect a 1-bit error in the memory cell, and output the position of the 1-bit error information. The circuits of FIGS. 11 and 12 constitute the error bit detection circuit 5.

The cyclic Hamming code encoder and decoder capable of 1-bit error correction have been described. Needless to say, other code systems, for example, a general BCH code, an M code, a convolution code or a difference set cyclic code, or a combination thereof, may be used. To reduce the number of the second internal I/O lines 91 and the first internal I/O lines 92, preferably, a cyclic code is used, to which information bits are time-sequentially supplied, and which can be encoded and decoded by a small-sized circuit. Needless to say, a byte code which has $2^r$ origins of r[bits] of code words may also be used. For example, the Reed-Solomon code, which is a byte code in the BCH code, may be used. In the case of this byte code, a byte error indicating that one of the origins is an error is first detected, and then bytes before and after correction are compared to each other by one bit to determine whether an error bit in the byte is "1" or "0". Then, for example, if a result of the determination indicates that at least one bit in an erasure state changes to that in a write state, a refreshing operation may be carried out.

As a convolution code, the Weiner-Asch code for 1-bit error-corrected, the Iwadare code for burst error-corrected, or the Hargel-Burger code can be used. In this case, by setting a constraint length shorter than the page length, an output of first error correction information can be obtained earlier for decoding than in the case of encoding the convention code by one error correction code. Similarly, for a combination of codes, an information bit may be decomposed into, for example, an error correction code of a short code length may be used for encoding the first outputted information bit of the page, and an error correction code of a long code length may be used for encoding the subsequently outputted information bit of the page. A configuration in this case may include first error correction decoding means which receives at least one digital data output of a first page including a plurality of memory cells as time-sequential data, corrects at least a 1-bit data error and has a first code length, and second error correction decoding means which receives least one digital data output of the first page including a plurality of first memory cells as time-sequential data, corrects at least a 1-bit data error and has a second code length. The first code length may be set shorter than the second code length, and the information bit output of the first error correction decoding means may be made before the information bit output of the second error correction decoding means. In this way, the output of first error correction information can be obtained earlier for decoding than in the case of encoding one entire page by one error correction code, and a ratio of a code bit length to an information bit length can be smaller, whereby efficient encoding can be achieved.

The method of forming the error bit determination circuit 6 including the error bit detection circuit 5 and the error bit determination circuit 105 by the circuits has been described. Needless to say, however, a part thereof may be provided by, for example, software of a microcode computer having an accumulator and a memory element, or hardware of a sequencer. However, if the numbers of detection and correction bits are small, as shown in FIGS. 11 and 12, preferably, the error bit detection circuit 5 is provided by hardware, because a circuit area is reduced and a clock delay time is shortened. The decoding circuit, and the error correction decoding means are effective for not only the present embodiment but also all the embodiments described below.

[Read-Disturb Detection Circuit]

Figure 13:
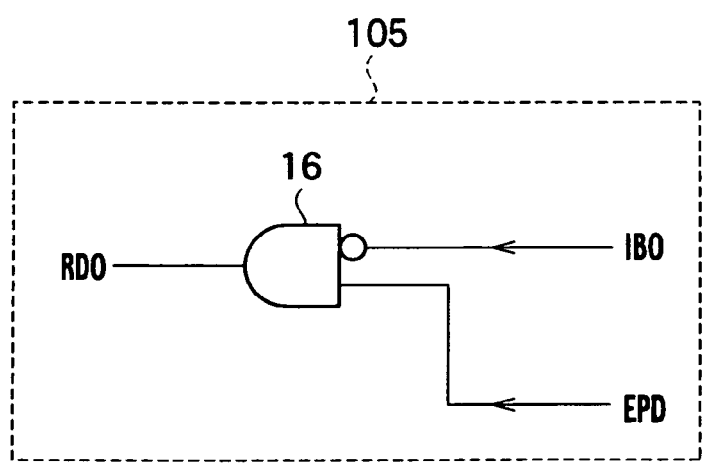
FIG. 13 is a logic circuit constitutional view of an example of a read-disturb detection circuit applied to the data storage system of the first embodiment of the present invention.

The data storage system of the first embodiment of the present invention is configured so that the error bit determination circuit 6 includes the error bit data determination circuit 105. The error bit data determination circuit 105 is provided by, for example, a circuit similar to that of FIG. 13. FIG. 13 shows a circuit for detecting read-disturb in the memory cell array. A problem with the circuit is that a threshold voltage is increased by repeated reading operation as shown in FIG. 1. In the circuit, negation of the error-corrected information bit output IBO shown in FIG. 12 and the error position detection output EPD, are inputted thereto. By the circuit of FIG. 13, a logic value "1" is output only when the error-corrected output is an erasure threshold value "0", that is, the erasure state "0" becomes the write state "1" by an error, in a place where an error position is detected. If the memory block cell is erased, where verification of erasure is carried out to suppress an erasure threshold value to a fixed value or lower, the erasure state "0" occurs before read-disturb stress is applied. Accordingly, if this erasure state "0" becomes the write state "1" due to an error, it may be considered as a state transition by reading voltage stress. Thus, a very small number of logic circuits, that is, one AND gate and one inverter, can constitute the means for determining whether a bit generating an error is "1" or "0". In FIG. 12, if the output of the last stage of 8-stage unit time delay circuit 8 is configured for the input of the AND gate on a side connected to the inverter output, the read-disturb can be detected by one AND gate to further simplify the circuit.

[Temporary Memory]

Figure 14:
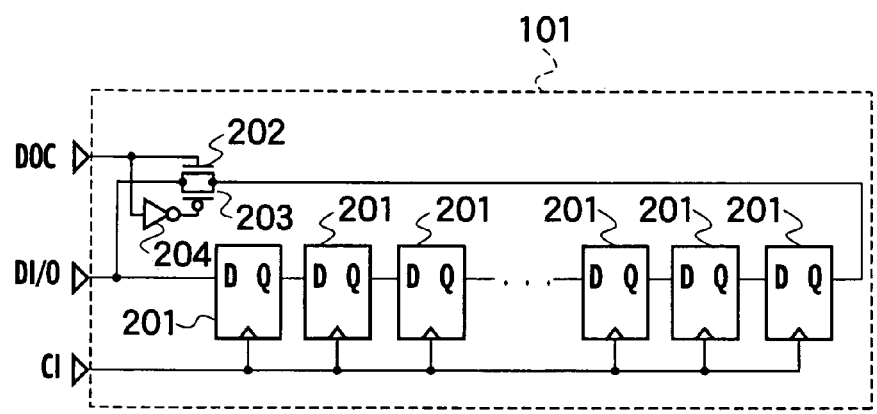
FIG. 14 is a logic circuit constitutional view of an example of a temporary memory applied to the data storage system of the first embodiment of the present invention.
Figure 15:
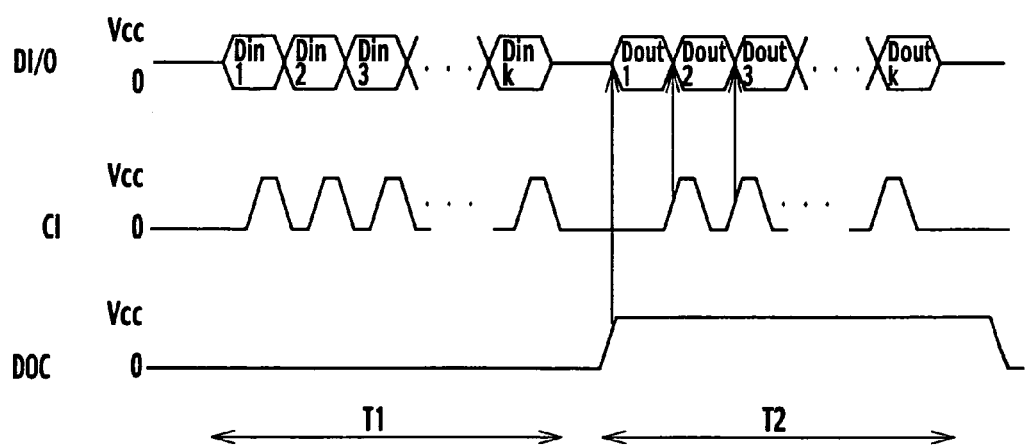
FIG. 15 is an operation waveform chart of the temporary memory shown in FIG. 14.

For the temporary memory included in the data storage system of the first embodiment of the present invention, a temporary memory 101 is connected to the external I/O line is. FIG. 14 shows a circuit example of the memory. In FIG. 14, an example of the temporary memory 101 for temporarily storing data of k bits is shown. In the example, D type flip-flops 201 are serially connected by k stages, and an output of a last stage is connected to a bidirectional switch circuit of an n type transistor 202, a p type transistor 203 and an inverter 204. The D type flip-flop 201 is set as an edge trigger type flip-flop. Output of the flip-flop is determined, at the moment at which a clock input CI rises from "L" (0[V]) to "H" (power supply voltage Vcc), and output of the flip-flop is not changed even if the clock is maintained at "H" or "L" or changed from "H" to "L". Further, in the bidirectional switch circuit, current terminals of the n type transistor 202 and the p type transistor 203 are electrical connection state when a data output control input is "H", and in the cut off state when the input is "L". FIG. 15 shows an operation of the circuit. In FIG. 15, T1 denotes a period for storing data in the page buffer or the temporary memory, and T2 denotes a period for reading out data from the page buffer or the temporary memory. To store data in the D type flip-flop, first, a data output control input DOC is set to "L" to prevent an output of the D type flip-flop 201 to the data I/O line DI/O. Additionally, after a digital data input Din1 of Vcc ("H") or 0V ("L") is supplied to the data I/O line DI/O, the clock input C1 is changed from "L" to "H". Thus, data of the data input Din1 is latched in the leftmost D type flip-flop 201 of FIG. 14. Then, after a digital data input Din2 of Vcc ("H") or 0V ("L") is supplied to the data I/O line DI/O, the clock input C1 is changed from "L" to "H". Thus, data of the data input Din1 is transferred and latched in the D type flip-flop that is second from the left in FIG. 14, and the data input Din2 is latched in the leftmost D type flip-flop 201. Thereafter, digital data are sequentially supplied to the data I/O line DI/O until k [bits] and the clock input C1 is supplied to latch the data of Din1, Din2, . . . , Dink in the D type flip-flops, in order, from the right of FIG. 14, whereby data of k[bits] can be latched.

Next, to read out the data from the temporary memory 101, first, a data output control input DOC is set to "H", and an output of the rightmost D type flip-flop 201 is output to the data I/O line DI/O. Accordingly, data (data output Dout1) similar to the data of the data input Din1 is output to the data I/O line DI/O. Further, the clock input C1 is changed from "L" t "H". Thus, 1-bit data is transferred from the left to right D type flip-flop and is latched therein. As a result, data (data output Dout2) similar to the data of the data input Din2 is output to the data I/O line DI/O. Thereafter, the clock input C1 is changed from "L" to "H" by a total of (k−1) times to output the data outputs Dout1, Dout2, . . . , Doutk equivalent to the data of the data inputs Din1, Din2, . . . , Dink in the D type flip-flops, in order, from the right of FIG. 14, whereby data of k [bits] can be outputted.

Thus, FIG. 14 clearly shows that the data of k [bits] of data can be sequentially stored, and taken out in the order in which the data was stored. This circuit can be used for the circuit of the page buffer 11 described above with reference to FIG. 14. In this case, k is changed to the number of information bits.

The circuit shown in FIG. 14 does not need nonvolatile memories, and can be provided by transistors, which form a logic circuit. Thus, a process similar to the formation of the logic circuit is used to enable process cost reduction.

[Refreshing Operation]

Next, a refreshing operation for detecting bit destruction by read-disturb and completely restoring data for one memory cell block (first memory cell block) of the memory cell array 1 will be described by use of flowcharts of FIGS. 16 to 18.

(a) In step SE1, the page counter 10 is reset to show a first page.
(b) In step SE2, for the first memory cell block, the page indicated by the page counter 10 is read out, error in the page is corrected, and the corrected page is stored in the page buffer 11. In this case, if the reading-out operation of the memory cell block is instructed from external to the memory macro 7, read-out contents, that is, contents shown by the page counter 10, can be transferred to the page buffer 11, and output in that state in parallel to the external I/O line 94. Here, since the operation of outputting the read-out data to the external I/O line 94 includes a detection operation of data destruction caused by read-disturb, execution time can be shortened more than in the case of carrying out the detection operation of the data destruction caused by read-disturb and the data output operation to the external I/O line 94 in respective sequence.

(c) In step SE3, detection is made during error correction as to whether a logic value "1" of an output of the page counter 10 formed in the error bit determination circuit 6 occurs at least once, whereby occurrence of a bit of read-disturb can be detected.

(d) If the output of the page counter 10 formed in the error bit determination circuit 6 never switches to a logic value "1", it is determined that no error bits were created by read-disturb on this page to increment the number of page counts in the page counter 10 by, for example, 1 in step SE4.

(e) In step SE5, determination is made as to whether the page counter 10 has referred to the indexes of all the pages. This determination is equivalent to whether the number of indexes is equal to/less than the number of pages included in one memory cell block if the sequence of step SE4 of incrementing the page counter 10 by 1 is used. If the number of pages is equal to/less than the number of pages included in one memory cell block in the sequence of step SE5, there are no cells of error bits by read-disturb in the page, and thus the process moves to the sequence of SE2 to check read-disturb of the next page. If the number of pages is larger than the number of pages indicated in one memory block, the process is finished by deciding that there are no cells of read-disturb in the memory cell block.

(f) If an error bit by read-disturb is detected in step SE3, the process moves to the sequence of step SE6 where the data of the first memory cell block is read and the error corrected data is written in the memory cell.

In the nonvolatile memory which has the charge storage layer 26, as described in Japanese Patent Laid-Open Hei 11 (1999)-330277, a threshold voltage change by read-disturb depends on log(ts) with respect to time of stressing ts. Thus, the threshold voltage is not greatly changed even if stress is added once after stressing. Therefore, if the number of times of reading-out is large, a probability of error bit occurrence by read-disturb per one reading is greatly reduced. Specifically, for example, if n is 1000 or higher, even if the number of times of read-out is increased by 1, the number of error bits by read-disturb is not suddenly increased. Thus, step SE6 does not need to be carried out immediately after step SE3. For example, after step SE3, a flag indicating data destruction and position information of the page may be stored in the temporary memory 101, and normal information bit reading, writing and erasing may be carried out between steps SE3 and SE6. Then, if a data input/output request frequency is low for the data storage system of the first embodiment of the present invention, the content of the temporary memory 101 may be accessed. If there is data destruction by read-disturb, step SE6 may be carried out. Additionally, after the sequence of step SE3, the flag indicating data destruction may be stored in the temporary memory 101, and pages of the first memory cell block may all be read out to be output as data to the external I/O line 94, whereby a process of reading out necessary pages of the first memory cell block may be carried out before the sequence of step SE6.

Therefore, in the data storage system of the first embodiment of the present invention, the necessary pages of the first memory cell block can be read out and output irrespective of data delay caused by the sequence of step SE6 when an information data read-out request is executed. When a data input/output request frequency is low, step SE6 equivalent to refreshing of the information bit can be carried out. Here, since steps SE1 to SE5 can be carried out only by a read-out operation without writing and erasing operations of information data in the memory cell array 1, a high-speed operation can be achieved. On the other hand, step SE6 takes time because it needs writing and erasing operations of information data in the memory cell array 1. Thus, when the data input/output request occurrence is low, step SE6 equivalent to the refreshing of the information bit may be carried out to enable improvement of apparent read-out latency.

For the purpose of reading-out a predetermined block such as an initial program loader or a file allocation table when power is supplied, by carrying out the sequence from step SE1 to SE5, in the data storage system of the first embodiment of the present invention, especially by carrying out the date destruction detection operation and the reading operation of steps SE1 to SE5 in the same operation, it is possible to selectively refresh a block having a high reading frequency. That is, a data destruction frequency by read-disturb is expected to be higher than the other memory cell blocks. Specifically, it is possible to provide a highly reliable data storage system with little data destruction. Preferably, the information bits of the predetermined page such as the initial program loader or the file allocation table can all be read out from the external I/O line 94, because when one page is read out, a data band width is simultaneously increased to enable high-speed reading.

[Specific Sequence of Step SE6]

Next, a specific sequence content of step SE6 will be described with reference to FIG. 17. FIG. 17 shows an example where after an error caused by read-disturb in the content of the first memory cell block is corrected, the content of the first memory cell block is written in the second memory-block to refresh data including the error bit caused by the read-disturb. Preferably, the second memory cell block has a structure substantially similar to that of the first memory cell block in order to reduce an area of the memory cell array 1 and to provide a more inexpensive chip. The number of pages in the second memory cell block must be at least equal to/higher than the total number of pages in the first memory cell block.

(g) In step SE7, first, the second memory cell block is erased. This sequence of the erasure is unnecessary if the second memory cell block has already been erased.

(h) Then, in step SE8, the page counter 10 is reset to show a first page.

(i) Then, in step SE9, in the first memory cell block, the page shown by the page counter 10 is read out, an error is corrected, and the error-corrected page is stored in the page buffer 11. In this case, if the read-out instruction operation of the first memory cell block is received from external circuits to the data storage system of the first embodiment of the present invention, the read-out content may be transferred to the external circuits through the external I/O line 94 when necessary.

(j) Further, in step SE10, the content of the page buffer 11 is encoded to be an error detection code, and the error detection code is written in the second memory cell block shown by the page counter 10. In addition to this write information bit, a data write end flag may be written in the other bit of the second memory cell block after finish of the writing. In this way, a writing failure caused by power cut-off during writing is detected to enable a return sequence.

(k) Then, in the sequence of step SE11, the page counter 10 is incremented by, for example, 1.

(l) Then, in step SE12, determination is made as to whether the page counter 10 has referred to the indexes of all the pages. This determination is equivalent to whether the number of indexes is equal to/less than the total number of pages included in the first memory cell block if the sequence of step SE11 of incrementing the page counter 10 by 1 is used. If the number of pages is equal to/less than the total number of pages included in the first memory cell block in the sequence of step SE12, the process moves to the sequence of step SE9 where read-disturb correction is carried out to contents of the next page and the corrected content of the next page is copied. If the number of pages is larger than the total number of pages included in the first memory, contents of information bits of all the pages of the first memory cell block are subjected to correction of a code error caused by read-disturb, and copied in the second memory cell block.

(m) Then, in step SE13, if a well-known file allocation table is used for the data storage system of the first embodiment of the present invention, a portion indicating the first memory cell block is changed to a portion indicating the second memory cell block in the content of the file allocation table, and the process is ended.

By the aforementioned operation of step SE6, the erasure threshold voltage and the write threshold voltage of the block are all reset to set threshold voltages before the read-disturb occurrence. This sequence is referred to as "refresh". By detecting the read-disturb to carry out the refreshing operation, it is possible to increase the number of times of reading to: [accumulated number of times of reading up to read-disturb determination]×[number of write erasure enable times of memory cell]. Thus, the number of times of reading can be greatly increased compared to that in the conventional case where no refreshing is carried out. A more reliable memory cell can be realized. The write threshold voltage and the erasure threshold voltage are also reset to the state before the occurrence of read-disturb or long-time data latching. Thus, a reduction in the threshold voltage before refreshing can be corrected to form a more reliable data storage system. Further, since the read-disturb detection operation does not generate data destruction, even after the read-disturb detection, the read-disturb can be detected by reading out the cell again in a state where rewriting is not carried out. Therefore, even if error data caused by read-disturb are detected in a plurality of blocks, refreshing of one block shown in the flowchart of FIG. 16 is repeated a plurality of times to correct data for each block, and thus it is possible to average refreshing frequencies.

Figure 16:
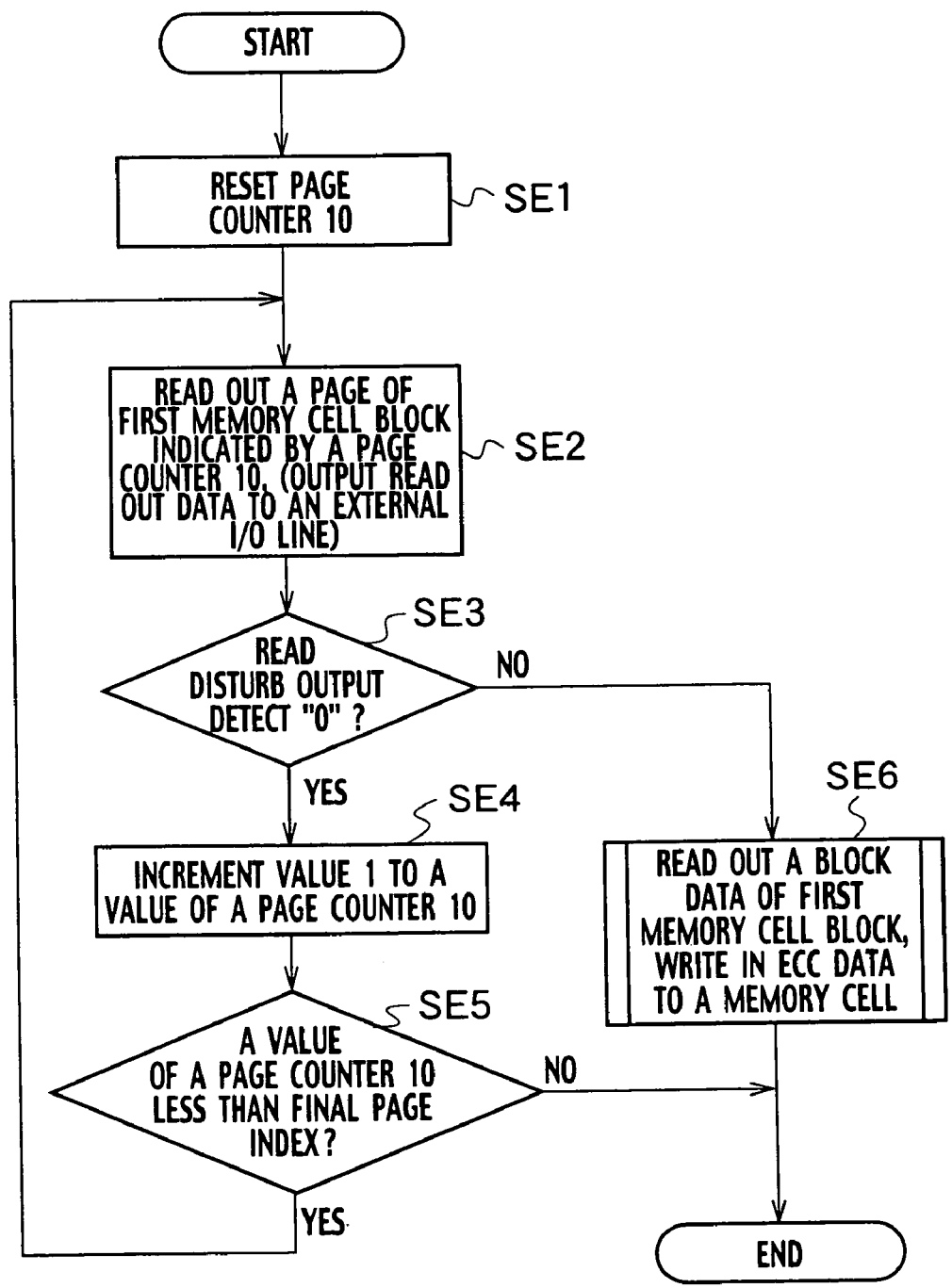
FIG. 16 is a flowchart explaining a data refreshing operation of one block in the data storage system of the first embodiment of the present invention.
Figure 17:
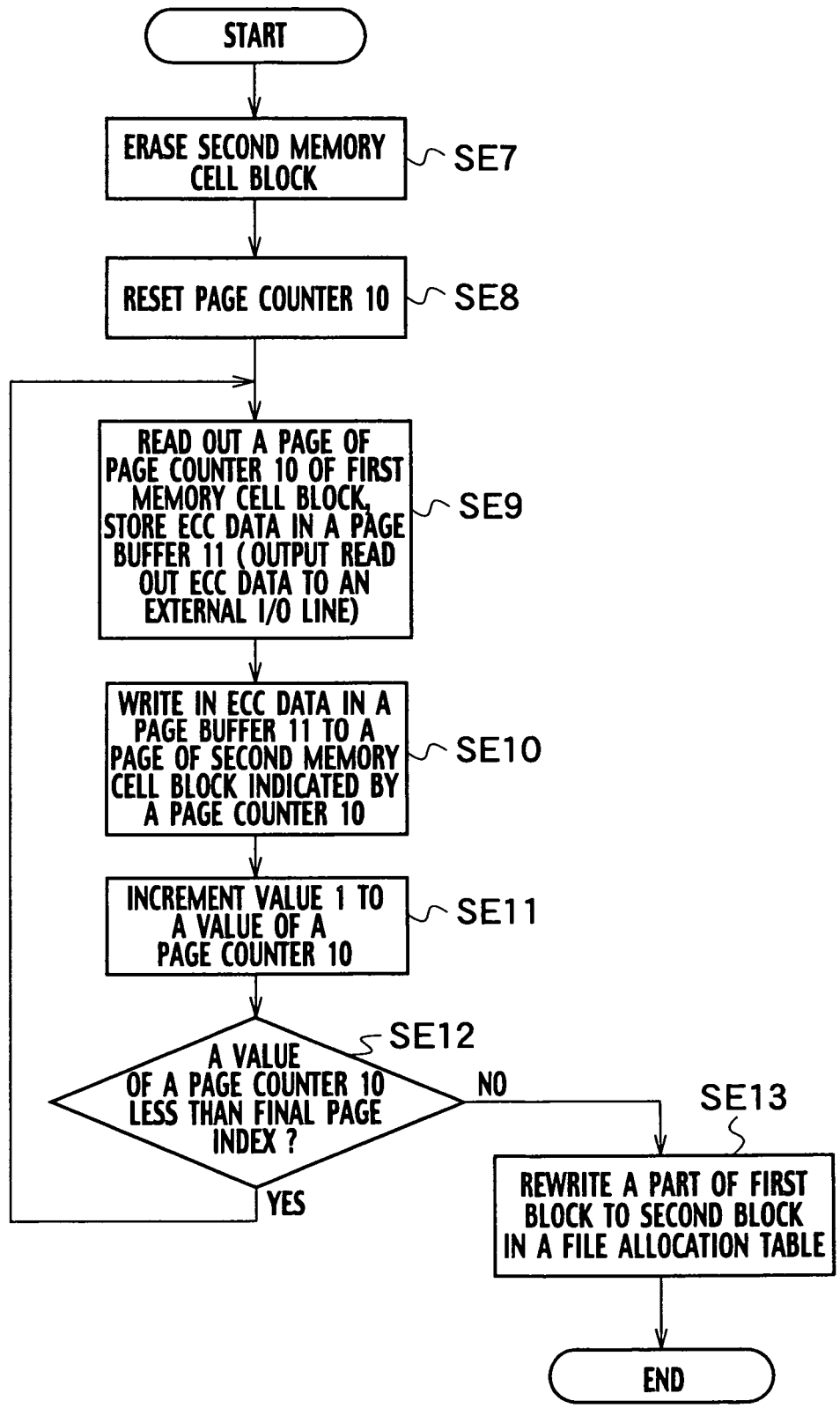
FIG. 17 is a detailed flowchart of the data refreshing operation in step SE6 in the data storage system of the first embodiment of the present invention.

Here, to correct the read-disturb of the plurality of blocks, for example, all the memory cell arrays, the sequence shown in the flowchart of FIG. 16 may be carried out for different first memory cell blocks. In this case, for example, if a plurality of third memory cells are prepared, and a error occurs because of read-disturb, it is only necessary to record an index which specifies a position of the error page or a position of the error block. Further, recording indexes of a plurality of page positions or a plurality of block positions in the plurality of third memory cells is preferable. Because, even if error data are detected due to read-disturb in the plurality of blocks, data can be corrected for each block by repeating refreshing of each block by the steps of the flowchart of FIG. 16 once for the plurality of blocks a plurality of times, and refreshing frequencies can be averaged. DRAM or SRAM may be used for the plurality of second memory cells. Alternatively, a plurality of memory cells having structures substantially similar to that of the first memory cells, for example, memories having structures similar to that of temporary memories shown in FIG. 23 or 28, may be used. Especially, in the case of using a plurality of memory cells having structures substantially similar to that of the first memory cells, it is a preferable that data can be latched even after power is cut off. Regarding a refreshing operation of the plurality of memory cell blocks, refreshing frequencies can be averaged even if there is a cycle of power cut-off and supply.

[Refreshing Algorithm of Nonvolatile Semiconductor Memory Device]

Figure 18:
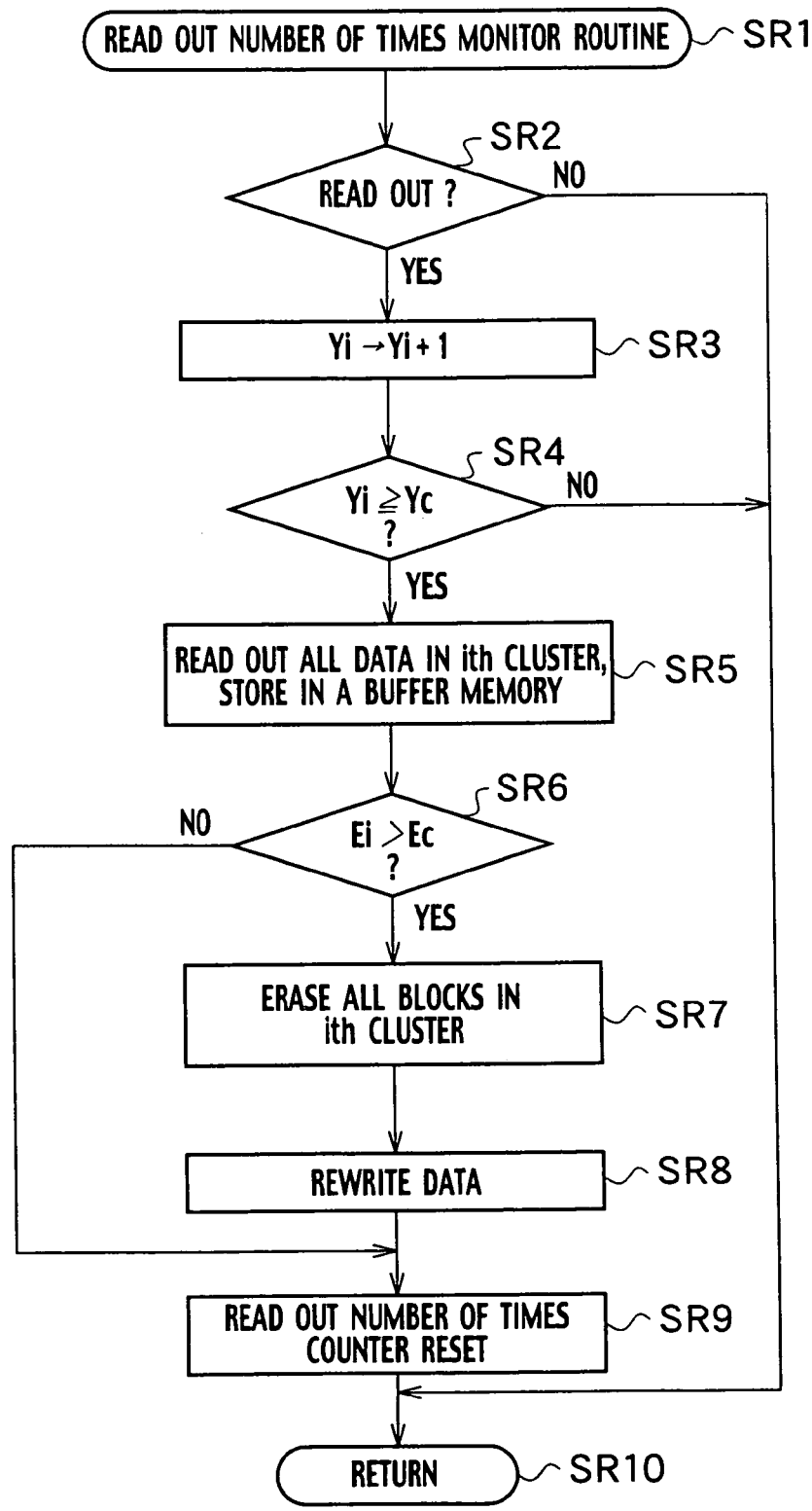
FIG. 18 is a flowchart diagram explaining block refreshing in the data storage system of the first embodiment of the present invention.

FIG. 18 is a flowchart showing a refreshing algorithm of a nonvolatile semiconductor memory device in the data storage system of the first embodiment.

(a) As shown in FIG. 18, in step SR1, when power is supplied, a total reading count Yi is automatically read out from previous re0reshing of all clusters, and the reading count Yi is preset in the page counter 10 for counting the total number of read-out times. Then, a CPU 108 monitors data reading from the memory macro 7.

(b) When data reading is carried out in step SR2, in step SR3, a total reading count Yi is incremented by 1 by the page counter 10. In step SR4, determination is made as to whether the total reading count Yi is equal to a preset reference number of reading times Yc.

(c) In step SR5, when the total reading count Yi is equal to the reference value Yc, all the data are read out, and stored through the ECC circuit unit 100 in the page buffer 11. Errors in the data are determined by the ECC circuit unit 100, and the number of errors Ei is counted by an error number counter in the ECC circuit unit 100.

(d) In step SR6, the number of errors Ei is compared with a permissible value Ec preset in an error number comparator. The permissible value Ec can be changed as occasion demands.

(e) In step SR7, when the number of errors Ei exceeds the permissible value Ec, all the blocks in an i-th cluster are erased. In step SR8, error-corrected data is written again in the same cluster and is refreshed.

(f) In step SR9, a total read-out count Yi for a cluster i is rewritten to "0" and is reset.

(g) On the other hand, in step SR6, if the number of errors does not exceed the permissible value, no data erasure or rewriting-in is carried out (steps SR7, SR8) and, in step SR9, the total read-out count Yi is rewritten to 0 and is reset.

(h) In step SR9, the series of operations are repeated.

An example of such a refreshing algorithm of the nonvolatile semiconductor memory device is as disclosed in Japanese Patent Laid-Open Hei 8 (1996)-279295.

According to the first embodiment of the present invention, means are provided, which detect at least a 1-bit data error, and determines whether the error bit is "1" or "0". Here, the error detection, caused by read-disturb, where an erasure bit "0" is detected as a write bit "1" is reverse to the error direction, caused by a write data latching failure, where a write bit "1" is detected as an erasure bit "0". Such directions can be distinguished from each other. Thus, for example, by selectively refreshing the former error bit caused by the read-disturb without refreshing the write data retention failure, it is possible to achieve a refreshing cycle, which is longer than that in a case where no determination means is provided.

Additional writing only needs to be carried out for the write data retention failure bit and, different from the case of refreshing of the read-disturb, it is not necessary to rewrite after all the blocks are erased. Thus according to this method, the means for determining whether the error bit is "1" or "0" enables a decrease of the long erasure time necessary to refresh the write data retention failure, and it is possible to shorten the entire refreshing time.

In the data storage system 4 of the first embodiment of the present invention, the plurality of semiconductor memories including error correction bits are formed in the memory macro 7. Only the number of memory means not including error correction is different from the number of memory cells in the row direction of the array, and no special circuits or means such as a special cell for detecting data destruction are necessary for the memory macro 7. Thus, especially since the error correction bits and the information memory bits can be repeatedly formed adjacent to each other by similar patterns, it is possible to provide an inexpensive data storage system 4 having a small chip area by use of the memory macro 7 similar to that of the conventional case. Further, read-disturb detection is always carried out after a point of time when the read-disturb generates an information bit to be error-corrected. Thus, even if the statistical behavior of the "tail bit" which causes read-disturb is changed between the chips or with time, the read-disturb can be correctly detected.

In the data storage system 4 of the first embodiment of the present invention, means are provided, which can correct error bits. Correction can be carried out for both a data error from "1" to "0" and a data error from "0" to "1" in the process of outputting the data to the external I/O line 94. Thus, data correction of a data retention failure together with read-disturb refreshing is enabled.

According to the configuration of the data storage system 4 of the first embodiment of the present invention, at least a primary memory capacity equivalent to the pages buffer 11 capacity only needs to be provided. It is not necessary to provide a capacity for storing all the blocks. Thus, a capacity of the primary memory necessary for refreshing can be further reduced, and it is possible to achieve a data storage system 4 provided by a circuit having smaller power consumption and a smaller area.

According to the configuration of the data storage system 4 of the first embodiment of the present invention, different from the conventional case, an error bit caused by read-disturb is directly detected from the data, which has been error-corrected and encoded. Thus, even if an encoded bit is a cell abnormally sensitive to read-out stress, that is, "tail bit", the read-disturb can be correctly detected at a point of time when a data error occurs. Therefore, a data-refreshing interval can be set in accordance with characteristics of the "tail bit" of a real memory, and made longer to decrease the occupation time for data refreshing.

According to the configuration of the data storage system 4 of the first embodiment of the present invention, the error bit caused by the read-disturb is detected by one data reading operation for one page. Thus, compared with the conventional case of not detecting the read-disturb, no changes occur in the time for reading, and it is possible to carry out reading at a high speed.

According to the configuration of the data storage system 4 of the first embodiment of the present invention, when power is cut off and the power is subsequently supplied, and, furthermore, reading out data of at least one page from the external data output terminal is repeated a plurality of times corresponding to sets of turning off the power, supplying the power, and reading out information data identical to the information data written in the page is larger than the number of times of reading information data identical to the information data written in the page when the operation for continuously reading out the data of at least one page is carried out. Thus, as seen from the outside of the system, a data storage system 4 having enhanced reliability for the read-disturb, as compared to the single memory macro 7 is achieved.

According to the data storage system 4 of the first embodiment of the present invention, the second memory cell block only needs to be erased, while it is not necessary to erase the first memory cell block. Thus, the time for erasing the memory cell block can be decreased more than a later-described third embodiment, and the time occupied by the refreshing function can be decreased.

Second Embodiment

Figure 19:
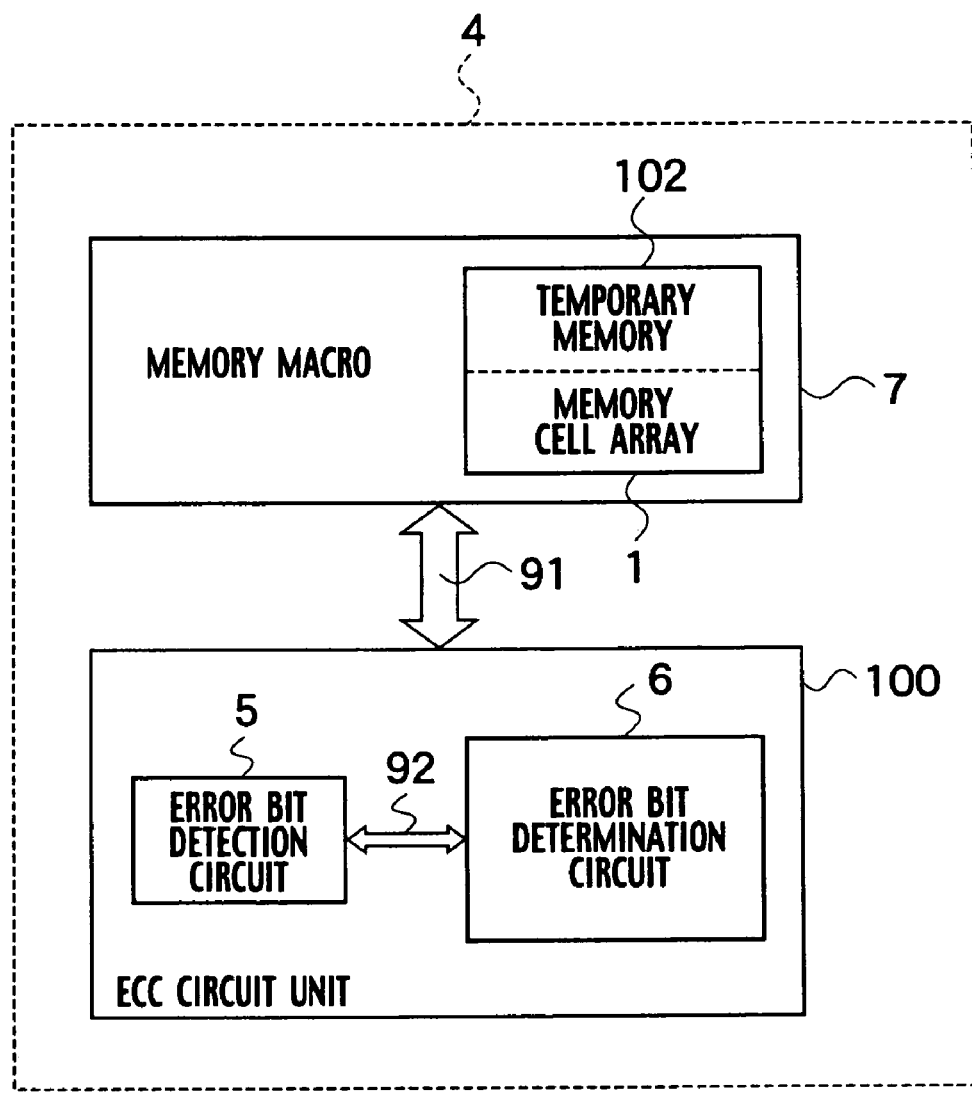
FIG. 19 is a schematic block configuration view of a data storage system of a second embodiment of the present invention.

In the first embodiment of the present invention, the temporary memory is provided outside the memory macro 7. However, it can be provided in the memory macro 7. A specific example of the temporary memory is disclosed in Japanese Patent Application 2000-344364. As shown in FIG. 19, the data storage system 4 of the second embodiment of the present invention includes a memory macro 7 which includes a memory cell array 1, and a temporary memory 102 constructed on the same chip as that of the memory cell array 1, adjacent to the memory cell array 1 and by substantially the same circuit as that of the memory cell array 1. An ECC circuit unit 100 which includes an error bit detection circuit 5 and an error bit determination circuit 6 are also included. A first internal I/O line 92 is wired between the error bit detection circuit 5 and the error bit determination circuit 6. A second internal I/O line 91 is wired between the memory macro 7 and the ECC circuit unit 100. The memory macro 7 is as shown in detail in FIG. 20, and the ECC circuit unit 100 is as shown in detail in FIG. 4.

[Data Storage System]

Figure 20:
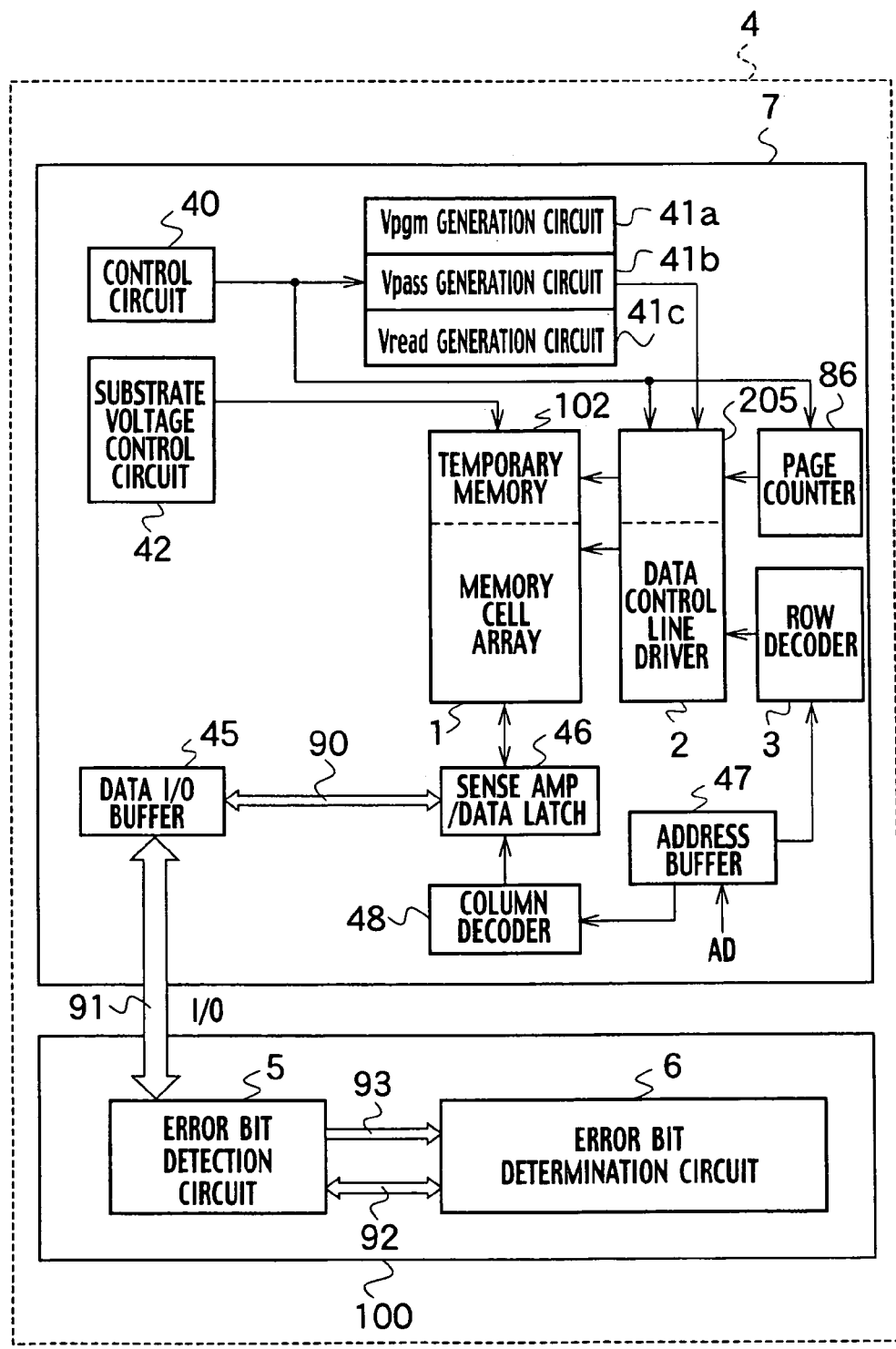
FIG. 20 is a detailed block configuration view of a data storage system of a second embodiment of the present invention.
Figure 21:
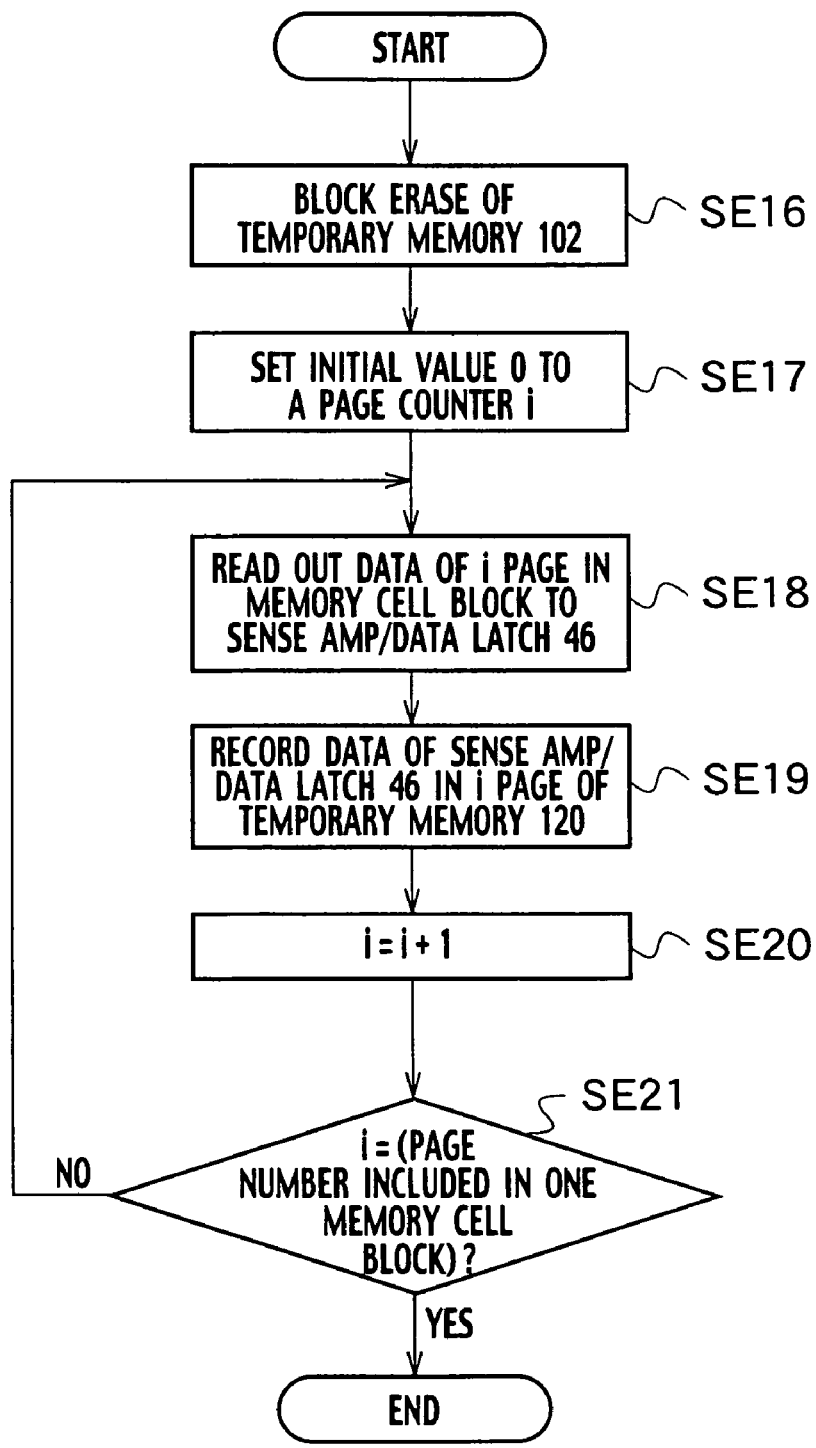
FIG. 21 is a flowchart, explaining step SE4 of a data refreshing operation in the data storage system of the second embodiment of the present invention.
Figure 22:
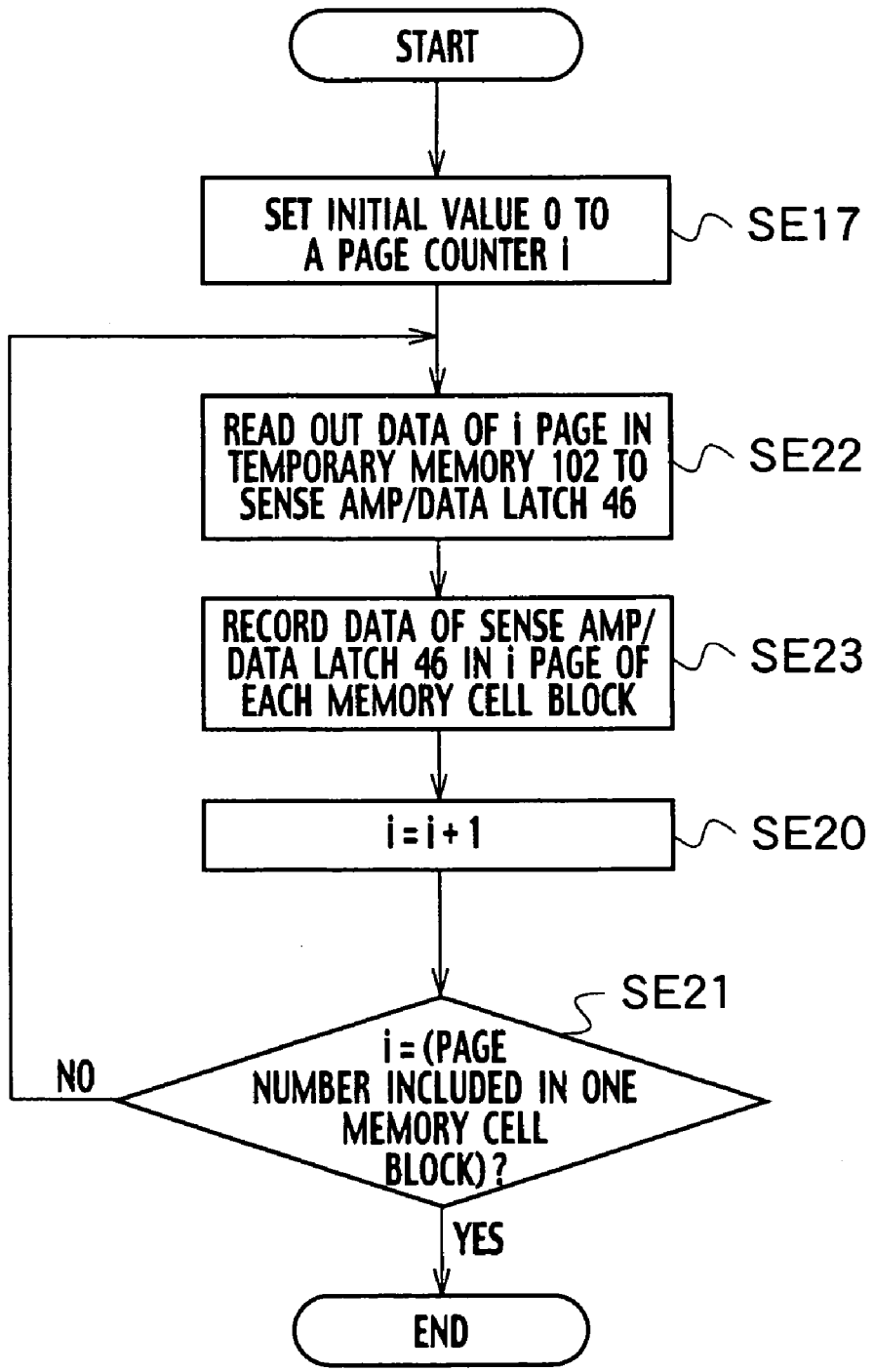
FIG. 22 is a flowchart, explaining step SE7 of the data refreshing operation in the data storage system of the second embodiment of the present invention.

According to the second embodiment of the present invention, as shown in FIG. 20, in the memory macro 7, the temporary memory 102 is formed adjacent to the memory cell array 1 and on the same chip as that of the memory cell array 1. Here, for the refreshing operation shown in FIGS. 16 and 17, if a sequence shown in the flowcharts of FIGS. 21 and 22 is executed by use of circuitry shown in FIG. 20, it is possible to refresh data of a memory cell block where read-disturb occurs without using any new temporary memories external to the memory macro 7. FIG. 20 is basically similar to FIG. 3, but the temporary memory 102 and a page counter 86 are added. The page counter 86 counts positions of pages in one block. For example, the page counter is constituted by a shift register and a binary counter using flip-flops. In the temporary memory 102 and in one page of the memory cell block where the read-disturb occurs, one data selection line is selected through data control line drivers 2 or 205 in accordance with a counter value. As an input of the page counter 86, a control circuit 40 is connected to initialize the page counter 86 and to increment the counter value.

Figure 23:
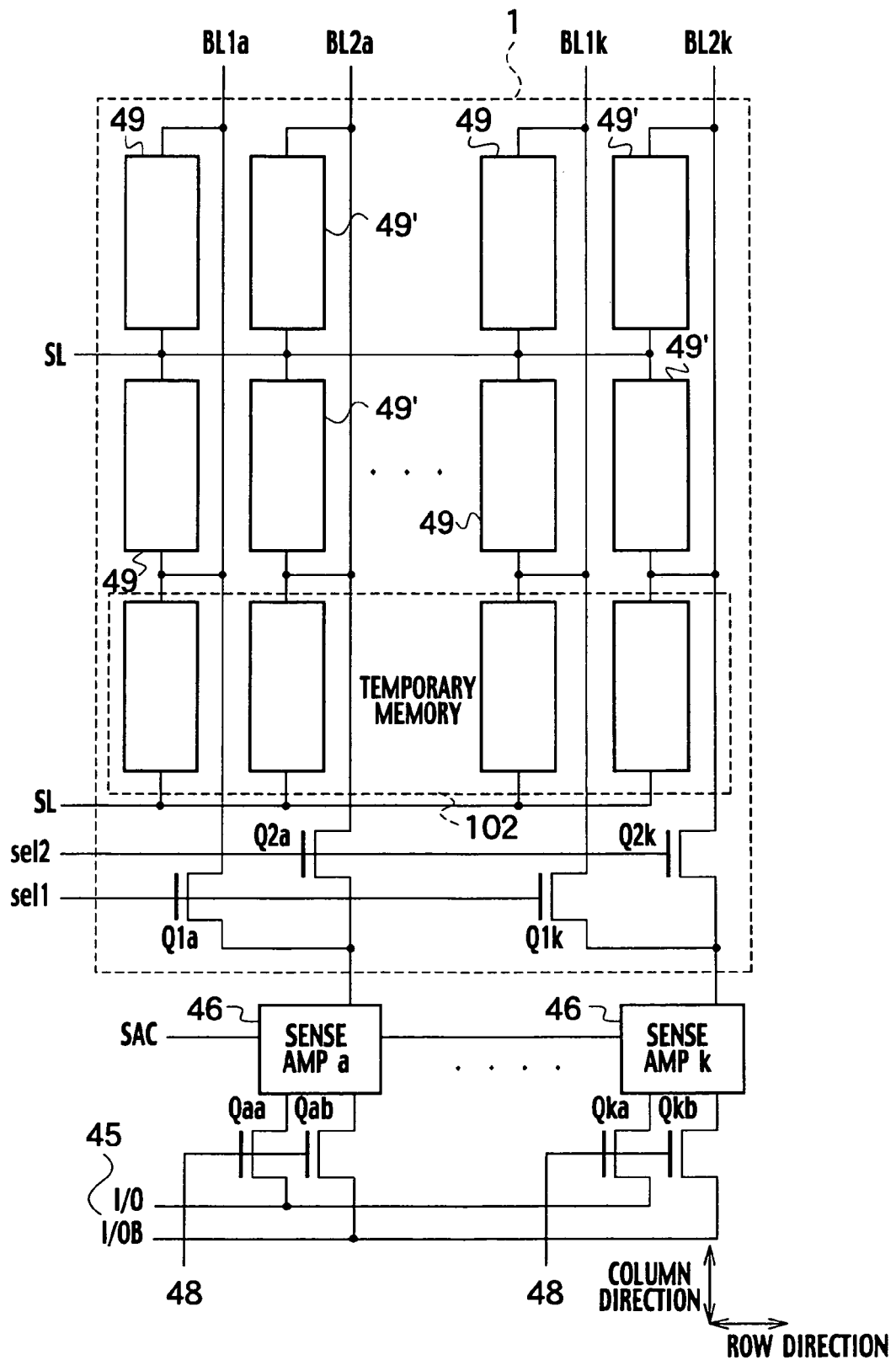
FIG. 23 is a circuit constitutional view of the layout of the cell array and the sense amplifier circuit in the data storage system of the second embodiment of the present invention, especially showing a formation example of the temporary memory.

For the temporary memory 102 of FIG. 20, a temporary memory, to which one block similar to a memory block of a memory cell array 1 shown in FIG. 23 is added, may be formed on the extension of the same data transfer line BL. FIG. 23 is a circuit diagram corresponding to FIG. 6. In FIG. 23, a plurality of memory cells connected to the same data selection line is used as the temporary memory 102. Such a configuration enables the number of data bits of the temporary memory 102 to match with the number of memory cells connected to the same data selection line for storing data. Further, the data control line driver 205 connected to the temporary memory 102 may be formed in the same circuit as that of the data control line driver 2 connected to the memory cell array 1. Thus, an area of the temporary memory 102 can be designed as small as in the case of the memory cell array 1 for one page.

[Relation Between Number n of Data Bits and Number of Memory Blocks]

In the data storage system 4 of the second embodiment of the present invention, if the number n of data bits read-out in a sequence is $>(2^{m-1}-m)$ and $\leqq(2^m-m-1)$ where m is a natural number, at least (n+m) or more memory cell blocks 49 are prepared in parallel in left and right directions of FIG. 23, that is, in the extended direction of the data selection line so as to make one page. In FIG. 20, preferably, at least (n+m) or more sense amplifiers/data latches 46 are prepared. Such a preparation of memory cells enables detection of 1 bit of a bit error of one page read out in the sequence of the memory cell array 1 by use of a Hamming code to obtain the bit error position. Generally, if the number of data bits read out in a sequence is $>[2^{m-1}-t\times(m-1)-1]$ and $\leqq(2^m-t\times m-1)$ where t is a natural number, at least (n+t×m) or more memory cells 49 are prepared in parallel in the left and right directions of FIG. 23, that is, in the extended direction of the data selection line to make one page. The memory cells belonging to one page are a plurality of memory cells connected in common to one data selection line WL are preferable because a plurality of memory cells can be selected by one data selection. Such a preparation of memory cells enables detection of a t-bit of bit error read out in a sequence of the memory cell array 1 by use of, for example, Bose-Chaudhuri-Hocquenghem (BCH) code to obtain its position. The foregoing can also be applied to the data storage system 4 of the other embodiments.

[Refreshing Operation]

Next, a sequence of a refreshing operation will be described in detail by use of flowcharts of FIGS. 21 and 22. FIG. 21 shows a sequence of copying data of a memory cell block, where read-disturb occurs, to the temporary memory 102.

(a) In step SE16, the temporary memory 102 is subjected to block erasure.

(b) In step SE17, the page counter 86 is set to an initial value, for example, 0, to select a first page, that is, WL0. Here, if a value of the page counter 86 is i, for example, WLi is selected.

(c) In step SE18, data of an i page of the memory cell block where the read-disturb occurs is read out to the sense amplifier/data latch 46. Since the memory cell block is stored in a block address latch 87, the memory cell block is transferred to the address buffer 47 to enable selection of the memory cell block. Further, since it is necessary to read out one page by a normal operation, the sense amplifier/data latch 46 naturally has a memory for storing data of one page, and can store information.

(d) In step SE19, the information of one page stored in the sense amplifier/data latch 46 is copied to the one page of the temporary memory (e) Further, in step SE20, a counter value of the page counter 86 is incremented by 1.

(f) In step SE21, if i denotes the number of pages included in one memory cell block, the process is ended. In the other cases, the operation of SE18 is repeated.

The series of operations enable all data of the memory cell block where the read-disturb occurs to be copied to the temporary memory 102.

The flowchart of FIG. 22 shows a sequence of rewriting the data in the memory cell block where the read-disturb occurs from the temporary memory 102.

(g) In step SE17, the page counter 86 is set to an initial value, for example, 0, to select a first page, that is, WL0. Here, if a value of the page counter 86 is i, for example, WLi is selected.

(h) In step SE22, data of an i page of the temporary memory 102 is read out to the sense amplifier/data latch 46. Since it is necessary to read out one page by a normal operation, the sense amplifier/data latch 46 naturally has a memory for storing data of one page, and can store information.

(i) In step SE23, the information of one page stored in the sense amplifier/data latch 46 is copied to the one page of the memory cell block.

(j) Further, in step SE20, a counter value of the page counter 86 is incremented by 1.

(k) In step SE21, if i denotes the number of pages included in one memory cell block, the process is ended. In the other cases, the operation of SE18 is repeated.

The series of operations enable rewriting of all the data of the temporary memory 102 to be rewritten to the memory cell block of the read-disturb.

In the sequences of FIGS. 21 and 22, the sense amplifier/data latch 46 can achieve the copying only by storing information of one page as in the conventional case. It is not necessary to read out data through the external I/O line 94 to the external circuit, and it is not necessary to provide any external temporary memories. Thus, there is no time expended for data transfer through the external I/O line 94, the sequence can be carried out at a high speed, and power for driving the external I/O circuit can be reduced. For example, if there is no external memory access when power is supplied or cut off, and the refreshing operation is carried out while power is ON, it is possible to automatically carry out the refreshing operation without any input instruction from the external circuit. Therefore, self-refreshing can be carried out while access time of reading, writing and erasing during normal use is maintained.

By use of the data storage system 4 of the present invention, it is not necessary to form a memory cell for data destruction detection separately from the memory cell for data storage and, even if there is a bit having an abnormally fast writing speed due to read-disturb, a data destruction cell can be correctly detected directly. Further, read-disturb detection is always carried out after a point of time when the read-disturb generates an information bit to be error-corrected. Thus, even if the statistical behavior of the tail bit is changed between the chips or with time, the read-disturb can be correctly detected. Moreover, for the data destruction due to reading, the data destruction cell is directly detected, and the data is completely restored to make a date refreshing interval longer.

Third Embodiment

Figure 24:
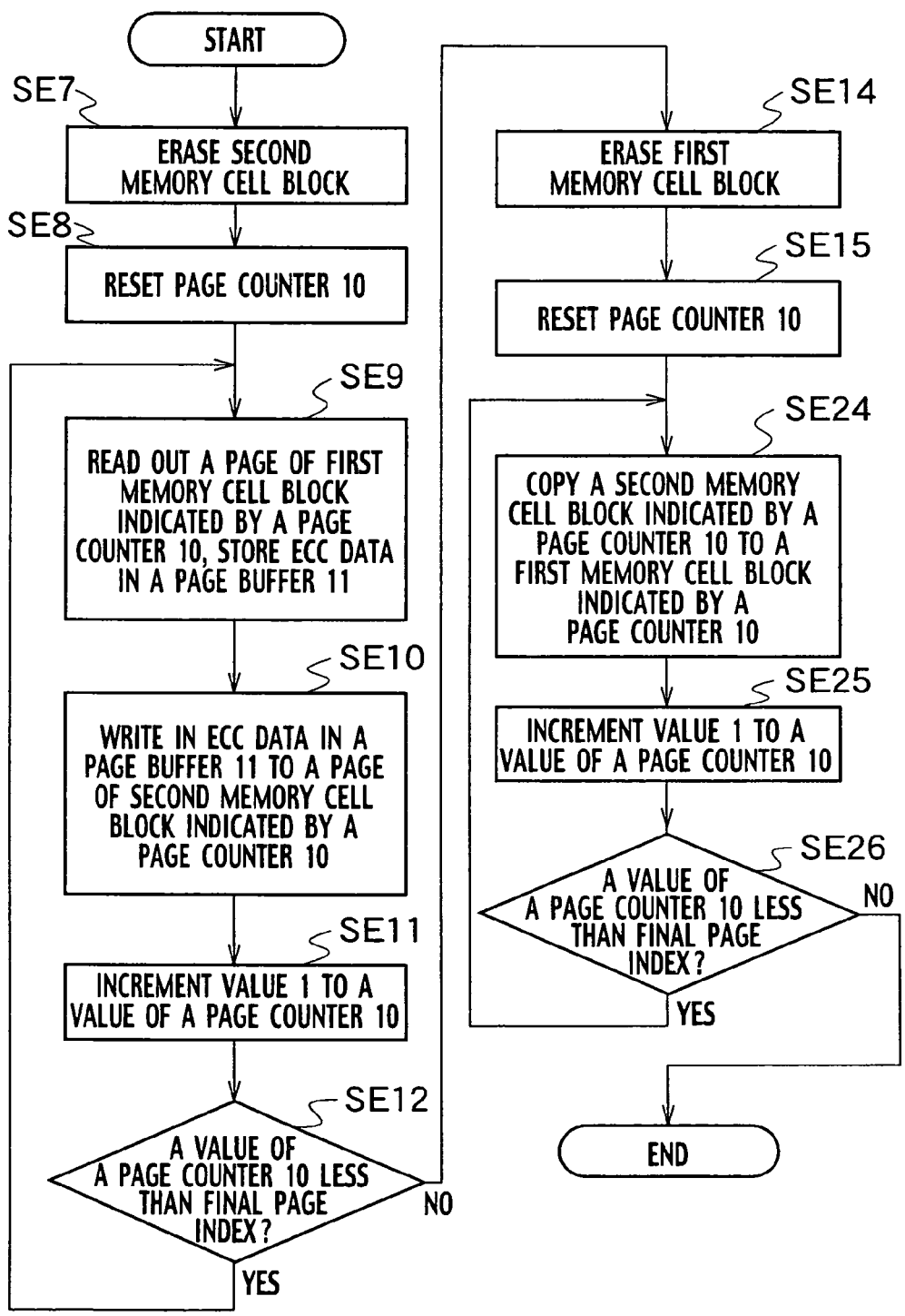
FIG. 24 is a flowchart of an operation method of a data storage system of a third embodiment of the present invention, explaining a data refreshing operation of one block of SE6.

An operation method of the data storage system 4 of the third embodiment of the present invention is, as shown in the flowchart of FIG. 24, substantially similar to the operation method of the data storage system 4 of the first embodiment. However, a sequence of step SE6 is different. Portions and voltage relations similar to that of the first embodiment are denoted by similar reference numerals, and detailed description thereof will be omitted.

[Operation Method of Data Storage System]

The operation method of the data storage system of the third embodiment provides for a content of the first memory cell block is error-corrected, is written in the second memory cell block, and a content of the second memory cell block is written in the first memory cell block. Thereby, the content of the first memory cell is refreshed to a position of the first memory cell. In a specific flow equivalent to step SE6, as shown in FIG. 24, a portion of error-correcting the content of the first memory cell block and writing the correct content it in the second memory cell block, that is, step SE7 to step SE12, is described above with reference to the first embodiment, and thus, the description will be omitted.

(n) If a result of step SE12 is NO, in step SE14, the first memory cell block is erased.

(o) In step SE15, the page counter 10 is reset to show a first page.

(p) In step SE24, a page shown by the page counter 10 in the second memory cell block is copied to the relevant page of the first memory cell block. Since the error has already been corrected in the sequence of steps SE9 to SE10, in the sequence of step SE24, no error correction is necessary, and thus the page is directly copied by use of a copy mode in the memory macro 7. In addition to this write information bit, a data write end flag may be written in a bit other than the information bit of the first memory cell block after writing is completed. In this way, a writing failure caused by power cut-off during writing is detected to enable restoration.

(q) Further, in step SE25, the page counter 10 is incremented by, for example, 1.

(r) In step SE26, determination is made as to whether the page counter 10 has referred to the indexes of all the pages. This determination is equivalent to determination of whether the number of indexes is equal to/less than the number of pages included in one memory cell block, if the sequence of step SE25 of incrementing the page counter 10 by 1 is used. If the number of pages is equal to/less than the number of pages included in one memory cell block in the sequence of step SE26, the process moves to the sequence of step SE24 where the content of the next page is copied from the second memory cell block to the first memory cell block. If the number is larger than the number of pages, contents of information bits of all the pages of the second memory cell block are copied to the first memory cell block.

In addition to the aforementioned features of the first embodiment, the third embodiment has the following features.

According to the third embodiment, the data of the first memory cell block is error-corrected and is rewritten in the first memory cell block. Thus, in the data storage system using a file allocation table, if information data is recorded in the first memory cell block, it is not necessary to change the file allocation table, and the data can be refreshed irrespective of a file structure.

Even for the purpose of reading out a predetermined block such as an initial program loader or a file allocation table after power is supplied, as a predetermined memory cell block, a first block address of the data storage system of the third embodiment can be allocated.

Further, detection of an error bit caused by read-disturb shown in FIG. 16 is carried out together with data reading-out when power is supplied, whereby error bit detection can be carried out without increasing latency of read-out data. As in the case of the first embodiment, as long as a data error is detected in the sequence of step SE3, and page position information is stored in the temporary memory 101 or 102, it is not always necessary to execute step SE6 immediately after the error bit caused by the read-disturb is detected.

Step SE6 does not need to be executed immediately after step SE3. For example, after step SE3, a flag indicating data destruction or position information of the page is stored in the temporary memory 101 or 102, and normal information bit reading, writing and erasure are carried out between step SE3 and step SE6. Then, when a data input/output request frequency for the data storage system of the third embodiment of the present invention is low, if the content of the temporary memory 101 or 102 is referred to so as to find data destruction caused by read-disturb, step SE6 may be carried out. Alternatively, after the sequence of step SE3, a flag indicating data destruction is stored in the temporary memory 101 or 102, pages in the first memory cell block are all read out, and output as data to the external I/O line 94. In this way, a process may be carried out to read out necessary pages of the first memory cell block before the sequence of step SE6.

Thus, in the data storage system of the third embodiment of the present invention, when an information data reading-out request is executed, the necessary page of the first memory cell block are read out and output irrespective of data delay caused by the sequence of step SE6. When a data input/output request frequency is low, step SE6 equivalent to information bit refreshing can be carried out. Steps SE1 to SE5 can be operated at a high speed because these steps can be executed only by reading operations without writing and erasing operations of information data in the memory cell array 1. On the other hand, step SE6 takes time because it is involved in writing and erasing operations of information data in the memory cell array 1. Thus, when a data input/output request occurrence is low, by executing step SE6 equivalent to information bit refreshing, it is possible to improve apparent reading-out latency.

For example, after a predetermined data area is read out to a DRAM or an SRAM, data input/output access external to the data storage system of the third embodiment of the present invention is reduced. Thus, if reference is made to the temporary memory 101 or 102 to find data destruction caused by read-disturb, a refreshing operation of step SE6 may be carried out.

Fourth Embodiment

Figure 25:
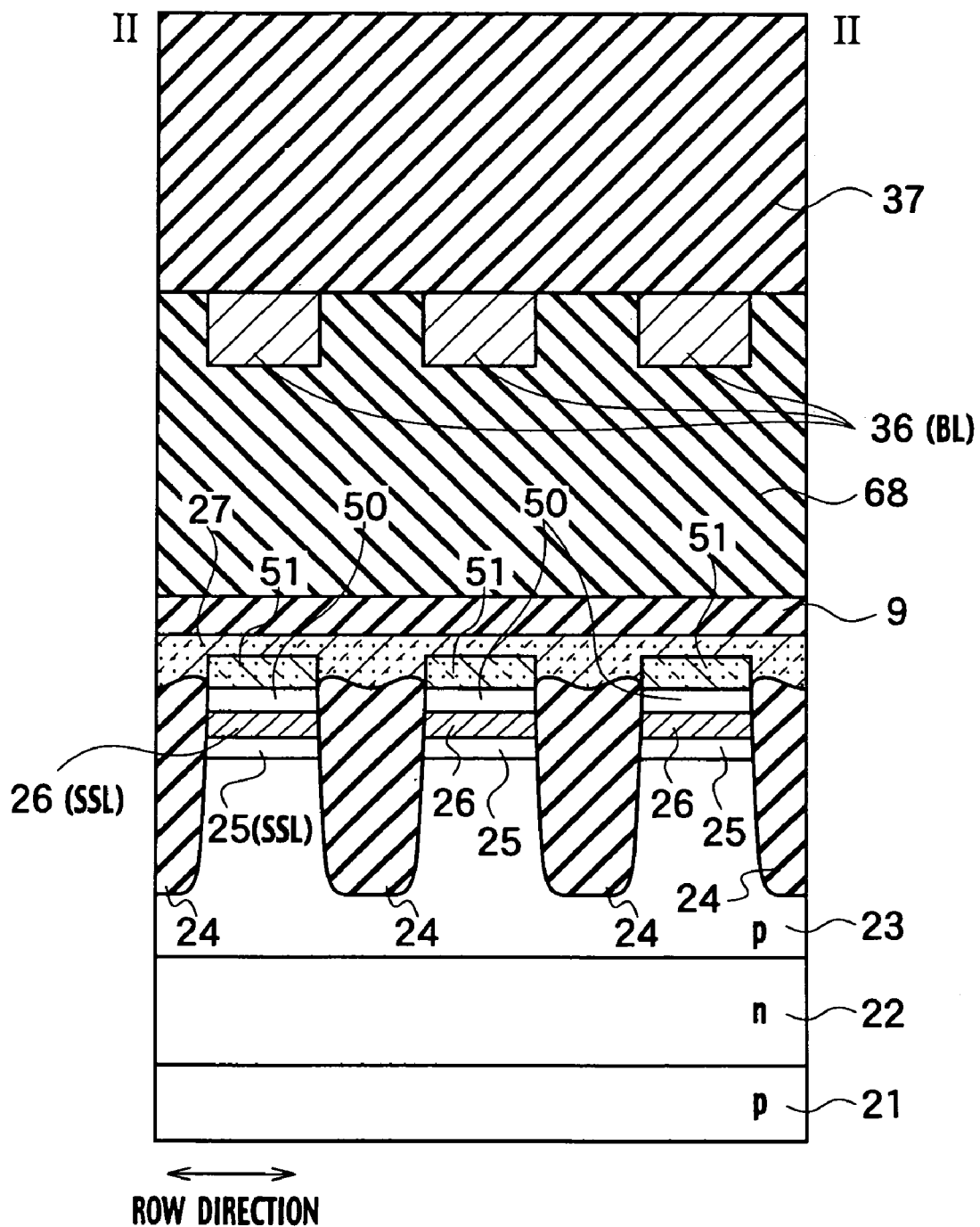
FIG. 25 is an element sectional structure view cut along a II-II row direction where a NAND type memory cell block is constituted of a NAND cell array block using a MONOS type gate structure in a data storage system of a fourth embodiment of the present invention.
Figure 26:
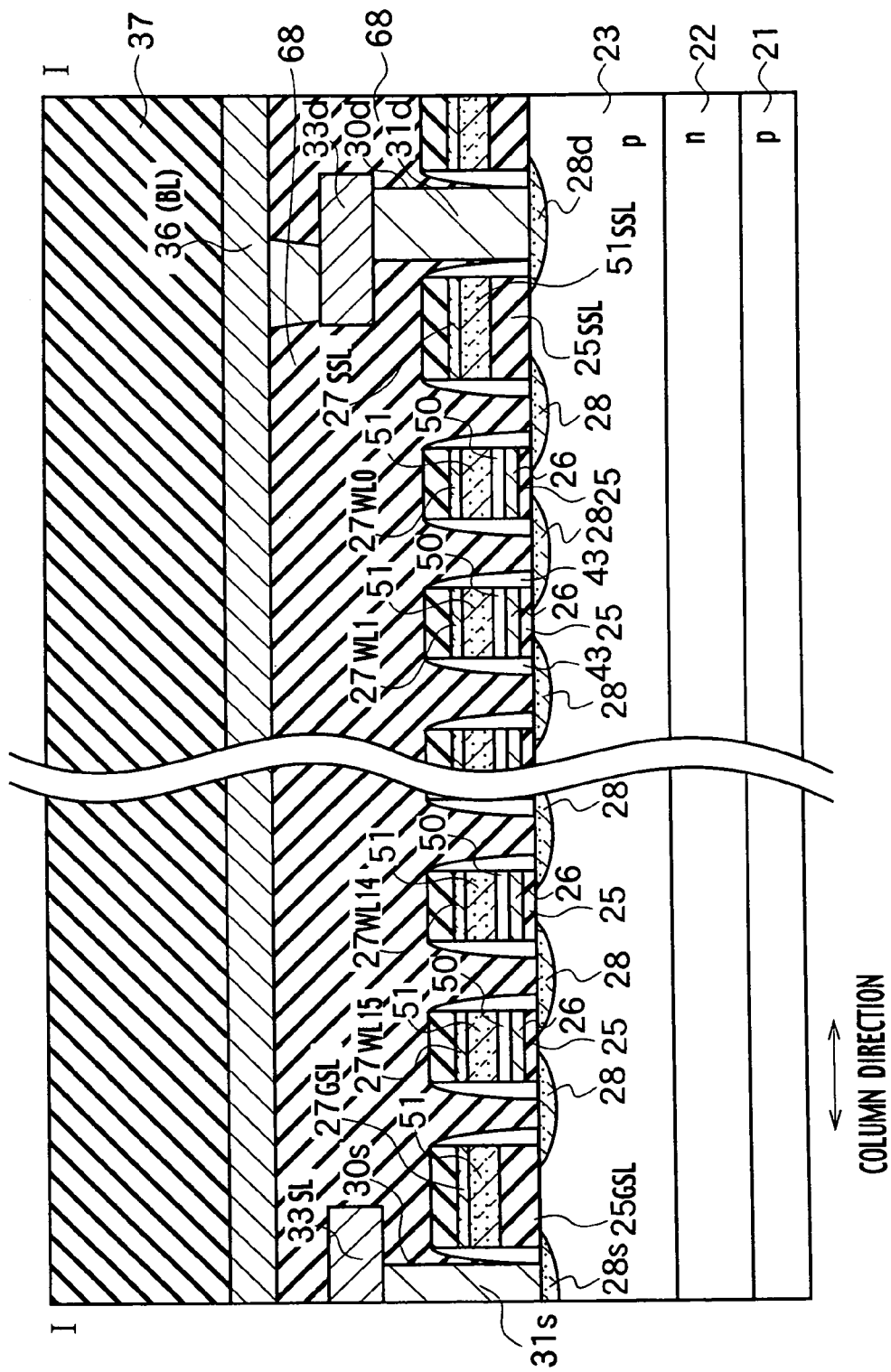
FIG. 26 is an element sectional structure view cut along a I-I column direction where the NAND type memory cell block is constituted of the NAND cell array block using the MONOS type gate structure in the data storage system of the fourth embodiment of the present invention.

As shown in FIGS. 25 and 26, the data storage system of the fourth embodiment of the present invention has a structure where the NAND type memory cell block of the data storage system of the first and second embodiments is changed to a NAND cell array block which uses a MONOS type gate structure. As shown in FIGS. 25 and 26, an element section structure corresponds to the structure shown in FIGS. 9 and 10, which is equivalent to the II-II direction and the I-I direction sectional views, respectively in the pattern plan view of FIG. 8. The II-II direction sectional view is equivalent to a memory cell portion sectional view. A plan view is identical to that of FIG. 8, and thus omitted.

[MONOS Structure]

In FIGS. 25 and 26, for example, nonvolatile memory cell transistors M0 to M15 constituted by MOS transistors where charge storage layers 26 are made of, for example, SiN, SiON or $Al_2O_3$ are serially connected, and one end of the memory cell transistors is connected through a selection transistor S1 to a data transfer line BL. The other end thereof is connected through a selection transistor S2 to a common source line SL. The transistors are formed on the same well. In FIGS. 25 and 26, in a p type well region 23 where boron impurity concentration ranges from $10^{14}$ $cm^{-3}$ to $10^{19}$ $cm^{-3}$, a charge storage layer 26 is formed to a thickness of 2 nm to 50 nm through a tunnel gate insulating film made of, for example, a silicon oxide film or an oxy-nitride film of 1 nm to 20 nm in thickness. A control gate electrode 27 is formed to a thickness of 10 nm to 500 nm on the charge storage layer 26, which is made of, for example, a poly-silicon, and has a stacked structure of tungsten silicide (WSi) and a polysilicon, or a stacked structure of NiSi, MOSi, TiSi or CoSi and a poly-silicon, through a silicon oxide film of 2 nm to 10 nm in thickness, or a block insulating film 50 of $Al_2O_3$, HfSiO, ZrSiO, HfSiON, or ZrSiON. As shown in FIG. 8, the control gate electrode 27 is formed up to a block boundary in the left and right directions so as to be connected between the adjacent memory cell blocks, thereby forming data selection lines WL0 to W115 and selection gate control lines SSL and GSL. Preferably, a voltage can be applied to the p type well region 23 independently of the p type semiconductor substrate 21 by the n type silicon region 22 in order to suppress a booster circuit load during erasure, so as to limit power consumption.

In the gate structure of the data storage system of the fourth embodiment of the present invention, since the side wall of the p type well region 23 is covered with the element isolation insulating film 24, the side wall of the p type well region 23 is not exposed by etching before the formation of the charge storage layer 26, and placement of the charge storage layer 26 below the p type well region 23 can be prevented. Thus, it is difficult for a gate electric field concentration or a parasitic transistor having a decreased threshold voltage to occur on the boundary between the p type well region 23 and the element isolation insulating film 24. Further, since a phenomenon of a decreased write threshold voltage caused by an electric field concentration, a so-called a sidewalk phenomenon is more easily prevented, it is possible to form a more reliable transistor.

On both sides of the gate electrode, n type diffusion layers 28 which become either source or drain electrodes are formed to sandwich a side wall insulating film 43 made of a silicon nitride film or a silicon oxide film of 5 nm to 200 nm in thickness. The n type diffusion layer 28, the charge storage layer 26 and the control gate electrode 27 constitute an M-ONO-S type nonvolatile EEPROM cell. A gate length of the charge storage layer 26 is set from 0.01 µm to 0.5 µm inclusive. The n type diffusion layer 28 is formed at a depth of 10 nm to 500 nm so as to set surface concentration of phosphorus, arsenic or stibium to $10^{17}$ $cm^{-3}$ to $10^{21}$ $cm^{-3}$. Additionally, the source/drain n type diffusion layers 28 are serially connected between the memory cells to provide a NAND connection. In FIGS. 25 and 26, references $27_{SSL}$ and $27_{GSL}$ denote control gate electrodes connected to the block selection lines SSL and GSL, respectively, and are formed on the same layer as that of the control gate electrode 27 of the MONOS type EEPROM. The control gate electrodes 27, $27_{SSL}$, and $27_{GSL}$ are opposed to the p type well region 23 through tunnel gate insulating films $25_{SSL}$ and $25_{GSL}$ of, for example, silicon oxide films or oxy-nitride films of 3 nm to 25 nm in thickness to form MOS transistors. Here, gate lengths of the control gate electrodes $27_{SSL}$ and $27_{GSL}$ are longer than that of the gate electrode of the memory cell, for example, from 0.2 µm to 1 µm inclusive. Thus a large ON/OFF ratio during block selection/non-selection can be maintained to prevent erroneous writing or erroneous reading.

An n type diffusion layer $28_d$ formed on one side of the control gate electrode $27_{SSL}$ and serving as a source or drain electrode is connected through a contact $31_d$ to a data transfer line 36(BL) of tungsten, tungsten silicide, titanium, titanium nitride, or aluminum. The data transfer line 36(BL) is formed up to the block boundary vertically as seen in FIG. 8 so as to be connected by the adjacent memory cell blocks. On the other hand, an n type diffusion layer $28_s$ formed on one side of the control gate electrode $27_{GSL}$ and serving as a source or drain electrode is connected through a contact $31_s$ to a source line SL. This source line SL is formed up to the block boundary in left and right directions of FIG. 8 so as to be connected by the adjacent memory cell blocks. The n type diffusion layer $28_s$ is formed up to the block boundary in left and right directions of FIG. 8 to be a source line. The BL contact and the SL contact are filled with, for example, an n or p type doped poly-silicon, tungsten, tungsten silicide, Al, TiN, or Ti to be conductor regions. Further, the source line SL or the data transfer line BL, and the transistor are filled with an element isolation insulating film 68 of, for example, $SiO_2$ or SiN therebetween. An insulating film protection layer 37 of, for example, $SiO_2$, SiN, or polyimide, and an upper wiring, not shown, of, for example, W, Al or Cu are formed on the data transfer line BL.

In the data storage system of the fourth embodiment of the present invention, in addition to the features of the first and second embodiments, the MONOS type cell is used. Thus, a write voltage and an erasure voltage can be reduced more than that of the floating gate type EEPROM used in the first and second embodiments. A high breakdown voltage can be maintained even when an element isolation space is narrowed and a thin gate insulating film is provided. Thus, an area of the circuit, to which a high voltage is applied, can be reduced, and the chip area can be reduced. Compared with the first and second embodiments, a thickness of the charge storage layer 26 can be reduced to 20 nm or less to enable an aspect reduction during gate formation. Further, a processed shape of the gate electrode can be improved, the filling-up property between the gates of the element isolation insulating layer 68 can be improved, and thus, the breakdown voltage can be increased. A process of forming a floating gate electrode or a process of forming slits is unnecessary, and thus, the forming process can be shortened. Since the MONOS type EEPROM cell is used, the charge storage layer 26 is an insulator, and a charge is captured in each charge trap. Thus, a charge has resistance to discharge and can have a strong resistance to radiation. Even if the sidewall insulating film 46 of the charge storage layer 26 is thin, good retention characteristics can be maintained to prevent discharging of all the charges captured by the charge storage layer 26. Furthermore, since the charge storage layer 26 can be formed without misalignment with the p type well region 23, a capacitor between the charge storage layer 26 and the p type well region 23 can be formed more uniformly. Thus, it is possible to reduce the variation of the value of the capacitor of the memory cell or the variation of the value of the capacitor between the memory cells.

Fifth Embodiment

Figure 28:
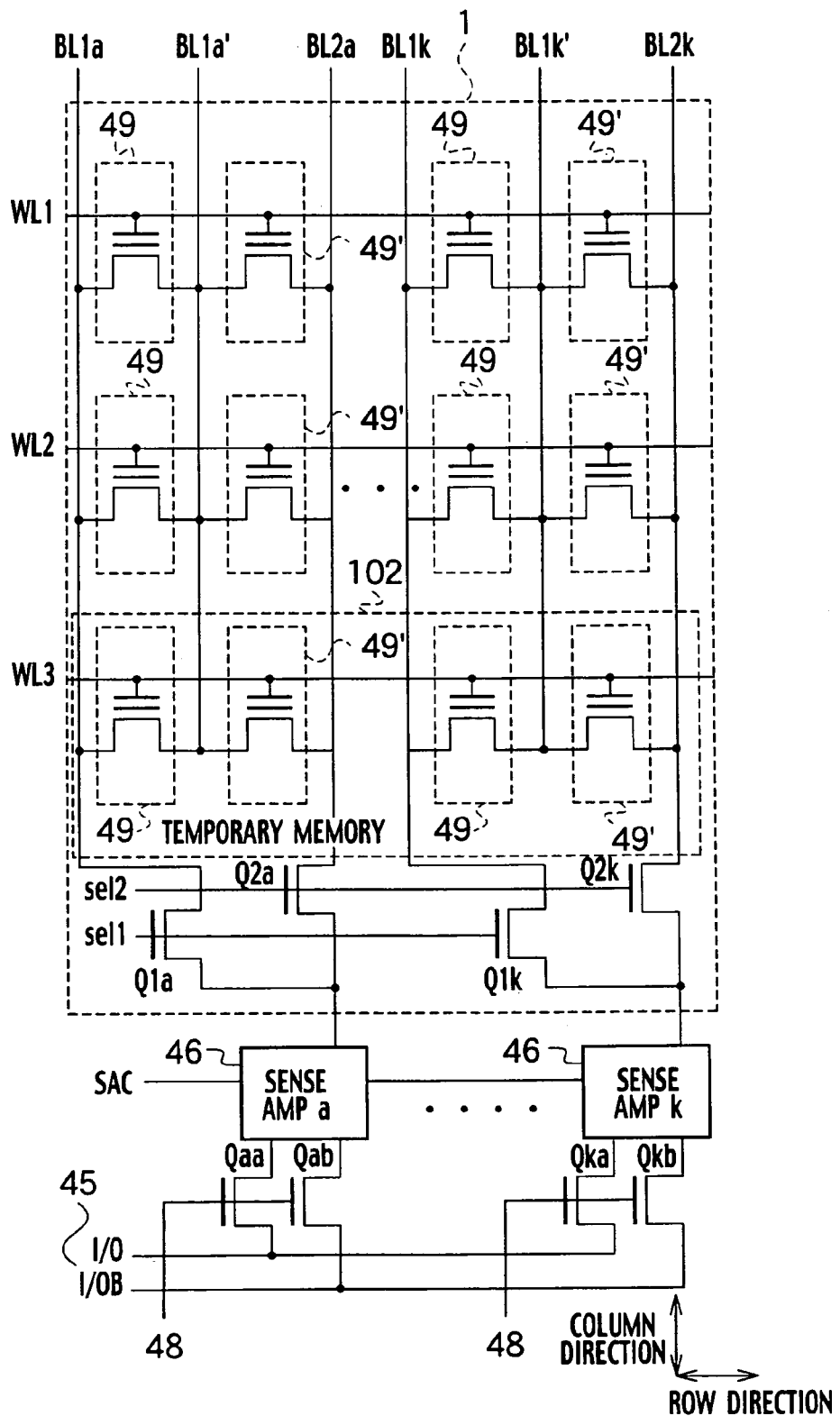
FIG. 28 is a circuit constitutional view showing the layout of the cell array including a temporary memory and the sense amplifier circuit in the data storage system of the fourth embodiment of the present invention.

In the data storage system of the fifth embodiment of the present invention, a layout of the memory cell array 1 and the sense amplifier/data latch 46 includes, as partially shown schematically in FIGS. 27 and 28, a memory cell array 1, a sense amplifier/data latch 46 which includes sense amplifiers a, ..., k, and MOS transistors Qaa, Qab, ..., Qka, Qkb connected between the sense amplifiers a, ..., k and a data I/O buffer 45, and selected by a column decoder 48. The fifth embodiment of the present invention has a structure where the NAND type memory cell array block 49 of the first to third embodiments is changed to a cell array block 49 of a virtual ground structure made of a MONOS structure. Portions similar to that of the first embodiment shown in FIG. 6 and that of the second embodiment shown in FIG. 23 are denoted by similar reference numerals, and description thereof will be omitted. Effects similar to that of the first to fourth embodiments, which are described in detail without any limitation of the embodiments, will not be explained. As shown in FIGS. 27 and 28, the memory cell array 1 is constituted by arraying memory cell blocks 49 and 49' where nonvolatile memory cells are connected in parallel. In order to sense data of the data transfer line BL of the memory cell array 1, or to latch write data, the sense amplifier/data latch 46 is provided through data transfer line selection transistors Q1a, Q2a, ..., Q1k, Q2k. The sense amplifier/data latch 46 is constituted mainly of a flip-flop circuit. Further, the sense amplifier/data latch 46 is connected to the data I/O buffer 45. These connections are controlled by an output of the column decoder 48 which receives an address signal from the address buffer 47. Data supplied to the data I/O buffer 45 can be written in the memory cell array 1, and read out to a third internal I/O line 90. To select a memory cell for the memory cell array 1, specifically, to control data control lines WL1 to WL3, and data transfer line selection gate lines sel1 and sel2, a row decoder 3 is provided.

In the arrangement shown in FIG. 27, as shown in FIG. 2, the data storage system 4 of the fifth embodiment of the present invention includes a memory macro 7 which includes a memory cell array 1, an ECC circuit unit 100 which includes an error bit detection circuit 5, an error bit determination circuit 6, and a temporary memory 101 connected to the ECC circuit unit 100. A first internal I/O line 92 is wired between the error bit detection circuit 5 and the error bit determination circuit 6. A second internal I/O line 91 is wired between the memory macro 7 and the ECC circuit unit 100. An external I/O line 94 is wired between the error bit determination circuit 6 and the temporary memory 101. The memory macro 7 is as shown in detail in FIG. 3, and the error bit determination circuit 6 is as shown in detail in FIG. 4.

In the arrangement shown in FIG. 28, as shown in FIG. 19, the data storage system of the fifth embodiment of the present invention includes a memory macro 7 which includes a memory cell array 1 and a temporary memory 102 formed on the same chip as that of the memory cell array 1, adjacent to the memory cell array 1, and an ECC circuit unit 100 which includes the error bit detection circuit 5 and the error bit determination circuit 6. A first internal I/O line 92 is wired between the error bit detection circuit 5 and the error bit determination circuit 6. A second internal I/O line 91 is wired between the memory macro 7 and the ECC circuit unit 100. The memory macro 7 is as shown in detail in FIG. 20, and the error bit determination circuit 6 is as shown in detail in FIG. 4.

According to the fifth embodiment of the present invention, in the arrangement shown in FIG. 28, and as shown in FIG. 20, in the memory macro 7, the temporary memory 102 is formed on the same chip as that of the memory cell array 1, adjacent to the memory cell array 1 and by substantially the same circuit as that of the memory cell array 1. Here, for the refreshing operation shown in FIGS. 16 and 17, if a sequence shown in the flowcharts of FIGS. 21 and 22 is executed by use of circuitry shown in FIG. 20, it is possible to refresh data of a block where read-disturb occurs without using any new temporary memories external to the memory macro 7. FIG. 20 is basically similar to FIG. 3, but the temporary memory 102 and a page counter 86 are added. The page counter 86 counts positions of pages in one block. For example, the page counter is a shift register and a binary counter using flip-flops. In the temporary memory 102 and in one page of the block where the read-disturb occurs, one data selection line is selected through a data control line driver 205 in accordance with a counter value. As an input of the page counter 86, a control circuit 40 is connected to initialize the page counter 86 and to increment the counter value.

For the temporary memory 102 of FIG. 20, a temporary memory to which one block similar to a memory block of a memory cell array 1 shown in FIG. 28 is added may be formed on the extension of the same data transfer line. FIG. 28 is a circuit diagram corresponding to FIGS. 6 and 23. In FIG. 28, a plurality of memory cells connected to the same data selection line are used as the temporary memory 102. Such an arrangement enables the number of data bits of the temporary memory 102 to match with the number of memory cells connected to the same data selection line for storing data. Further, the data control line driver 205 connected to the temporary memory 102 may be formed in the same circuit as that of the data control line driver 2 connected to the memory cell array 1. Thus, an area of the temporary memory 102 can have a small design as in the case of the memory cell array 1.

[Relation between Number n of Data Bits and Number of Memory Blocks for One Page]

In the data storage system of the fifth embodiment of the present invention, if the number n of data bits read-out in a sequence is $>(2^{m-1}-m)$ and $\leq(2^m-m-1)$ where m is a natural number, at least (n+m) or more memory cell blocks 49 are prepared in parallel in left and right directions of FIG. 27 or 28, that is, in the extended direction of the data selection line WL, so as to make one page. In the arrangement of FIG. 3 or 20, preferably, at least (n+m) or more sense amplifiers/data latches 46 are prepared. Such a preparation of memory cells enables detection of 1 bit of a bit error of one page read out in the sequence of the memory cell array 1 by use of, for example, a hamming code to obtain the bit error position. Generally, if the number of data bits read out in a sequence is $>[2^{m-1}-t\times(m-1)-1]$ and $\leq(2^m-t\times m-1)$ where t is a natural number, at least (n+t×m) or more memory cells 49 are prepared in parallel in the left and right directions of FIG. 27 or 28, that is, in the extended direction of the data selection line WL to make one page. The memory cells belonging to one page, for example, a plurality of memory cells connected in common to one data selection line WL are preferable because a plurality of memory cells can be selected by one data selection. Such a preparation of memory cells enables detection of t-bit of bit error read out in a sequence of the memory cell array 1 by use of, for example, Bose-Chaudhuri-Hocquenghem (BCH) code to obtain the position of the bit error. The foregoing can also be applied to the data storage system of the other embodiments.

[MONOS Structure]

Figure 29:
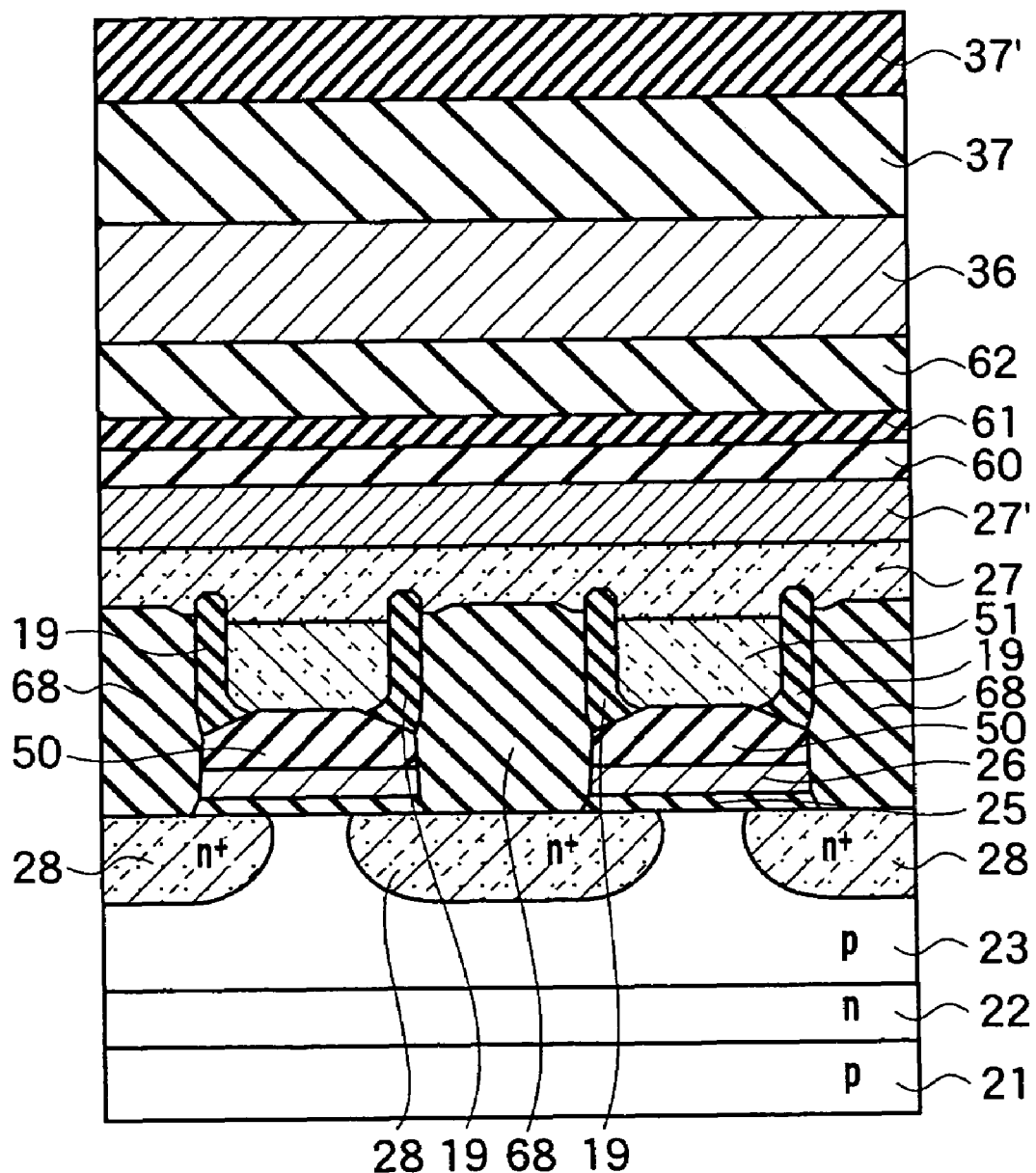
FIG. 29 is a row-direction element sectional structure view of a MONOS memory of a virtual ground array block to which two memory cells are connected in a data storage system according to a fifth embodiment of the present invention.
Figure 30:
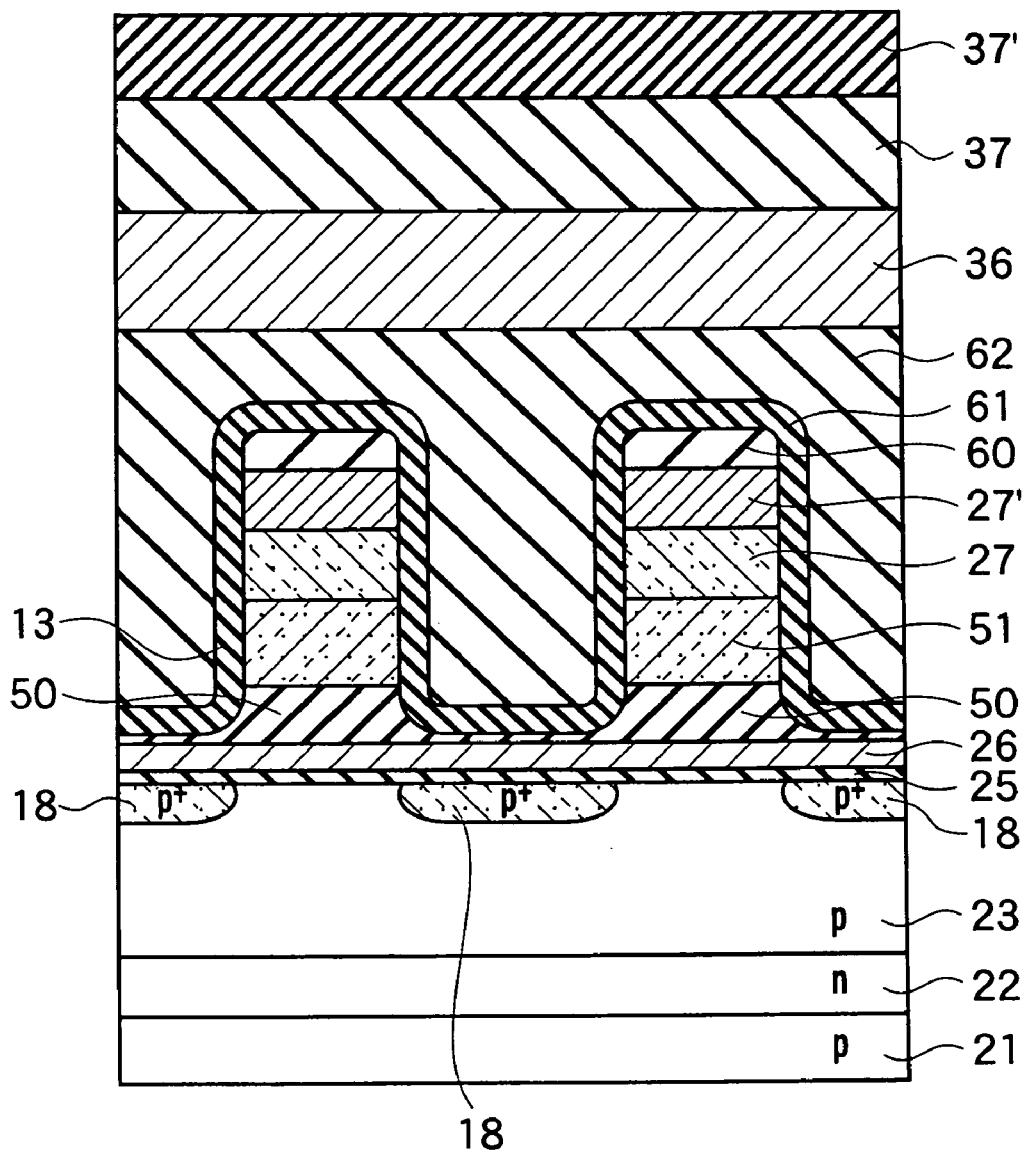
FIG. 30 is a column-direction element sectional structure view of the MONOS memory of the virtual ground array block to which the two memory cells are connected in the data storage system of the fifth embodiment of the present invention.

In the data storage system of the fifth embodiment of the present invention, a memory cell section of each of the row and column directions of a virtual ground array exhibits a structure where two memory cells are connected as shown in FIGS. 29 and 30. FIG. 29 is a sectional view of a MONOS memory, showing two memory cells where control electrodes 51 are connected by a control gate electrode 27. FIG. 30 shows a sectional structure of a section orthogonal to FIG. 29 through the control electrode 51.

The data storage system of the fifth embodiment of the present invention is basically similar to that of the fourth embodiment in that an element structure has a MONOS structure. However, it is different from the fourth embodiment in that a forming direction of data selection lines WL1, WL2 and WL3 (equivalent to control gate electrode 27, and metal lining layer 27') connected to the control electrode 51 coincides with a channel forming direction. Further, the data storage system of the fifth embodiment of the present invention is formed such that charges are accumulated in the vicinity of source and drain electrodes of a memory cell transistor to store at least 2-bit information per cell. Such a structure enables reading-out of bits depending on voltage directions of the source and drain electrodes by use of a method disclosed in U.S. Pat. No. 6,201,282. In this case, a current terminal of a bit of a side of no information reading and the other current terminal of a bit of a side of information reading are connected serially. Accordingly, for the bit of the side of no information reading, read-disturb stress is applied as in the case of the NAND type memory cell. Thus, the bit of the side of no information reading is changed from an erasure state to a write state by repeating the reading operation.

In FIGS. 29 and 30, for example, in a p type well region 23 where boron or indium impurity concentration ranges from $10^{14}$ cm$^{-3}$ to $10^{19}$ cm$^{-3}$, a first tunnel gate insulating film 25 of, for example, a silicon oxide film or an oxy-nitride film having a thickness of 0.5 nm to 10 nm is formed. Further, on the first tunnel gate insulating film 25, a charge storage layer 26 of, for example, a silicon nitride film, SiON, or Al$_2$O$_3$ is formed to a thickness of 3 nm to 50 nm. Control electrodes 51 and 27 are formed to a thickness of 10 nm to 500 nm thereon, in which boron, phosphorus or arsenic impurities are doped by a range from $1 \times 10^{19}$ cm$^{-3}$ to $1 \times 10^{21}$ cm$^{-3}$, through a block insulating film (second insulating film) 50 of a silicon oxide film, an oxynitride film, Al$_2$O$_3$, HfSiO, ZrSiO HfSiO, ZrSiON or HfSiON having a range from 5 nm to 30 nm inclusive in thickness. Preferably, boron, phosphorus or arsenic concentration of the polysilicon layer which forms the control electrode 51 and the control gate electrode 27 is set equal to/greater than $1 \times 10^{19}$ cm$^{-3}$. This construction is because depletion of the control electrode 51 reduces an electric field applied to the ONO laminated layer so as to prevent an increase in erasure or write time.

Further, for example, on the poly-silicon forming the control gate electrode 27, a metal lining layer 27' of the control gate electrode 27, which is made of tungsten silicide (WSi), NiSi, MoSi, TiSi, CoSi, W, Al or ALCu, may be formed to a thickness of 10 to 500 nm. Such poly-silicon layers form the control electrode 51 and the control gate electrode 27, and the metal lining layer 27' reduces resistance of the control gate electrode 27.

On the metal lining layer 27', for example, an insulating film 60 made of a silicon nitride film or a silicon oxide film may be formed to a thickness of 5 nm to 500 nm. This film serves as an insulating film to be a mask during processing of the control electrode 51. Further, side wall insulating films 19 made of silicon oxide films or silicon oxy-nitride films are formed on both sides of the control electrode 51. At least a side surface of the side wall insulating film 19 in contact with the control electrode 51 is formed by oxidizing or oxy-nitriding the control electrode 51 containing silicon in order to make a charge trap density smaller, make a dielectric breakdown voltage higher than that of the insulating film made of a deposited film, and provide a low level interface trap density between the control electrode 51 and the side wall insulating film 19. Thus, as compared with the CVD oxidized film, a high-quality thermally-oxidized film can be used for the gate side wall. FIG. 29 shows an example where the charge storage layer 26 is partially removed to form an element isolation insulating film 68 of, for example, a silicon oxide film on the n type diffusion layer 28 forming source and drain regions. However, since the charge storage layer 26 is made of an insulator, it is not always necessary to remove the charge storage layer 26 on the n type diffusion layer 28 forming the source and drain regions, and the charge carrier storage layer 26 and the element isolation insulating film 68 may be continuously formed.

The MONOS structure shown in FIG. 29 can be formed by, for example, the following process.

(a) Without forming a metal lining layer 27', the control electrode 51 containing silicon is laminated, patterning and anisotropic etching of the control electrode 51 is carried out until the control electrode 51 reaching to the tunnel gate insulating film 25 to form a linear shape, where the front and backside direction of the paper surface is longitudinal, and the control electrode 51, the block insulating film 50, the charge storage layer 26 and the tunnel gate insulating film 25 are removed.

(b) The side wall insulating film 19 is formed by oxidizing or oxy-nitriding the control electrode 51, and the n type diffusion layer 28, which become source and drain regions, is formed by ion implantation at a depth of 10 nm to 500 nm so that surface concentration of phosphorus, arsenic or stibium can be set in a range from $10^{17}$ cm$^{-3}$ to $10^{21}$ cm$^{-3}$.

(c) A silicon oxide film, a silicate glass or an inorganic glass is deposited to a thickness of 10 nm to 1000 nm on the entire surface to be an element isolation insulating film 68.

(d) The element isolation insulating film 68 is flattened by, for example, chemical mechanical polishing (CMP), and the upper surface of the control electrode 51 is exposed by wet etching of, for example, an ammonium fluoride solution or the like.

(e) A second gate electrode material of, for example, a polysilicon or a SiGe combination crystal is deposited in a thickness range of from 10 nm to 300 nm to be a control gate electrode 27, and the metal lining layer 27' and the mask insulating film 60 are deposited on the entire surface. Concentration of boron, phosphorus or arsenic of the second gate electrode material is preferably set equal to/greater than $1\times10^{19}$ cm$^{-3}$, because electric field applied to the ONO laminated layer is reduced by depletion of the control gate electrode 27, thus an increase in ensure or write time can be prevented.

(f) In the memory cell transistor, linear patterning is carried out in a direction orthogonal to the pattern of FIG. 29, anisotropic etching is carried out, and the mask insulating film 60, the metal lining layer 27' the control gate electrode 27, the control electrode 51, and the block insulating film 50 are etched.

(g) In order to reduce a leakage current between the memory cell channels of the two control electrodes 51 shown in FIG. 30, a p type layer 18 may be formed by carrying out ion implantation at a depth of 10 nm to 500 nm so that surface concentration of boron, BF$_2$, or indium can be $10^{16}$ cm$^{-3}$ to $10^{18}$ cm$^{-3}$.

(h) An insulating film 61 of a silicon nitride, silicon oxynitride film, or an alumina film is formed to a thickness of 5 nm to 300 nm on the entire surface. This insulating film 61 is a deposited insulating film formed by, for example, a CVD method or a sputtering method. The entire surface deposition is preferable with respect to the memory cell transistor, because entire surface deposition can prevent an adverse effect of gas, radical or ions generated from a film formed above the insulating film 61 on the memory cell transistor.

(i) On the insulating film 61, an interlayer insulating film 62 of a silicate glass such as BPSG, PSG, BSG containing $1\times10^{20}$ cm$^{-3}$ or higher of boron or phosphorus is formed to a thickness of 10 nm to 1000 nm. The silicate glass has a function of gettering of alkaline ions, and covering the entire surface formation above the memory cell transistor is preferable in order to prevent contamination by alkaline ions. In the element structure example shown in FIGS. 29 and 30, the interlayer insulating film 62 is formed in direct contact with the insulating film 61. However, the direct contact formation is not always necessary. For example, the interlayer film may be formed as an insulating film between wiring layers or on the wiring layer, because the interlayer insulating film 62 of a silicate glass such as BPSG, PSG, BSG has a gettering-effect of alkaline ions.

(j) The burying property of the silicate glass is generally insufficient immediately after deposition. Thus, after deposition, the silicate glass is subjected to viscous flow and is flattened by annealing at, for example, 750° C. to 1000° C. for 2 min. to 120 min. During the annealing, moisture or hydronium ions are isolated. However, forming the insulating film 61 enables an increase in thickness of the block insulating film 50 of the control electrode 51 end and a deformation thereof to be prevented, which are caused by oxidation of the gate end of the memory cell transistor with the moisture.

As the interlayer insulating film 62, for example, an inorganic glass made of cyclopentasilane or polysilazane may be used. In this case, an oxidation process is necessary for converting the cyclopentasilane or the polysilazane into the inorganic glass, and an oxidant oxidizes the gate edge portion of the memory cell transistor to cause a problem of an increase in thickness and a change in shape of the block insulating film 50 at the edge of the control electrode 51. This problem can be prevented by forming the insulating film 61. As the interlayer insulating film 62, a laminated structure between a silicon oxide film formed by, for example, tetraethoxysilane (TEOS) or HDP, and the other interlayer film of hydrogen silsesquioxane (HSQ), or MSQ may be used.

(k) Further, above the interlayer insulating film 62, an upper wiring 38 of, for example, W, Al, AlCu, or Cu is formed. In the example shown in FIGS. 29 and 30, only a single upper wiring 38 is illustrated as a wiring layer. However, a multilayer wiring structure may be used.

(l) Furthermore, above the upper wiring 38, a silicon nitride film layer 37' is deposited to 20 nm to 1 μm in thickness on the entire surface by use of a plasma chemical vapor deposition method through, for example, a silicon oxide film of TEOS or HDP, or an insulating film protection layer 37 of HSQ. This silicon nitride film layer 37' will block moisture diffused from the outside (upper surface) of the chip.

In addition to the features of the first to fourth embodiments, the fifth embodiment of the present invention includes the following features.

The control gate electrode 27 is formed in a direction (left and right direction in FIG. 29) orthogonal to the forming direction (front and backside direction of in the drawing) of the n type diffusion layer 28 which becomes source and drain regions. Thereby, the structure of interconnecting the source electrodes and drain electrodes of the adjacent memory cells in parallel, for example, a virtual ground array AND type, is achieved. Series-resistance of the memory cell block can be made to a small constant value, so that it is preferable to realize to a stabilized threshold voltage in the multilevel-valued storage memory. Since the element isolation insulating film 68, then type diffusion layer 28, and the charge storage layer 26 can be formed in self-alignment process sequence, it is not necessary to provide alignment margins for misalignment between the layers, and a higher density memory cell can be achieved. The memory cell array structure and the features are described in, for example, Patent Application 2001-264754 previously filed by the inventors, and thus description thereof will be omitted.

In the data storage system of the fifth embodiment, in addition to the features of the first to third embodiments, since the MONOS type cell is used, a write voltage and an erasure voltage can be set lower than that of the floating gate type EEPROM cell used in the first to third embodiments. Thus, a breakdown voltage can be maintained even when the element isolation interval is narrowed and the gate insulating film is formed thick. Therefore, an area of the circuit to which a high voltage is applied can be reduced, and a chip area can be further reduced. Moreover, compared with the first to the third embodiments, a thickness of the charge storage layer 26 can be reduced to 20 nm or less, and the aspect during gate formation can be reduced. Thus, since a processed shape of the gate electrode 51 can be improved and burying between the gates of the interlayer insulating film 62 can be improved, a breakdown voltage can be further increased. A process of forming a floating gate electrode or a process of forming slits is unnecessary, and thus the process can be further shortened. Since the charge storage layer 26 is an insulator and a charge is captured in each charge trap, it is difficult to discharge a charge and the charge can have strong resistance to radiation.

In the data storage system of the first to fifth embodiments of the present invention, as the insulating film forming method for the element isolation film or the interlayer insulating film, except for the method for converting silicon into a silicon oxide film or a silicon nitride film, a method for injecting oxygen ions into deposited silicon, or a method for oxidizing deposited silicon may be used. As the charge storage layer 26, $TiO_2$, $Al_2O_3$, a tantalum oxide film, strontium titanate, barium titanate, zirconium lead titanate, or a laminated film thereof may be used. In the first to fifth embodiments of the present invention, as the p type semiconductor substrate, a semiconductor substrate is provided. However, an n type semiconductor substrate may be used instead. Alternatively, a single crystal semiconductor substrate containing silicone, such as an SOI silicon layer of an SOI substrate, a SiGe combination crystal or a SiGeC combination crystal may be used.

The formation of the n type MONOS-FET on the p type well region 23 has been described above with reference to the fourth and fifth embodiments of the present invention. However, formation of a p type MONOS-FET on the n type well region may be substituted. In this case, the n type is changed to a p type, and the p type is changed to an n type with respect to the source and drain electrodes and the semiconductor area of the foregoing embodiments, and doping impurities As, P and Sp are changed to In, or B. Instead of the control electrode 51, a Si semiconductor, a SiGe combination crystal and a SiGeC combination crystal can be used, or a polycrystal may be used, or a laminated structure thereof may even be used. Amorphous Si, an amorphous SiGe combination crystal, or an amorphous SiGeC combination crystal can be used, or a laminated structure may be used. However, a semiconductor, especially a semiconductor containing Si is preferable, because a good side wall insulating film 19 can be formed by oxidizing or oxynitriding the control electrode 51. Further, the charge storage layer 26 may be formed separately between the source and the drain, or in a dot shape and, the manufacturing method described above with reference to the fifth embodiment can be applied. The section of the metal lining layer 27' formed on the control gate electrode 27 by the deposition method has been shown above with reference to the fifth embodiment of the present invention. However, the metal lining layer 27' may be formed by reacting, a metal such as Ti, Co, Ni, Mo, Pd and PT, and the control gate electrode 7 and by forming a silicide.

Sixth Embodiment

The embodiments of the present invention have been described by way of examples where the semiconductor memory cell for storing mainly binary data is used. However, a semiconductor memory cell transistor for storing ternary or more digital values as a plurality of threshold voltages may be used. In the case of using multilevel-valued logic, compared with the binary case, a margin between a plurality of threshold voltages is smaller, and bit destruction by read-disturb becomes a problem. Thus, a greater advantage can be obtained by use of the data storage system of the present invention. As a threshold voltage to be stored in one memory cell, a $2^n$ value is preferable, because decoding of information data is simplified.

Especially, the data storage system of the present invention which uses a four-valued logic has the same mask structure as that which uses a binary logic due to the structure of the memory cell array 1. Accordingly, a memory macro 7, an ECC circuit unit 100, an error bit detection circuit 5, and an error bit determination circuit 6 can be provided in the same manner as that for the data storage system of the first to the fifth embodiments of the present invention. Further, in both cases of the arrangement of temporary memories 101 external and internal to the memory macro 7, the data storage system of the present invention which uses four-valued logic can be used.

Especially, as in the case of the fifth embodiment, in a structure where an AND type virtual ground array of a MONOS structure is employed, a control gate electrode 27 (left and right direction in the FIG. 29) is formed orthogonal to a direction (front and backside direction of the drawing) of forming an n type diffusion layer 28 which becomes a source or drain region. In a structure where source electrodes and drain electrodes of adjacent memory cells are interconnected in parallel, serial resistance of the memory cell block can be reduced and held constant to stabilize a threshold value in the multilevel-valued memory. Since the element isolation insulating film 68, the n type diffusion layer 28, and the charge storage layer 26 can be formed in self-alignment process sequence, it is not necessary to provide alignment margins for misalignment between the layers, and a higher density memory cell can be achieved.

In the case of using multilevel-valued logic, compared with the binary case, a margin between a plurality of threshold voltages is smaller, and bit destruction caused by read-disturb becomes a problem. However, by use of the data error code correction circuit (ECC), the read-disturb is detected before data destruction occurs, and refreshing can be carried out. By analyzing the data error code correction circuit (ECC), it is possible to prevent occurrence of failures caused by read-disturb.

Seventh Embodiment

In the data storage system of the embodiment of the present invention, an operation mode of the memory cell array 1 is largely classified into three operation modes: a page mode, a byte mode, and an EEPROM mode having a ROM area.

Figure 31:
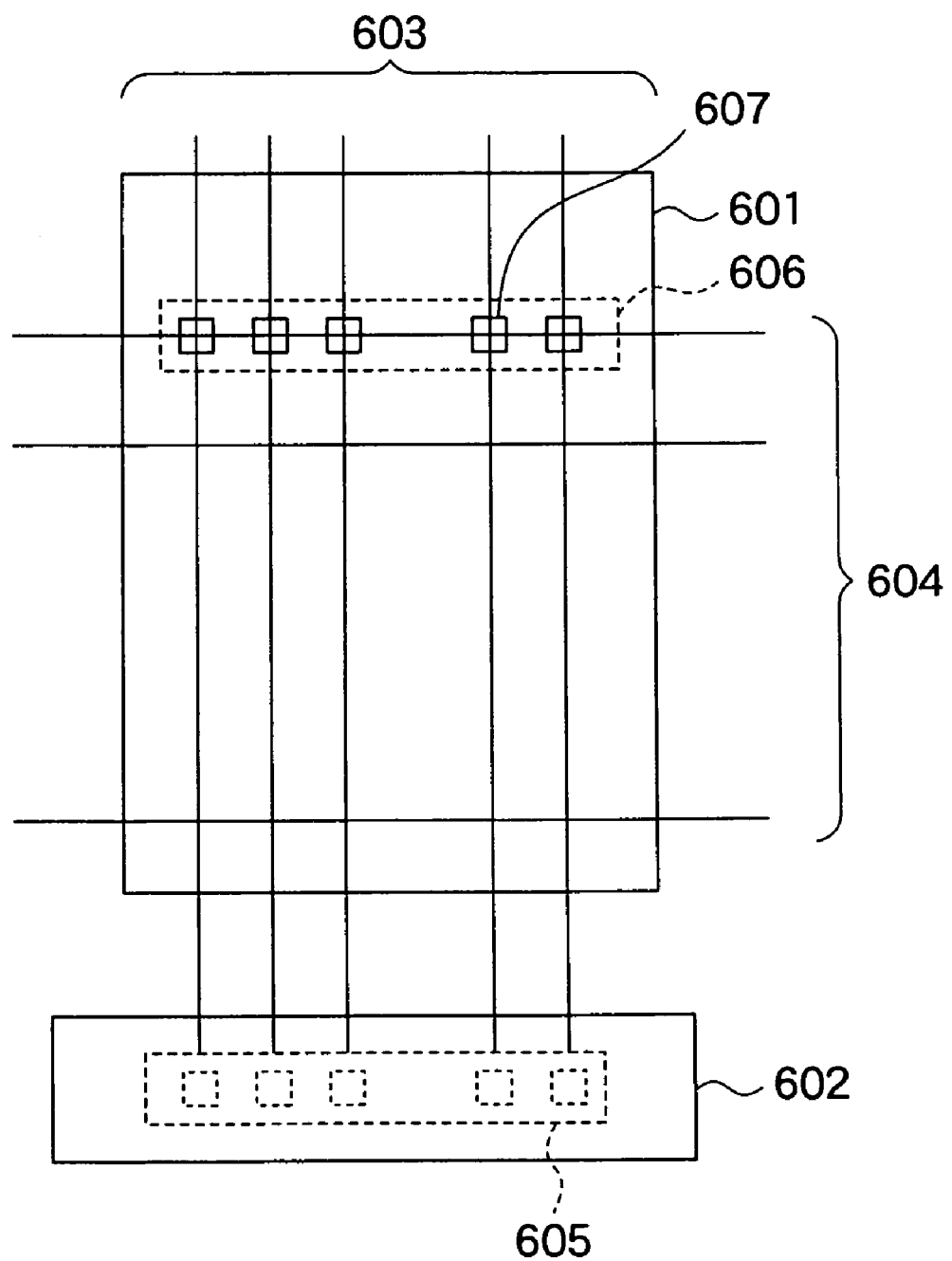
FIG. 31 is a schematic block constitutional view of a page type flash memory used in a data storage system of a seventh embodiment of the present invention.

In the page mode, as shown in FIG. 31, an operation is carried out to collectively read out rows of memory cells present on word lines 604 in a flash memory cell array 601 as a memory cell row 605 through a bit line 603 in a sense amplifier 602, or collectively write the memory cells from the sense amplifier 602. Specifically, reading or writing operation is carried-out by a page unit. In FIG. 31, a memory cell 607 is arranged at an intersection between the word line 604 and the bit line 603.

Figure 32:
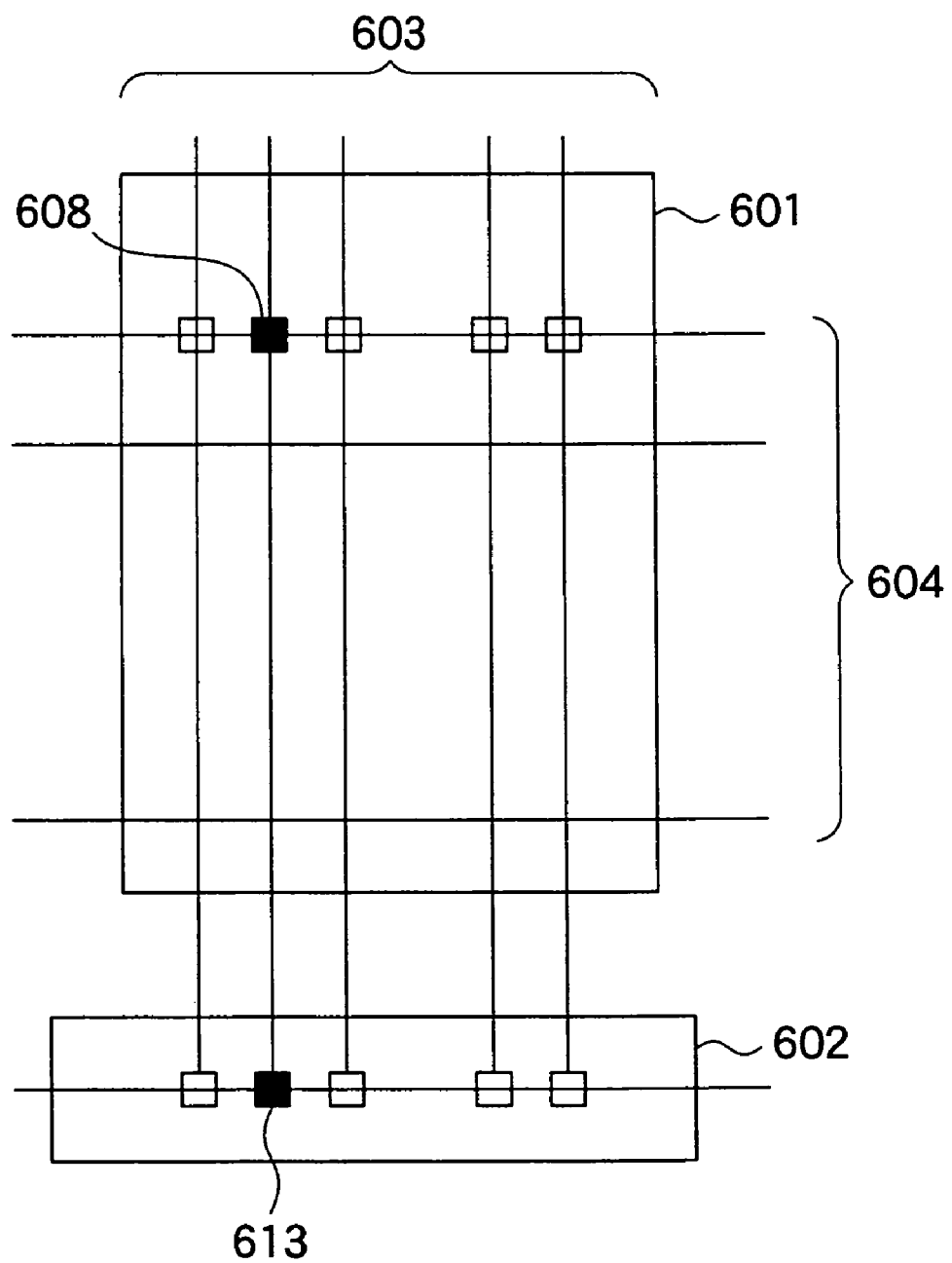
FIG. 32 is a schematic block constitutional view of a byte type flash memory used in the data storage system of the seventh embodiment of the present invention.

On the other hand, in the byte mode, as shown in FIG. 32, an operation is carried out to read out a memory cell 608 present on the word line 604 in the flash memory cell array 601 by a byte unit as a memory cell 613 in the sense amplifier 602, or write data in the memory cell 608 from memory cell 613 in the sense amplifier 602 by a byte unit. Specifically, it is different from the page mode in that reading or writing is carried-out by a byte unit.

Figure 33:
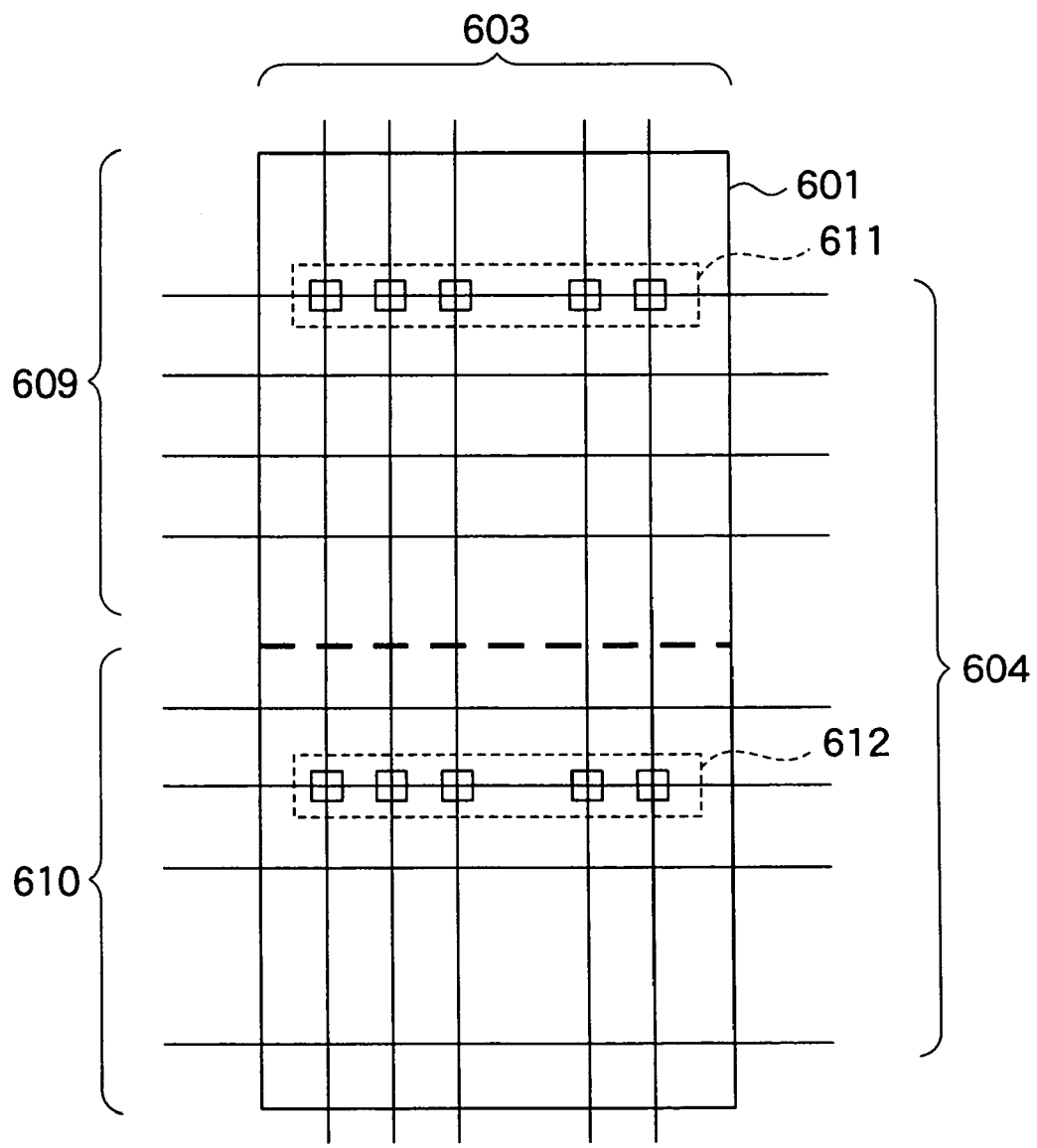
FIG. 33 is a schematic block constitutional view of an EEPROM type flash memory having a ROM area used in the data storage system of the seventh embodiment of the present invention.

On the other hand, in the EEPROM mode having the ROM area, as shown in FIG. 33, the flash memory cell array 601 is divided into a flash memory 609 portion and an EEPROM 610 portion having a ROM area, the EEPROM 610 portion having the ROM area is systematically switched to operate, and information in the flash memory cell array 601 is read out, or rewritten by a page unit or a byte unit. FIG. 33 shows an example where a memory cell row 611 on the same word line in a flash memory 609 is read out, or written in by a page unit as a memory cell row 612 in the EEPROM 610 having the ROM area.

Figure 34:
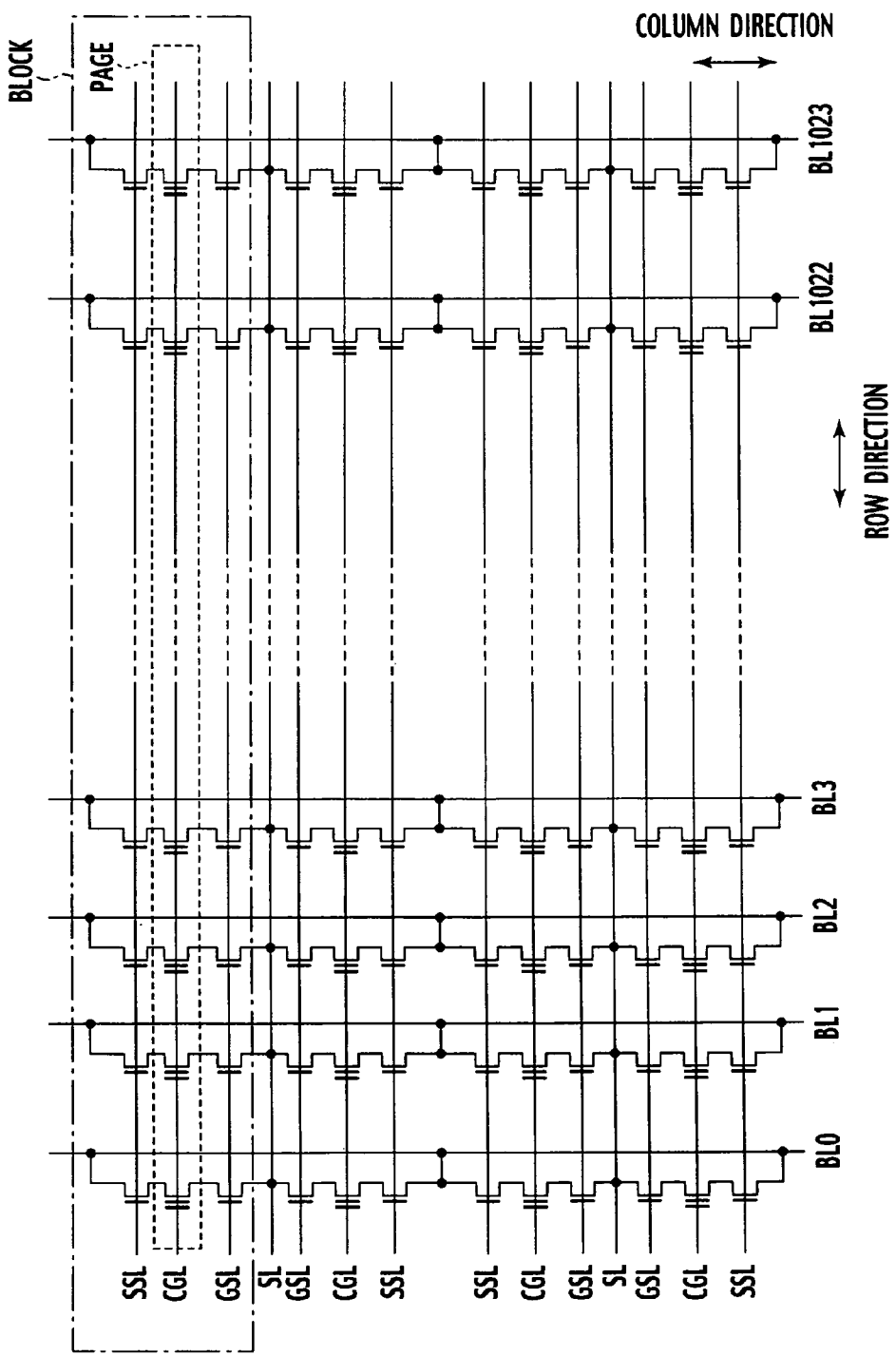
FIG. 34 is a schematic circuit constitutional view of the EEPROM type flash memory having the ROM area used in the data storage system of the seventh embodiment of the present invention.

FIG. 34 is a schematic circuitry view of an EEPROM type flash memory having a ROM area used for a nonvolatile semiconductor memory device system of the seventh embodiment of the present invention shown in FIG. 33. A circuit example shown in FIG. 34 is characterized by having a 3-transistor NAND cell arrangement. Specifically, two switching transistors are arranged for one NAND memory cell to provide a NAND type memory cell array of a 3-transistor/cell system. CGL denotes a control gate line, SSL denotes a gate line for a source-side switching transistor, and GSL denotes a gate line for a drain side switching transistor. In one block of a row direction, a NAND type memory cell on the same CGL line constitutes one page. Bit lines BL0, BL1, BL2, BL3, . . . , BL1022, BL1023 are arranged in a column direction. By use of such a NAND memory cell of the 3-transistor/cell system, the flash memory cell array 601 in the EEPROM mode having the ROM area shown in FIG. 33 can be provided.

The data storage system of each of the first to sixth embodiments can be operated in the page mode, the byte mode, and the EEPROM mode having the ROM area. The data storage system of the first to sixth embodiments has been described by way of examples of a NAND type flash memory, and a virtual ground type (AND type) flash memory. In these two types of flash memories, the operation modes of the page mode, the byte mode and the EEPROM mode having the ROM area can be achieved. Especially, as described later, if the flash memory is used by a memory card or an IC card, to provide a system LSI and to promote formation of a single chip, the EEPROM mode having the ROM area which can systematically operate the flash memory is important.

[System LSI]

Various application examples are possible for the nonvolatile semiconductor memory device of the first to sixth embodiments of the present invention. Some application examples are shown in FIGS. 35 to 48.

Application Example 1

Figure 35:
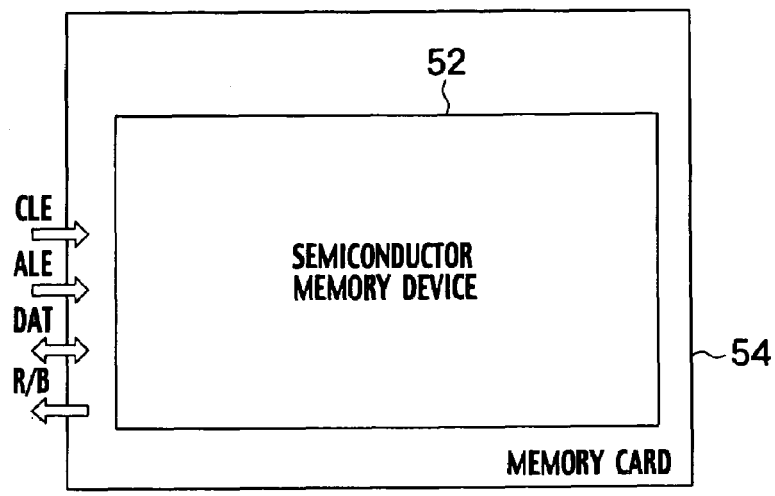
FIG. 35 is a schematic block constitutional view showing an internal structure of a memory card to which the data storage system of the seventh embodiment of the present invention is applied.

A memory card 54, which includes a semiconductor memory device 52, is provided as shown in FIG. 35. The memory cell array 2 used in the data storage system of each of the first to sixth embodiments can be applied to the semiconductor memory device 52. As shown in FIG. 35, the memory card 54 is operatable to receive a predetermined signal from an external device (not shown) or output a predetermined signal to an external device (not shown).

A signal line DAT, a command line enable signal line CLE, an address line enable signal line ALE, and a ready/busy signal line R/B are connected to the memory card 54 which incorporates the semiconductor memory device 52. The signal line DAT transfers a data signal, an address signal or a command signal. The command line enable signal line CLE transmits a signal indicating that the command signal is transferred on the signal line DAT. The address line enable signal line ALE transmits a signal indicating that the address signal is transferred on the signal line DAT. The ready/busy signal line R/B transmits a signal indicating whether the semiconductor memory device 52 is ready or not.

Application Example 2

Figure 36:
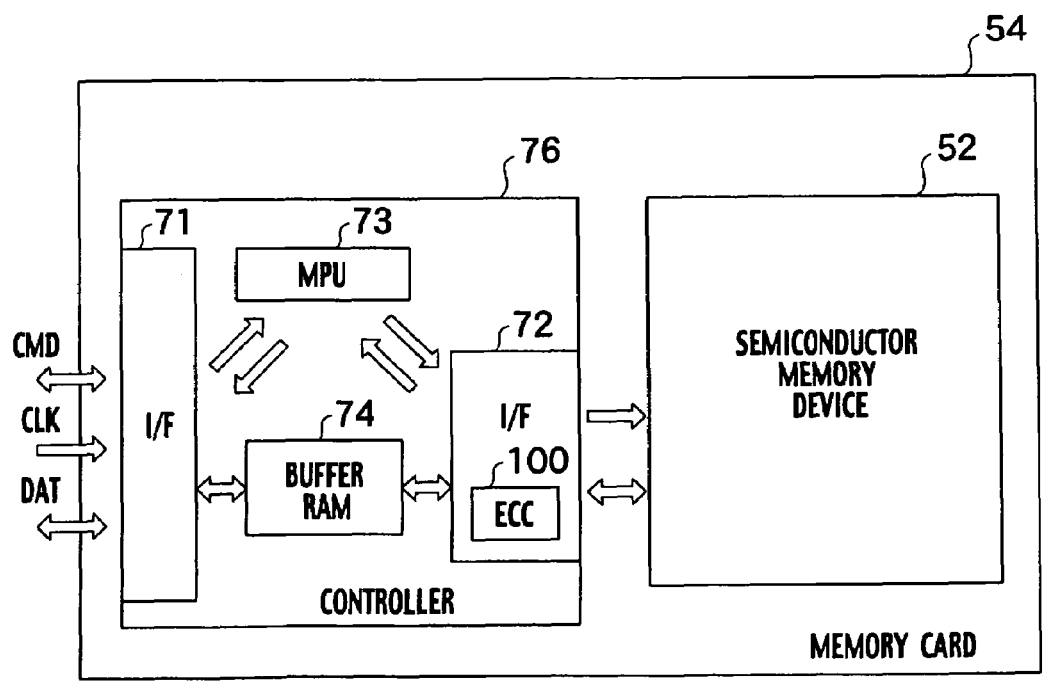
FIG. 36 is a schematic block constitutional view showing the internal structure of the memory card to which the data storage system of the seventh embodiment of the present invention is applied.

As shown in FIG. 36, different from the example of the memory card of FIG. 35, another specific example of the memory card 54 further includes a controller 76 which controls the semiconductor memory device 52 and transmits/receives a predetermined signal to/from an external device in addition to the semiconductor memory device 52. The controller 76 includes interface units (I/F) 71 and 72, a microprocessor unit (MPU) 73, a buffer RAM 74, and an ECC circuit unit 100 included in the interface unit (I/F) 72. The temporary memory 102 may be incorporated in the semiconductor memory device 52 as described above with reference to the second embodiment of the present invention. Alternatively, the semiconductor memory device 52 may be connected to the external temporary memory 101 as described above with reference to the first embodiment of the present invention.

The interface unit (I/F) 71 transmits/receives a predetermined signal to/from the external device, while the interface unit (I/F) 72 transmits/receives a predetermined signal to/from the semiconductor memory device 52. The microprocessor unit (MPU) 73 converts a logic address into a physical address. The buffer RAM 74 temporarily stores data. The ECC circuit unit 100 generates an error correction code.

A command signal line CMD, a clock signal line CLK, and a signal line DAT are connected to the memory card 54. The number of control signal lines, a bit width of the signal line DAT and circuitry of the controller 76 can be changed as occasion demands.

Application Example 3

Figure 37:
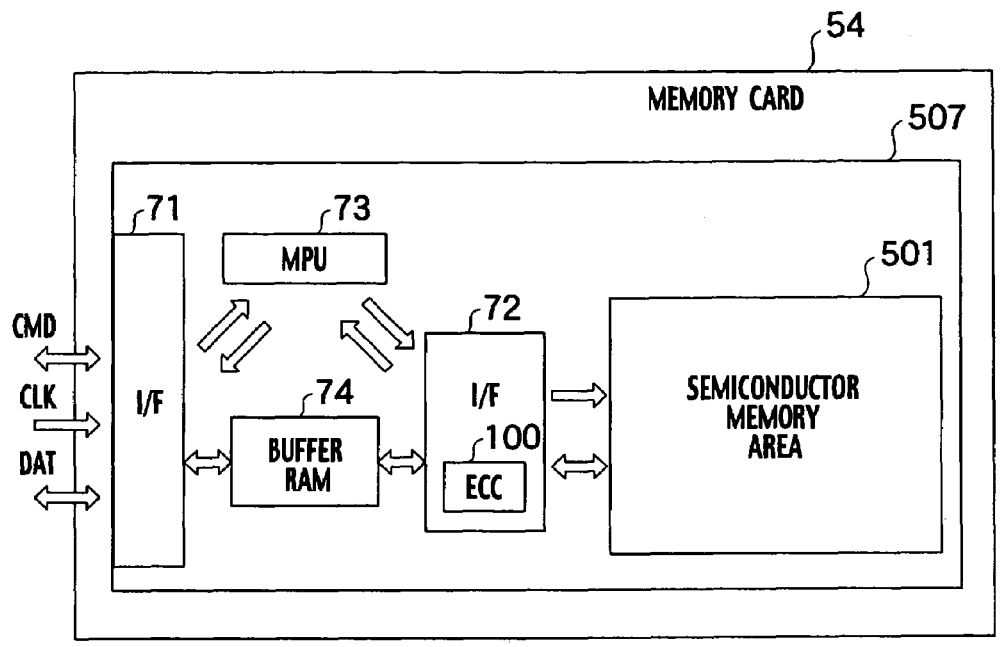
FIG. 37 is a schematic block constitutional view showing the internal structure of the memory card to which the data storage system of the seventh embodiment of the present invention is applied.

As shown in FIG. 37, yet another arrangement of the memory card 54 integrates interface units (I/F) 71 and 72, a microprocessor unit (MPU) 73, a buffer RAM 74, an ECC circuit unit 100 included in the interface unit (I/F) 72, and a semiconductor memory device region 501 in a single chip and provided as a system LSI chip 507. Such a system LSI chip 507 is incorporated in the memory card 54. Similar to the case of the application example 2, the temporary memory 102 may be incorporated in the semiconductor memory device region 501 as described above with reference to the second embodiment of the present invention. Alternatively, the semiconductor memory device region 501 may be connected to the external temporary memory 101 as described above with reference to the first embodiment of the present invention.

Application Example 4

Figure 38:
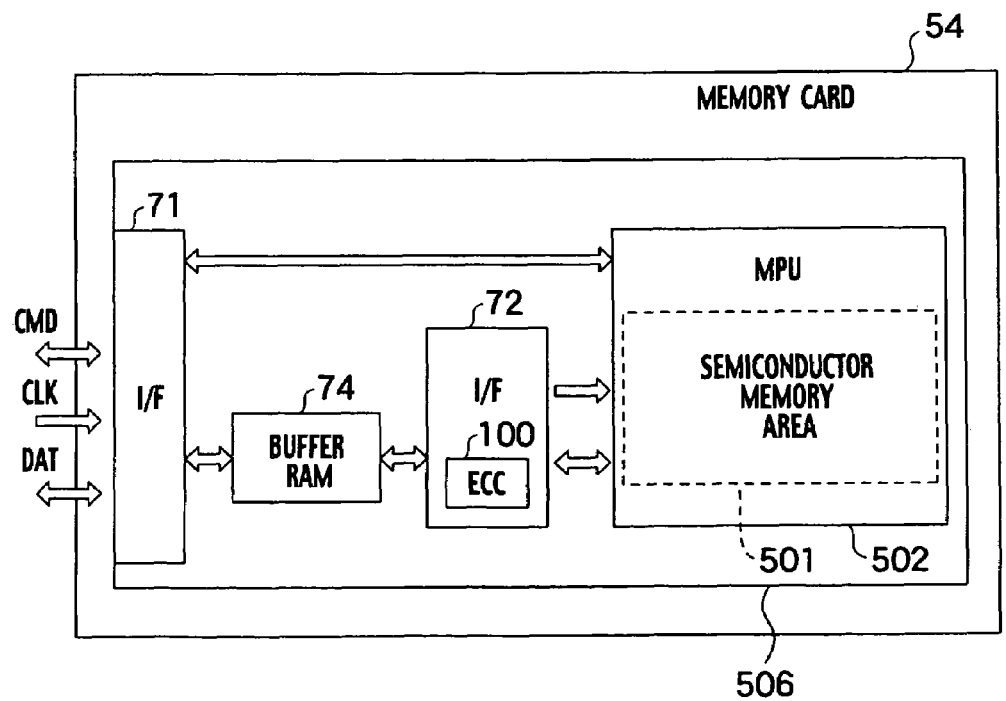
FIG. 38 is a schematic block constitutional view showing the internal structure of the memory card to which the data storage system of the seventh embodiment of the present invention is applied.

As shown in FIG. 38, yet another arrangement of the memory card 54 forms a semiconductor memory device region 501 in a microprocessor unit (MPU) 73 to provide a memory combination MPU 502. Further, the example of the memory card 54 integrates interface units (I/F) 71 and 72, a buffer RAM 74 and an ECC circuit unit 100 included in the interface unit (I/F) 72 in a single chip, and is provide as a system LSI chip 506. Such a system LSI chip 506 is incorporated in the memory card 54. As in the cases of the application examples 2 and 3, the temporary memory 102 may be incorporated in the semiconductor memory device region 501 as described above with reference to the second embodiment of the present invention. Alternatively, the semiconductor memory device region 51 may be connected to the external temporary memory 101 as described above with reference to the first embodiment of the present invention.

Application Example 5

Figure 39:
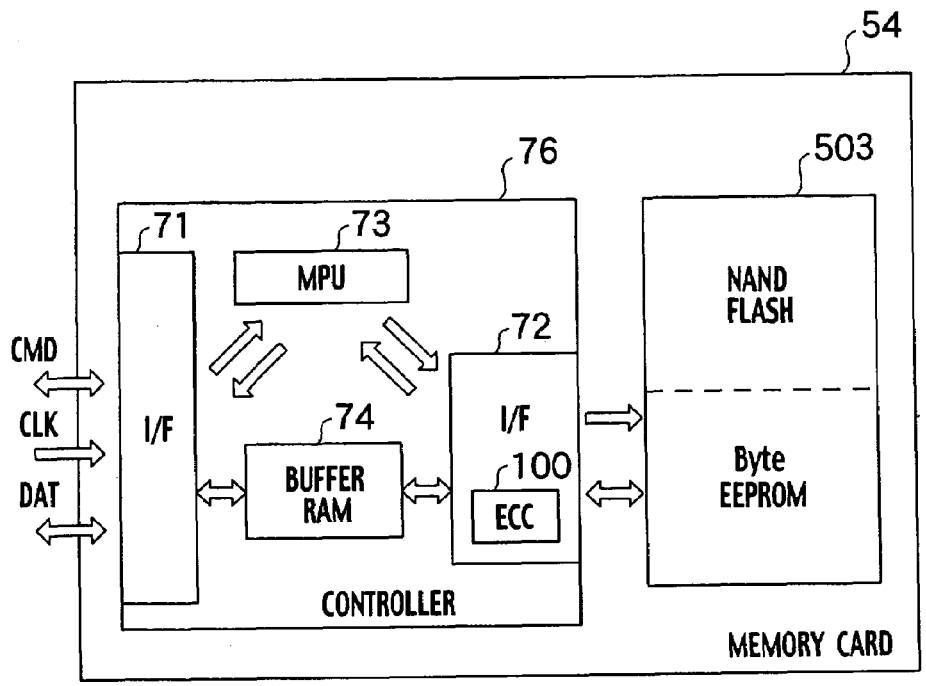
FIG. 39 is a schematic block constitutional view showing the internal structure of the memory card to which the data storage system of the seventh embodiment of the present invention is applied.

As shown in FIG. 39, in place of the semiconductor memory device 52 shown in FIG. 35 or 36, yet another example of the memory card 54 uses a flash memory 503 in an EEPROM mode having a ROM area which is constituted a NAND type flash memory and a byte type EEPROM.

As shown in FIG. 37, the flash memory 503 in the EEPROM mode having the ROM area may be formed on the same chip as that of the controller 76 portion to provide a system LSI chip 507 in a single chip. Additionally, as shown in FIG. 38, a semiconductor memory region constituted by a flash memory 503 in a EEPROM mode having a ROM area may be formed in the microprocessor unit (MPU) 73 to provide a memory combination MPU 502, and the interface units (I/F) 71 and 72 and the buffer RAM 74 are all integrated in a signal chip to provide a system LSI chip 506. Similar to the cases of the application examples 2, 3 and 4, the temporary memory 102 may be incorporated in the semiconductor memory device region constituted by the flash memory 503 in the EEPROM mode having the ROM area as described above with reference to the second embodiment of the present invention. Alternatively, the semiconductor memory device region may be connected to the external temporary memory 101 as described above with reference to the first embodiment of the present invention.

Application Example 6

Figure 40:
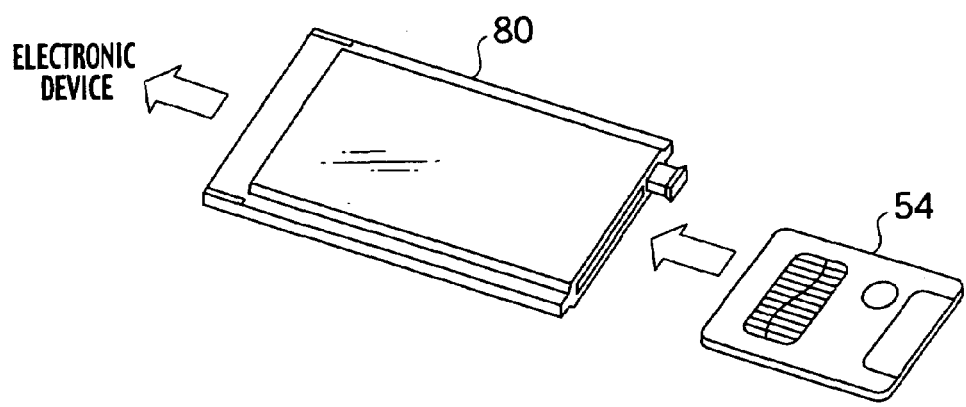
FIG. 40 is a schematic constitutional view of the memory card and a card holder to which the data storage system of the seventh embodiment of the present invention is applied.

For the application examples of the memory card 54 shown in FIGS. 36 to 39, a memory card holder 80 can be used as shown in FIG. 40. The memory card holder 80 can house the memory card 54 which includes the memory macro 7 used in the data storage system of the first to sixth embodiments of the present invention as a semiconductor memory device 52.

The memory card holder 80 is connected to an electronic device (not shown), and can be operated as an interface between the memory card 54 and the electronic device. The memory card holder 80 can execute various functions together with a plurality of functions of the controller 76, the microprocessor unit (MPU) 73, the buffer RAM 74, the ECC circuit unit 100, the interface units (I/F) 71 and 72 and the like, in the memory card 54 shown in FIGS. 36 to 39.

Application Example 7

Figure 41:
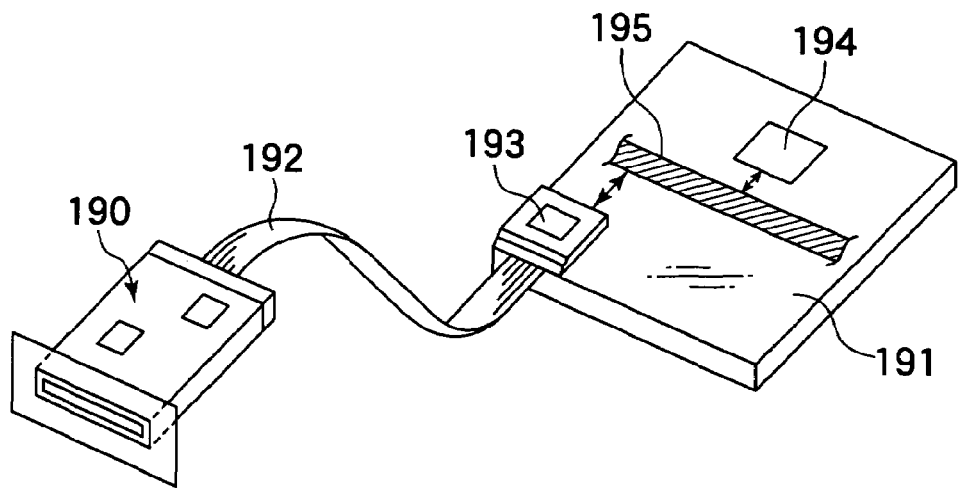
FIG. 41 is a schematic constitutional view of a connection device capable of receiving the memory card and the card holder to which the data storage system of the seventh embodiment of the present invention is applied.

Yet another application example is described by referring to FIG. 41. FIG. 41 shows a connection device 190 which can house the memory card 54 or the memory card holder 80. The memory macro 7 is provided in one of the memory card 54 and the memory card holder 80, as the semiconductor memory device 52, the semiconductor memory device region 501, the memory combination MPU 502, or the flash memory 503 in the EEPROM mode having the ROM area which is used in the data storage system of the first to sixth embodiments. The memory card 54 or the memory card holder 80 is fixed to the connection device 190, and electrically connected thereto. The connection device 190 is connected through a connection wire 192 and an interface circuit 193 to a circuit board 191 which includes a CPU 194 and a bus 195.

Application Example 8

Figure 42:
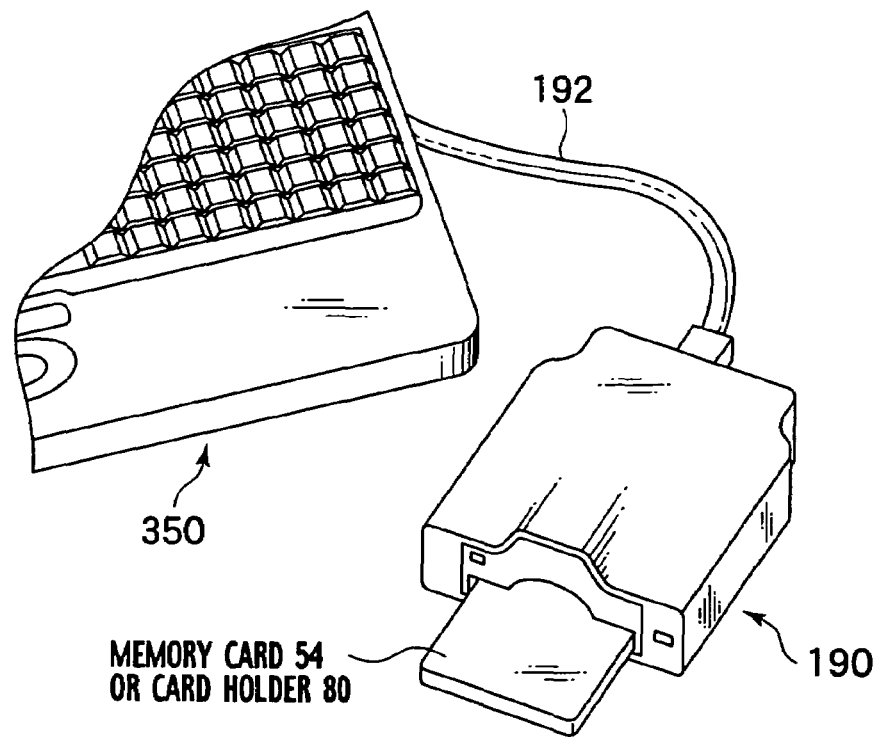
FIG. 42 is a schematic constitutional view of a coupling device, which incorporates the memory card to which a non-volatile semiconductor memory device of the data storage system of the seventh embodiment of the present invention is applied, and which is connected through a connection wire to a personal computer.

Another application example is described by referring to FIG. 42. The memory macro 7 is provided in one of the memory card 54 and the memory card holder 80, as the semiconductor memory device 52, the semiconductor memory device region 501, the memory combination MPU 502, or the flash memory 503 in the EEPROM mode having the ROM area, which is used in the data storage system of the first to sixth embodiments The memory card 54 or the memory card holder 80 is fixed to the connection device 190, and electrically connected. The connection device 190 is connected through a connection wire 192 to a personal computer (PC) 350.

Application Example 9

Figure 43:
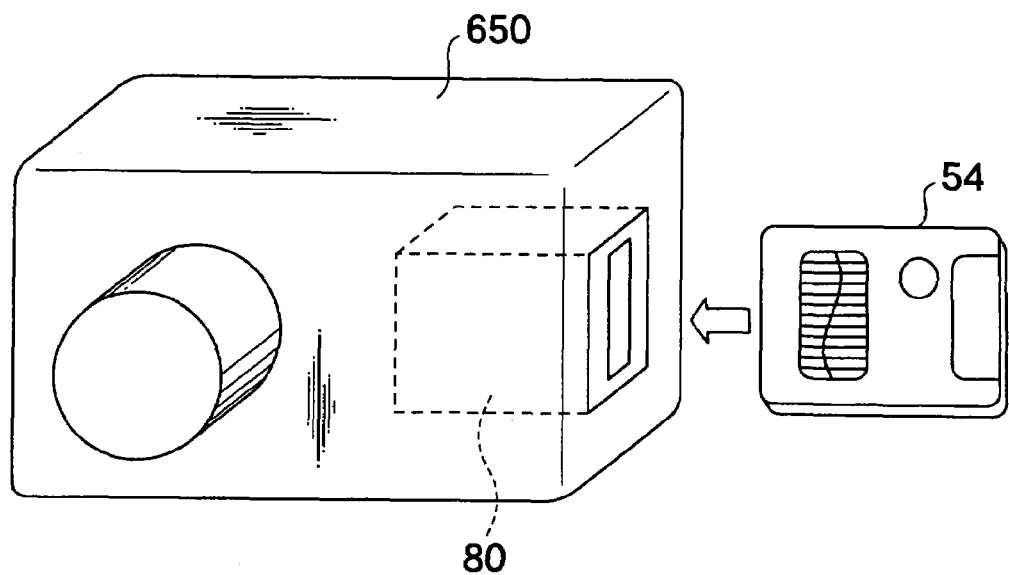
FIG. 43 is a view of a digital camera system capable of incorporating the memory card to which the data storage system of the seventh embodiment of the present invention is applied.

Another application example is described by referring to FIG. 43. The memory macro 7 is provided in the memory card 54, as the semiconductor memory device 52, the semiconductor memory device region 501, the memory combination MPU 502, or the flash memory 503 in the EEPROM mode having the ROM area, which is used in the data storage system of the first to sixth embodiments. FIG. 43 shows an example of supplying such a memory card 54 to a digital camera 650 which incorporates the memory card holder 80.

Application Example 10

Figure 44:
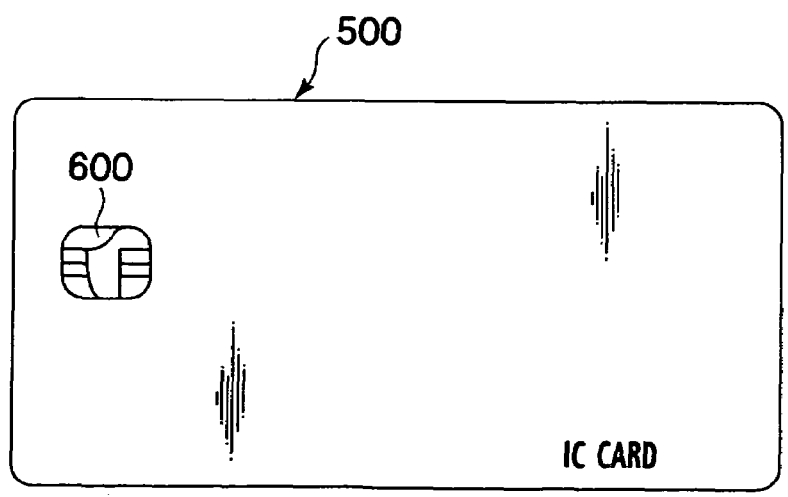
FIG. 44 is a schematic view of an IC card to which the data storage system of the seventh embodiment of the present invention is applied.
Figure 45:
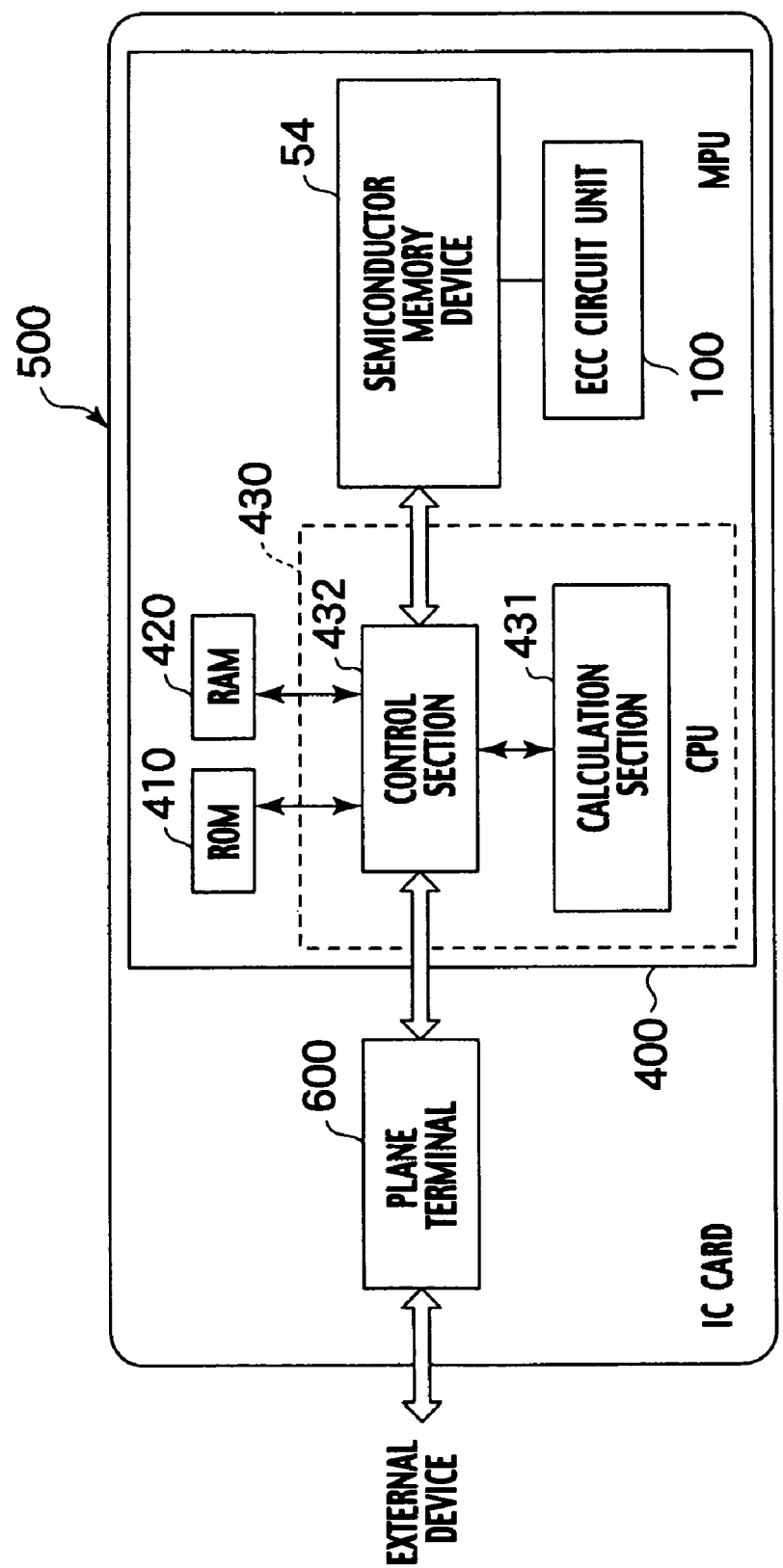
FIG. 45 is a schematic block constitutional view showing an internal structure of the IC card to which the data storage system of the seventh embodiment of the present invention is applied.

As shown in FIGS. 44 and 45, another application example of the data storage system of the first to sixth embodiments of the present invention is an interface circuit (IC) card 500 which includes an MPU 400 constituted by a semiconductor memory device 52, a ROM 410, a RAM 420 and a CPU 430, and a plane terminal 600. The IC card 500 can be connected through the plane terminal 600 to an external device. The plane terminal 600 is coupled to the MPU 400 in the IC card 500. The CPU 430 includes an operation section 431 and a control section 432. The control section 432 is coupled to the semiconductor memory device 52, the ROM 410 and the RAM 420. Preferably, the MPU 400 is mounted on one surface of the IC card 500, and the plane terminal 600 is formed on the other surface of the IC card 500. In FIG. 45, by connecting the ECC circuit unit 100 to the semiconductor memory device 52, the data storage system of the first to sixth embodiments can be used. Moreover, due to operation of the nonvolatile semiconductor memory device, a page mode, a byte mode and an EEPROM mode having a ROM area can be utilized.

Application Example 11

Figure 46:
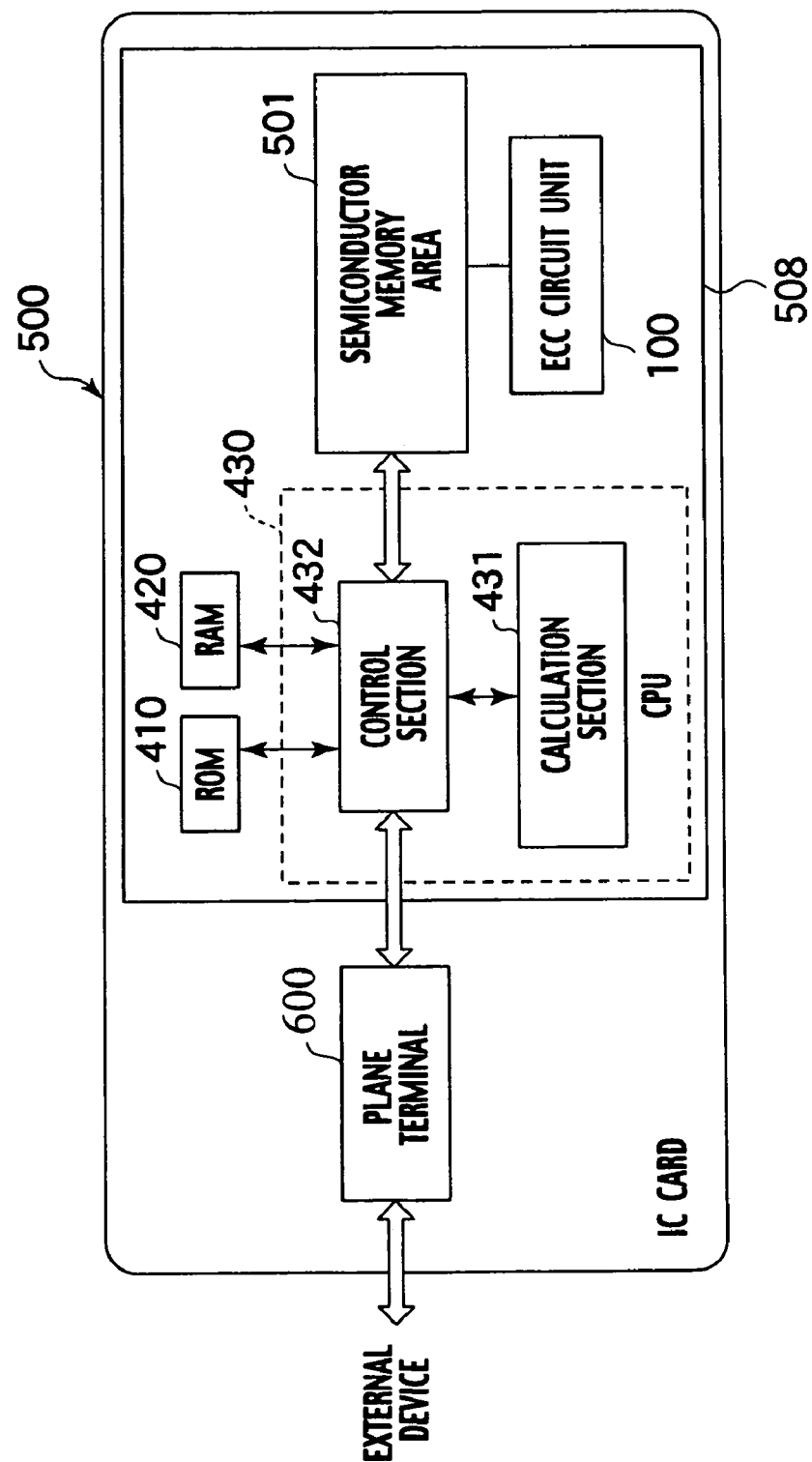
FIG. 46 is a schematic block constitutional view showing the internal structure of the IC card to which the data storage system of the seventh embodiment of the present invention is applied.

In yet another example of the IC card 500, as shown in FIG. 46, a ROM 410, a RAM 420, a CPU 430, a semiconductor memory device region 501, and an ECC circuit unit 100 are integrated in a single chip to provide a system LSI chip 508. Such a system LSI chip 508 is incorporated in the IC card 500. In FIG. 46, by connecting the ECC circuit unit 100 to the semiconductor memory device region 501, the data storage system of the first to sixth embodiments can be used. Moreover, due to operation of the nonvolatile semiconductor memory device, a page mode, a byte mode and an EEPROM mode having a ROM area can be utilized.

Application Example 12

Figure 47:
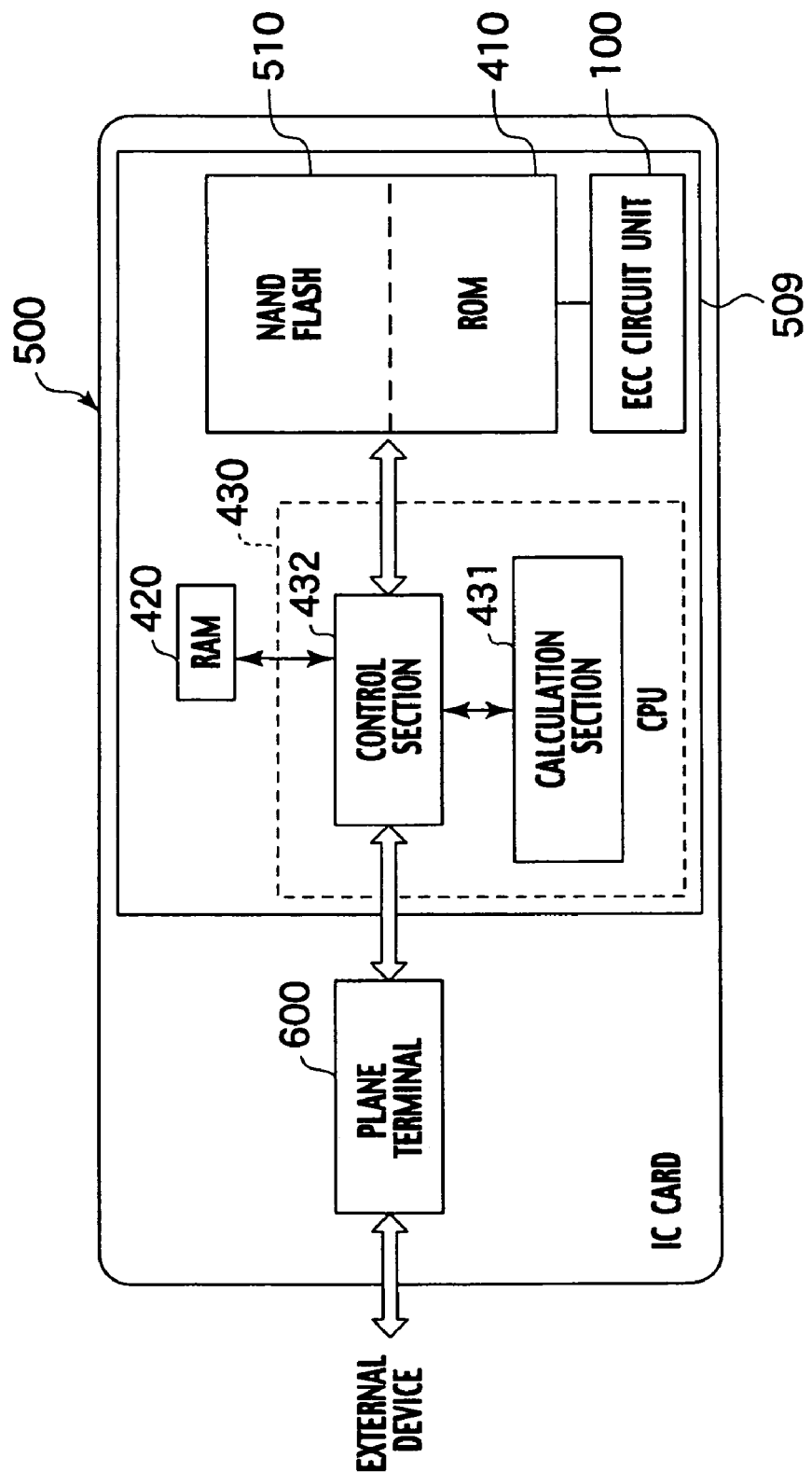
FIG. 47 is a schematic block constitutional view showing the internal structure of the IC card to which the data storage system of the seventh embodiment of the present invention is applied.

In yet another arrangement of the IC card 500, as shown in FIG. 47, a ROM 410 is incorporated in a semiconductor memory device region 501 to provide a flash memory 510 in an EEPROM mode having a ROM area as a whole. Moreover, the flash memory 510 in the EEPROM mode having the ROM area, a RAM 420, a CPU 430, and an EC circuit unit 100 are integrated in one chip to constitute a system LSI chip 509. Such a system LSI chip 509 is incorporated in the IC card 500. In FIG. 47, by connecting the ECC circuit unit 100 to the flash memory 510 in the EEPROM mode having the ROM area, the data storage system of the first to sixth embodiments can be used.

Application Example 13

Figure 48:
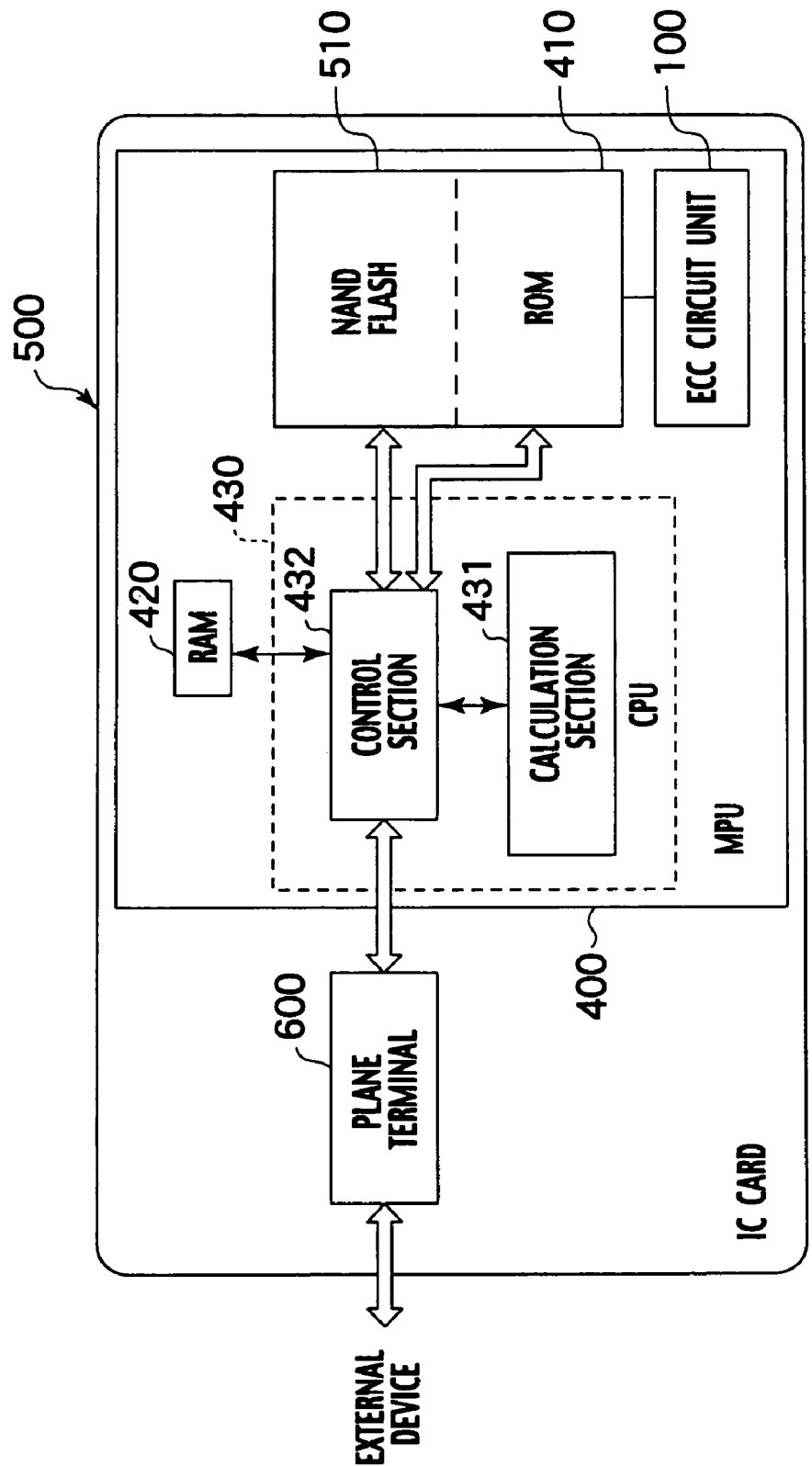
FIG. 48 is a schematic block constitutional view showing the internal structure of the IC card to which the data storage system of the seventh embodiment of the present invention is applied.

In yet another arrangement of the IC card 500, as shown in FIG. 48, a ROM 410 is incorporated in the semiconductor memory device 52 shown in FIG. 45 to provide a flash memory 510 in an EEPROM mode having a ROM area. The flash memory 510 in the EEPROM mode having the ROM area is incorporated in an MPU 400 as in the case shown in FIG. 45. In FIG. 48, by connecting the ECC circuit unit 100 to the flash memory 510 in the EEPROM mode having the ROM area, the data storage system of the first to sixth embodiments can be used.

OTHER EMBODIMENTS

The embodiments of the present invention have been described. However, the description and the drawings, which constitute parts of the disclosure, are not limitative of the present invention. From the disclosure, various alternative modes, embodiments, and operation technologies will become apparent to those skilled in the art. Thus, the technical scope of the present invention is defined only by specific items within the scope of the appended claims, which are considered proper from the foregoing description.

Other variations and modifications can be made without departing from teachings of the present invention. The foregoing embodiments can be implemented in combinations. Thus, needless to say, the present invention includes various embodiments or the like not specifically described here.

According to the data storage system of the present invention, by analyzing the error correction code circuit (ECC), it is possible to prevent occurrence of failures caused by read-disturb.

The invention claimed is:

1. A data storage system, comprising:
a plurality of pages, each of which includes a plurality of first memory cells, from which at least binary digital data can be read out a plurality of times without destruction of the data; and
a circuit which receives a digital data output of the first memory cells, and detects an error in at least one bit of data and, comprises an external input/output section and is configured to read out the first page when power starts to be supplied; and in the circuit, when the power is cut off and the power is subsequently supplied, and, furthermore, reading out data of at least one page from the external data output terminal is repeated for plurality of times,
wherein a bit change is generated when at least one of the first memory cells is in a held state of "1" or "0" and a reading operation is carried out a plurality of times;
n1 is a number of times reading out information data identical to the information data written in the page when power starts to be supplied, in a series actions such that the power is turned off and the power is subsequently supplied, and, furthermore, reading out the data of at least one page from the external data output terminal, and,
n2 is a number of times of reading information data identical to the information data in the page when the reading operation for continuously reading out the data of at least one page is carried out, and,
n1 is larger than n2.

2. The data storage system of claim 1, wherein the first memory cell comprises:
a charge storage layer of insulating film for storing information based on the amount of charges stored in the charge storage layer.

3. The data storage system of claim 1, wherein if the number of information bits which enables recording of "1" or "0" from the external input/output section is n, and m is a natural number which satisfies $2^{m-1}-1 < n \leq 2^m - m - 1$, the number of memory cells of one page being at least (n+m).

4. The data storage system of claim 1, wherein the first memory cells comprise a semiconductor memory cell transistor which stores at least three digital values as a plurality of threshold values.

5. The data storage system of claim 1, wherein in the first memory cells, the reading operations generate a bit change to a writing state.

* * * * *